(12) United States Patent
Tomimatsu

(10) Patent No.: US 10,586,804 B2
(45) Date of Patent: Mar. 10, 2020

(54) MULTI-LAYER WIRING STRUCTURE, METHOD FOR MANUFACTURING MULTI-LAYER WIRING STRUCTURE, AND SEMICONDUCTOR DEVICE

(71) Applicant: Toshiba Memory Corporation, Minato-ku (JP)

(72) Inventor: Takahiro Tomimatsu, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/890,894

(22) Filed: Feb. 7, 2018

(65) Prior Publication Data
US 2019/0088672 A1 Mar. 21, 2019

(30) Foreign Application Priority Data
Sep. 21, 2017 (JP) ................. 2017-181288

(51) Int. Cl.
*H01L 23/48* (2006.01)
*H01L 27/11582* (2017.01)
(Continued)

(52) U.S. Cl.
CPC .... *H01L 27/11582* (2013.01); *G11C 16/0483* (2013.01); *H01L 21/76816* (2013.01);
(Continued)

(58) Field of Classification Search
CPC ......... H01L 27/11582; H01L 27/11565; H01L 27/1157; H01L 23/5226; H01L 23/562;
(Continued)

(56) References Cited

U.S. PATENT DOCUMENTS 7,855,457 B2 12/2010 Mizukami et al.
8,383,512 B2 2/2013 Chen et al.
(Continued)

FOREIGN PATENT DOCUMENTS

JP 2011-114235 * 6/2011
JP 2012-244180 12/2012
(Continued)

OTHER PUBLICATIONS

Shih-Hung Chen, et al. "A Highly Scalable 8-layer Vertical Gate 3D NAND with Split-page Bit Line Layout and Efficient Binary-sum MiLC (Minimal Incremental Layer Cost) Staircase Contacts", IEDM '88, Technical Digest, International, 2012, 5 pages (with English Abstract).

*Primary Examiner* — Ahmed N Sefer
(74) *Attorney, Agent, or Firm* — Oblon, McClelland, Maier & Neustadt, L.L.P.

(57) ABSTRACT

According to one embodiment, a multi-layer wiring structure includes a first multi-layer section, first contact plugs, and pillars. First conductors and first insulators are alternately layered in the first multi-layer section. The multi-layer section includes a first area that includes memory cells, and a second area different from the first area. The first contact plugs are formed in the first holes extending from an uppermost layer of the first multi-layer section respectively to the first conductors in the second area, side surfaces of the first contact plugs being covered with first insulating films. The pillars are formed of second insulators and passing through the first multi-layer section in a layered direction in the second area.

13 Claims, 46 Drawing Sheets

(51) Int. Cl.
| | |
|---|---|
| H01L 27/1157 | (2017.01) |
| H01L 27/11565 | (2017.01) |
| H01L 23/528 | (2006.01) |
| H01L 21/768 | (2006.01) |
| H01L 23/00 | (2006.01) |
| G11C 16/04 | (2006.01) |
| H01L 23/522 | (2006.01) |
| G11C 16/06 | (2006.01) |
| H01L 27/11573 | (2017.01) |

(52) U.S. Cl.
CPC ...... *H01L 21/76877* (2013.01); *H01L 23/528* (2013.01); *H01L 23/5226* (2013.01); *H01L 23/562* (2013.01); *H01L 27/1157* (2013.01); *H01L 27/11565* (2013.01); *G11C 16/06* (2013.01); *H01L 27/11573* (2013.01)

(58) Field of Classification Search
CPC ............. H01L 23/528; H01L 21/76877; H01L 21/76816; G11C 16/0483; G11C 16/06
See application file for complete search history.

(56) References Cited

U.S. PATENT DOCUMENTS

| | | | |
|---|---|---|---|
| 8,530,955 | B2 | 9/2013 | Iino et al. |
| 8,957,471 | B2 | 2/2015 | Fukuzumi |
| 9,343,405 | B2 | 5/2016 | Matsuda |
| 9,355,913 | B2 | 5/2016 | Park et al. |
| 9,472,286 | B2 | 10/2016 | Chen |
| 2011/0180866 | A1* | 7/2011 | Matsuda ........... H01L 27/11573 257/324 |
| 2012/0241843 | A1* | 9/2012 | Iino .................... H01L 21/76801 257/324 |
| 2013/0234299 | A1* | 9/2013 | Murakami .............. H01L 29/02 257/632 |
| 2013/0234332 | A1 | 9/2013 | Iino et al. |

FOREIGN PATENT DOCUMENTS

| | | |
|---|---|---|
| JP | 2013-187335 | 9/2013 |
| TW | 201606928 A | 2/2016 |

* cited by examiner

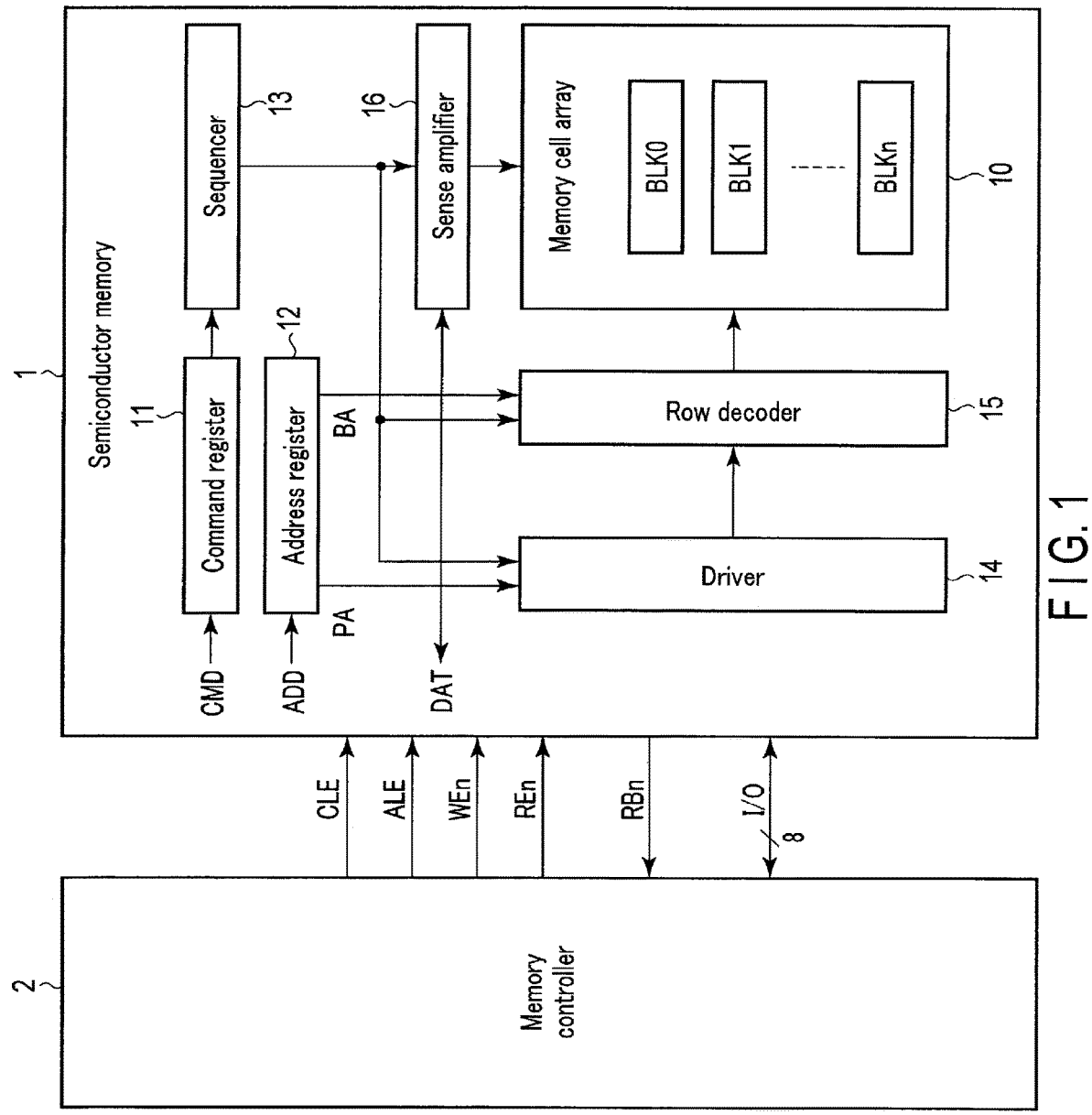
F I G. 1

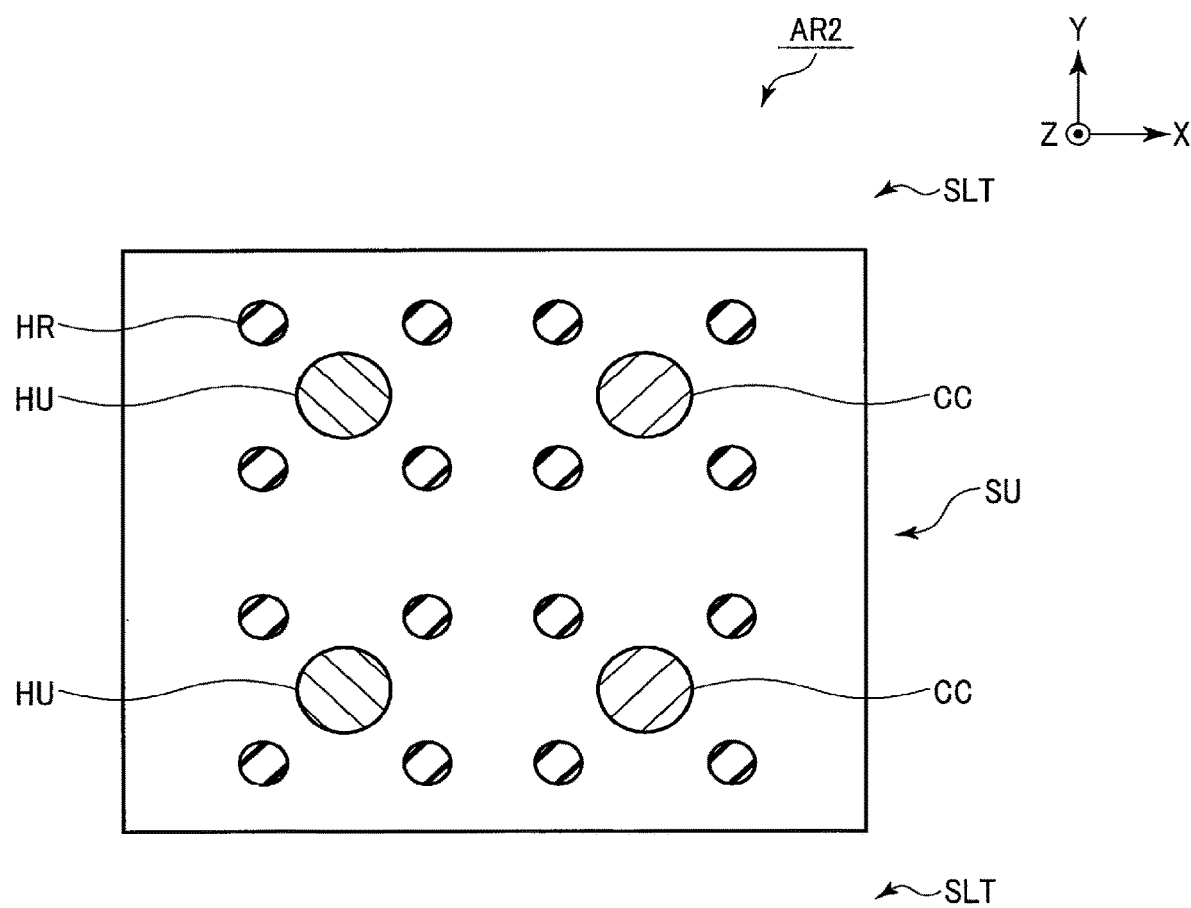
F I G. 4

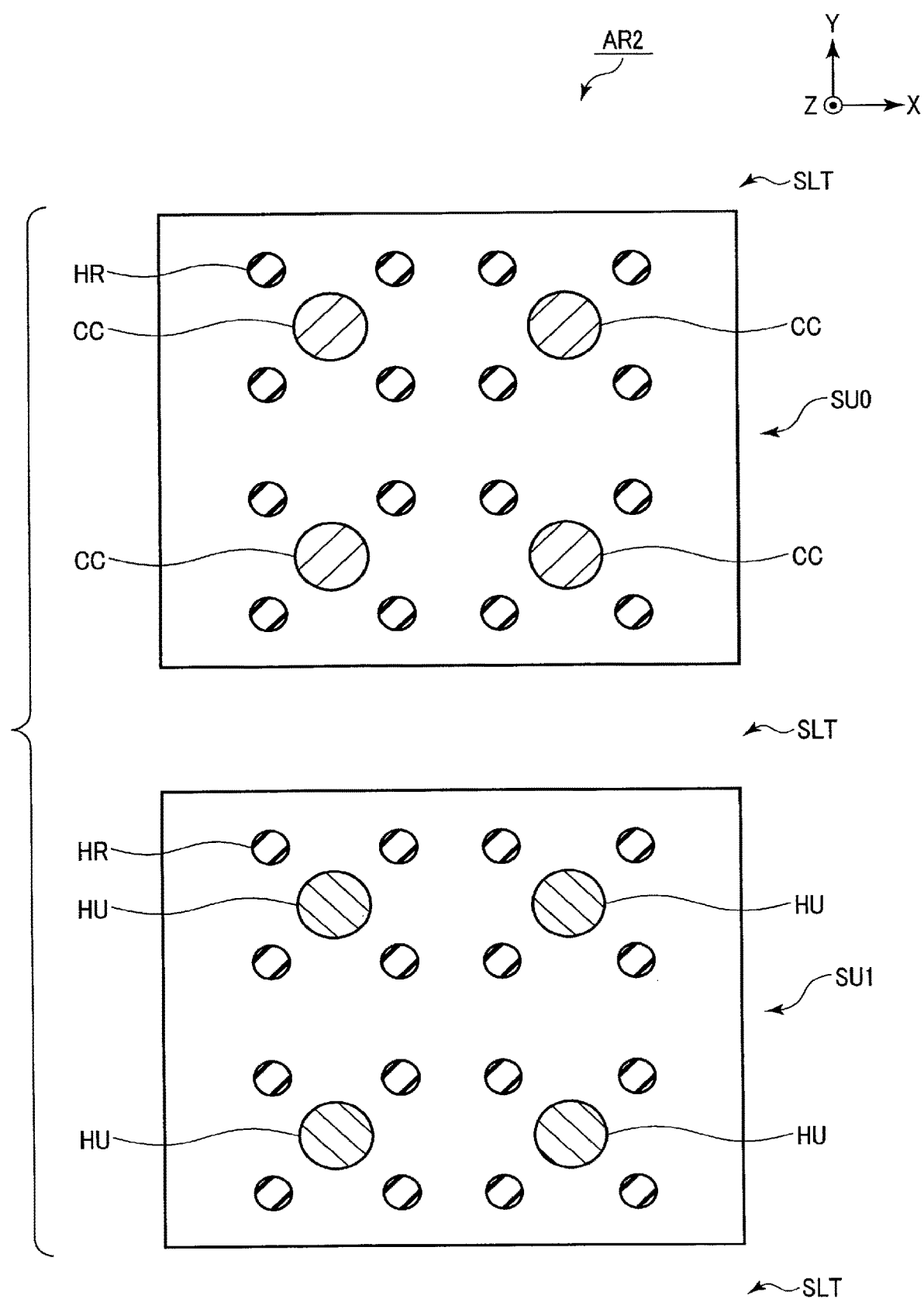
F I G. 5

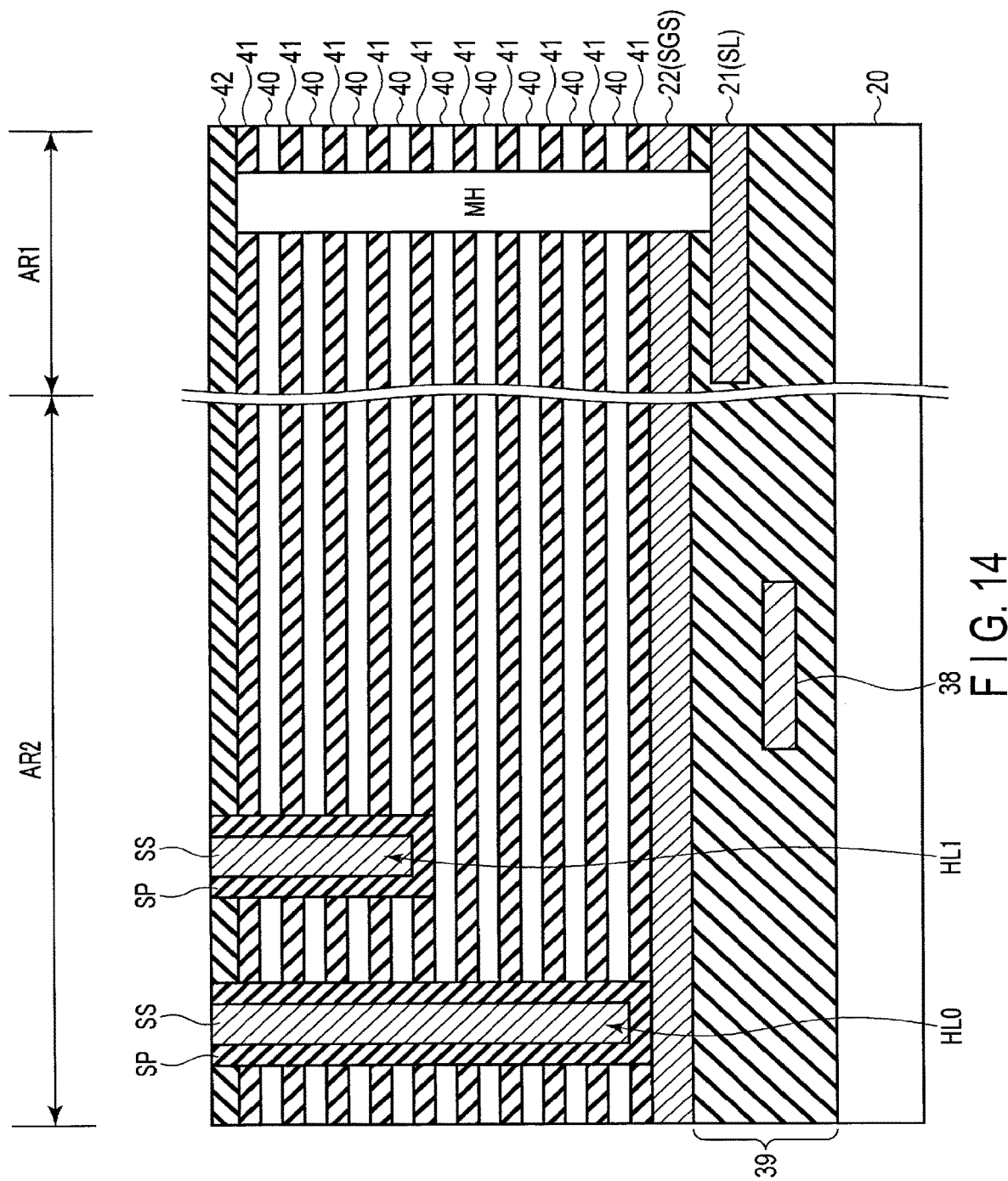
F I G. 14

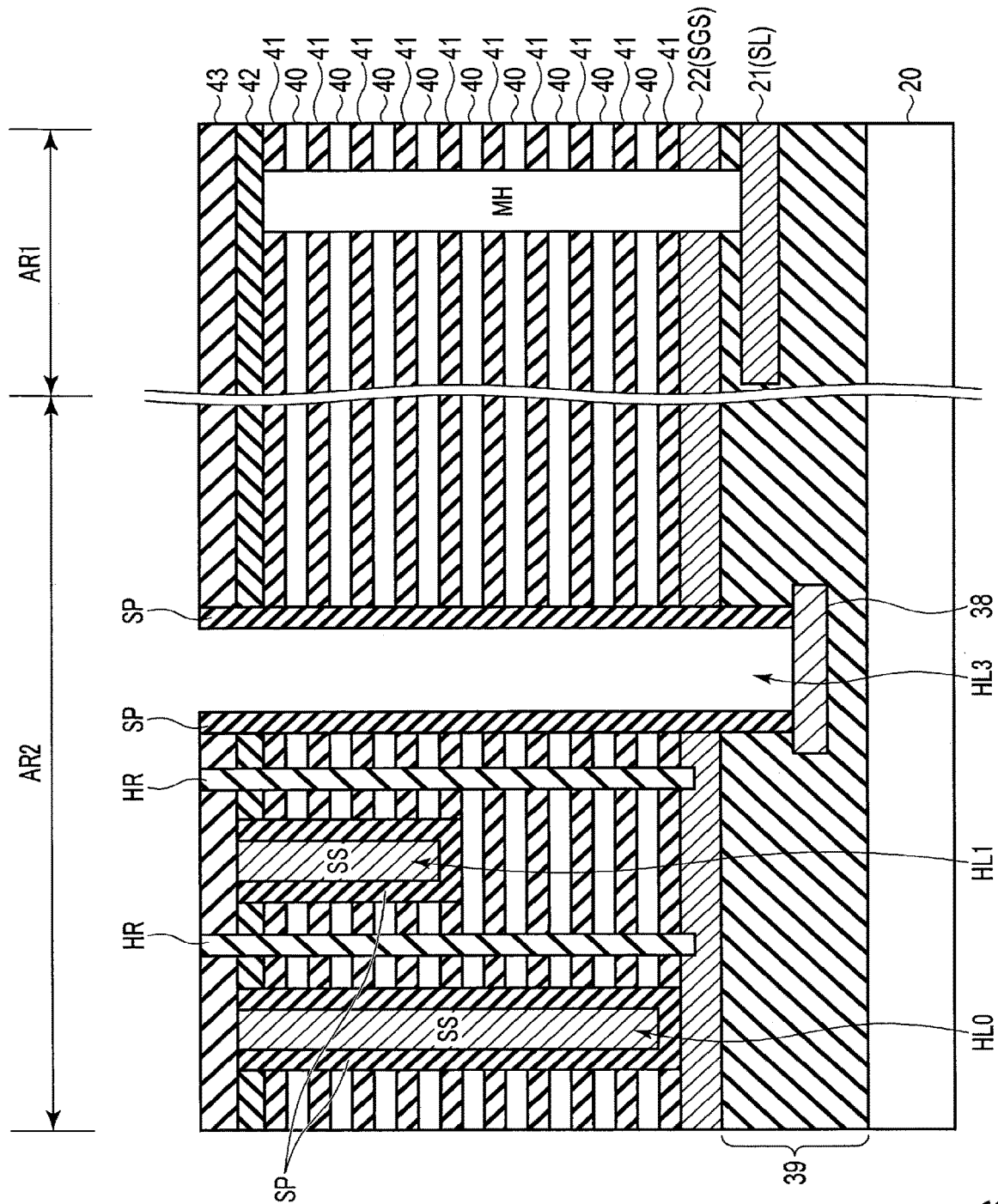
F I G. 16

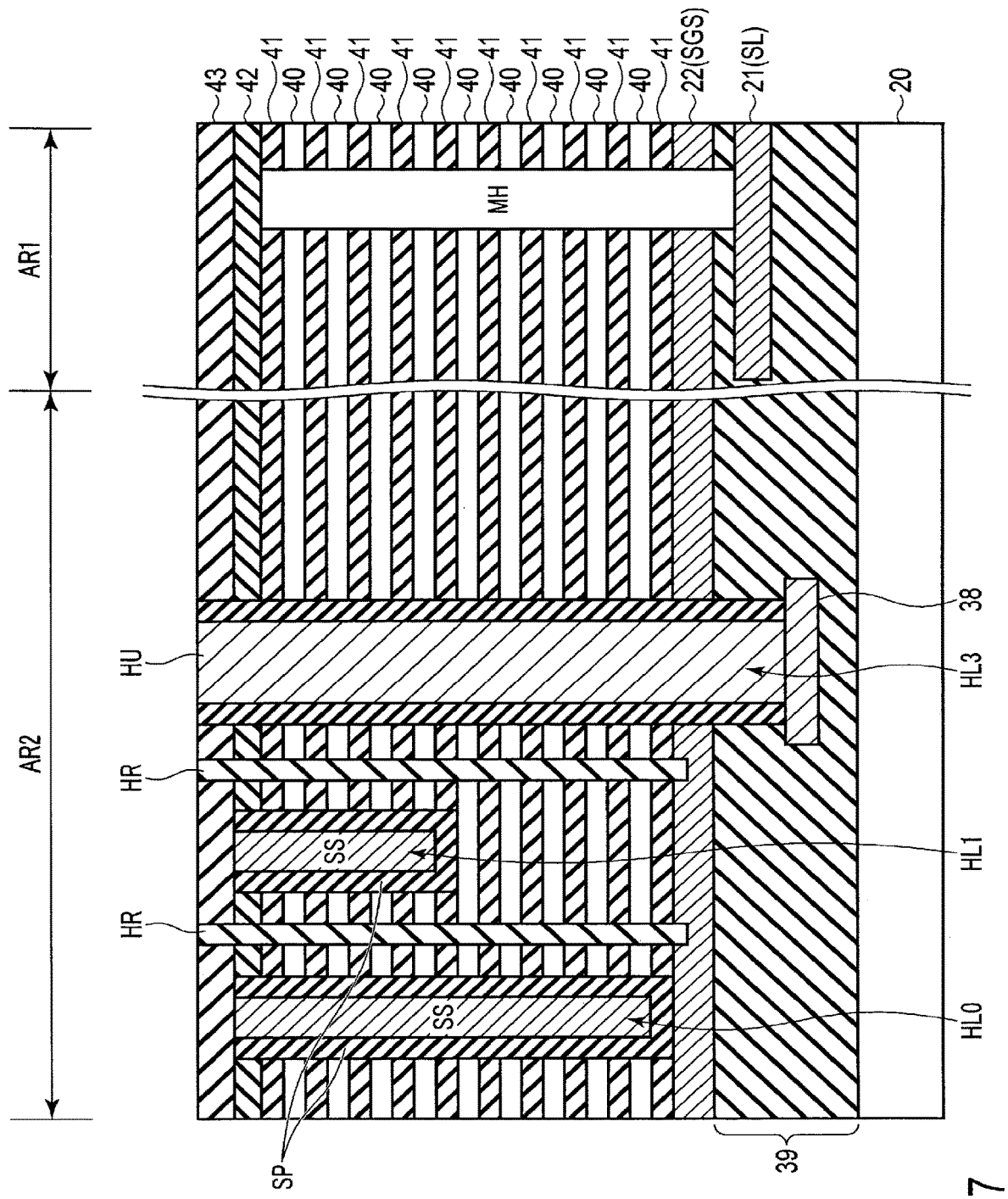
F I G. 17

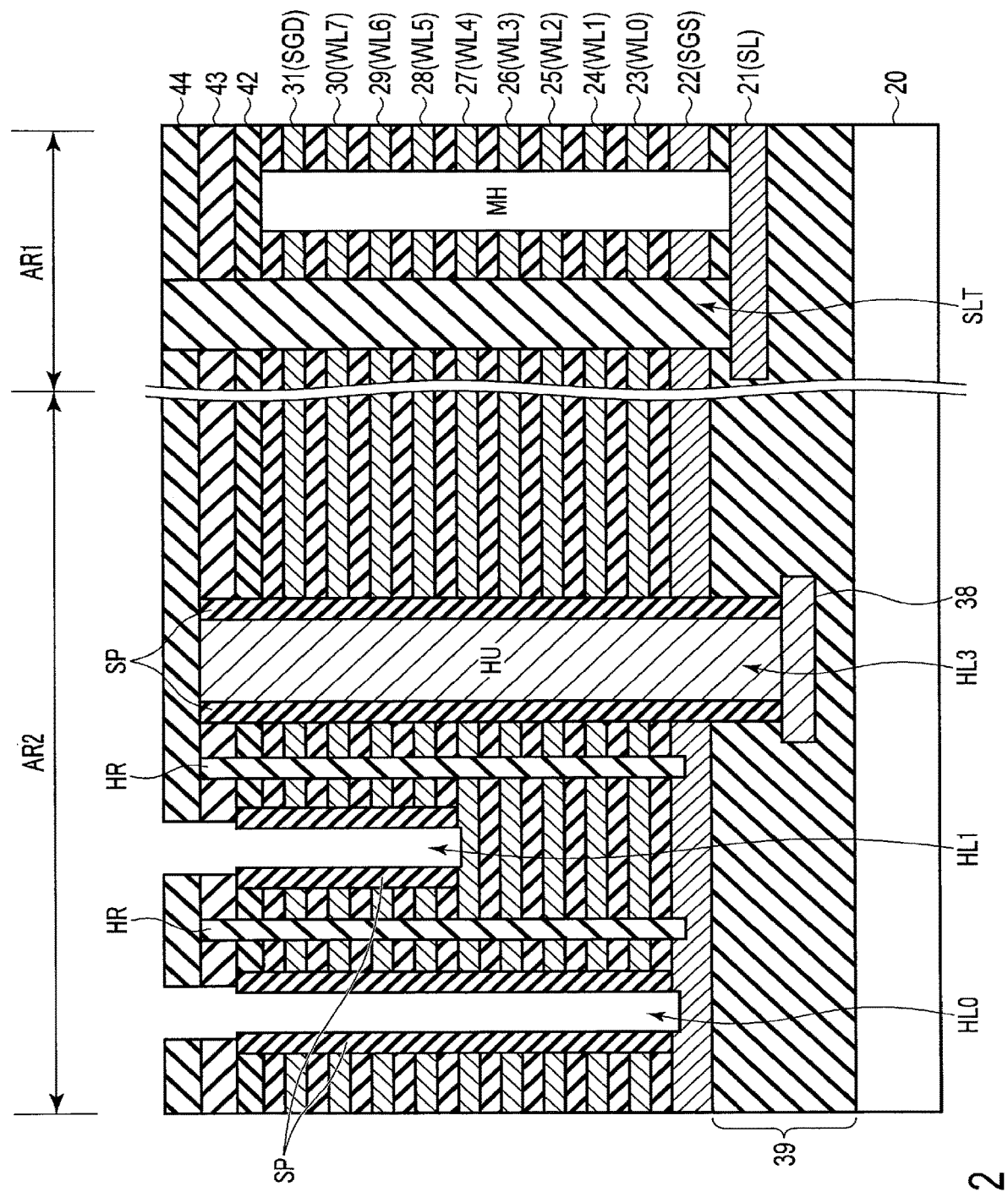
F I G. 22

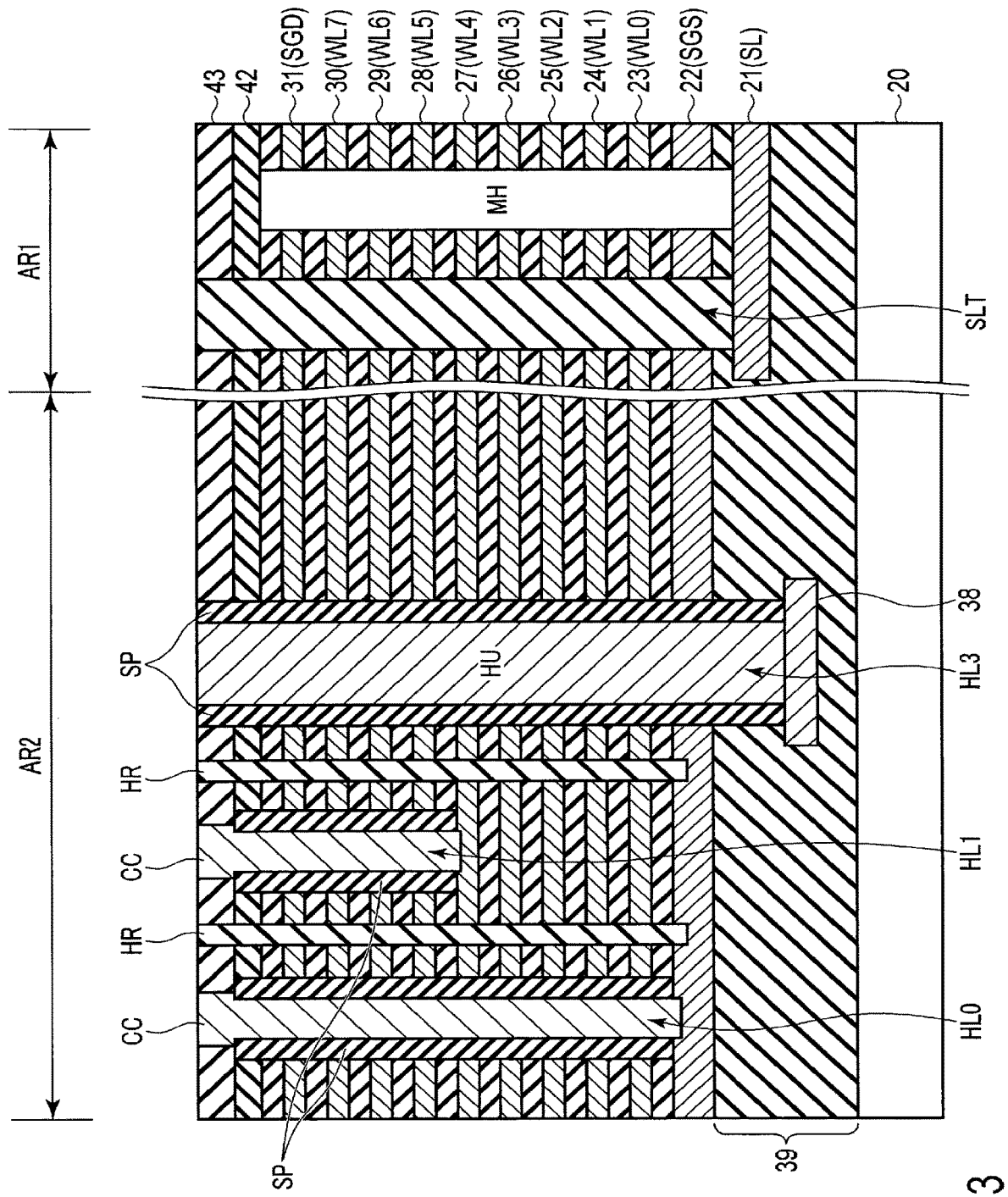
F I G. 23

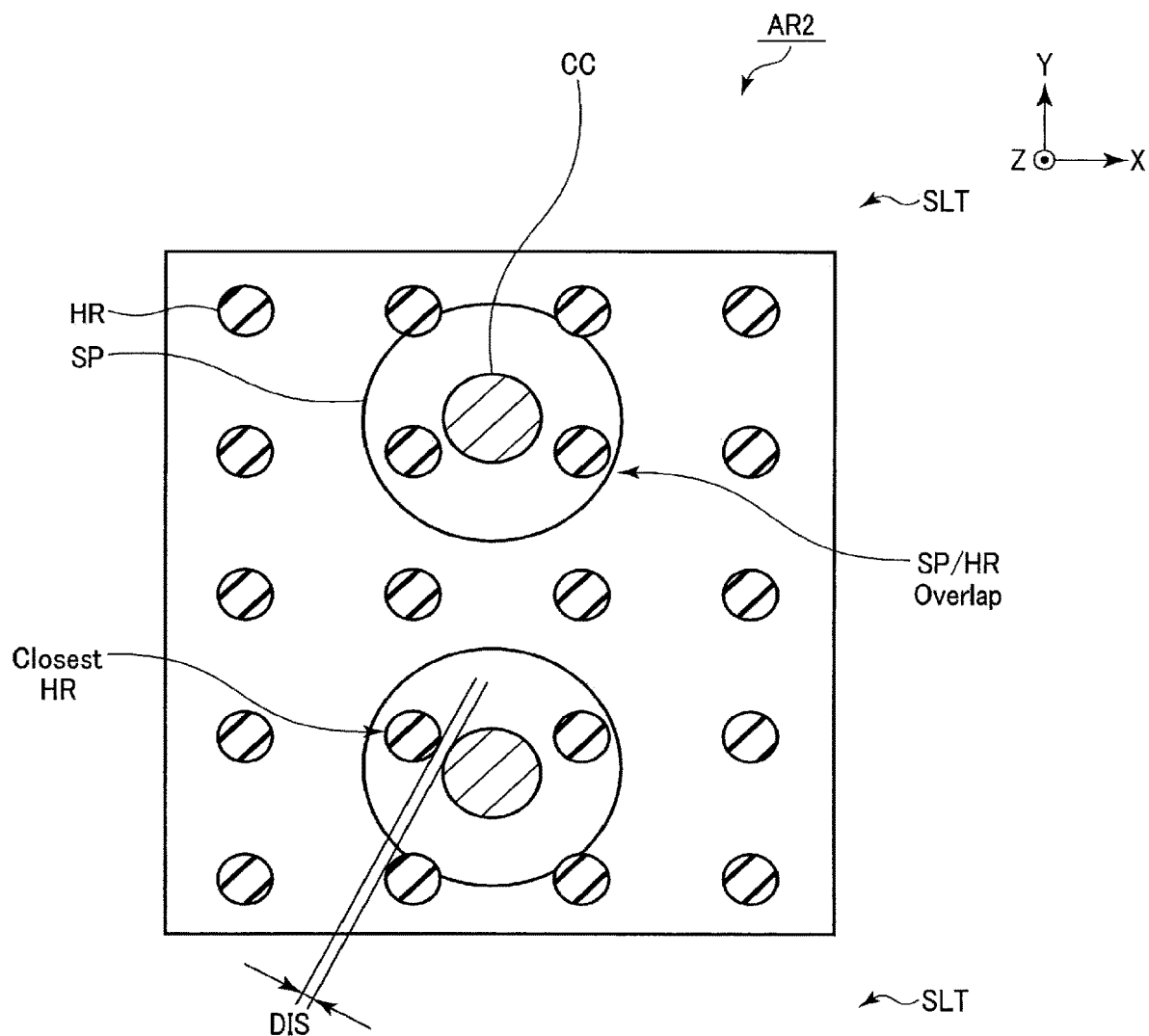
F I G. 24

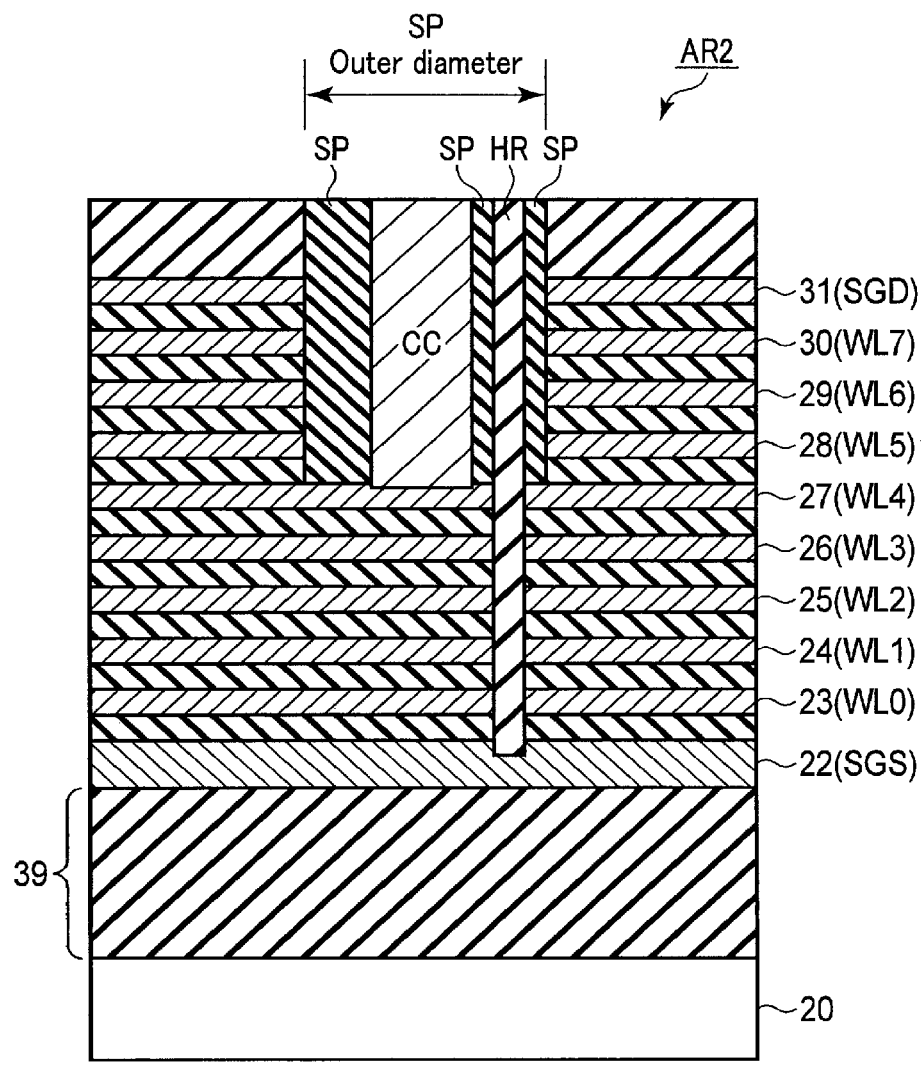
F I G. 25

| Process | | Contact layer | | | | | | | | | | |
|---|---|---|---|---|---|---|---|---|---|---|---|---|
| Etching | Number of times | 1 | 2 | 3 | 4 | 5 | 6 | 7 | 8 | ... | 16 | ... |
| Hard mask | 1 | ○ | ○ | ○ | ○ | ○ | ○ | ○ | ○ | | ○ | |
| 1 pair(20) | 2 | | ○ | ○ | ○ | ○ | ○ | | ○ | | ○ | |
| 2 pairs(21) | 3 | | | ○ | ○ | | | ○ | ○ | | ○ | |
| 4 pairs(22) | 4 | | | | | ○ | ○ | ○ | ○ | | ○ | |
| 8 pairs(23) | 5 | | | | | | | | | | ○ | |
| ... | ... | | | | | | | | | | | |

F I G. 31

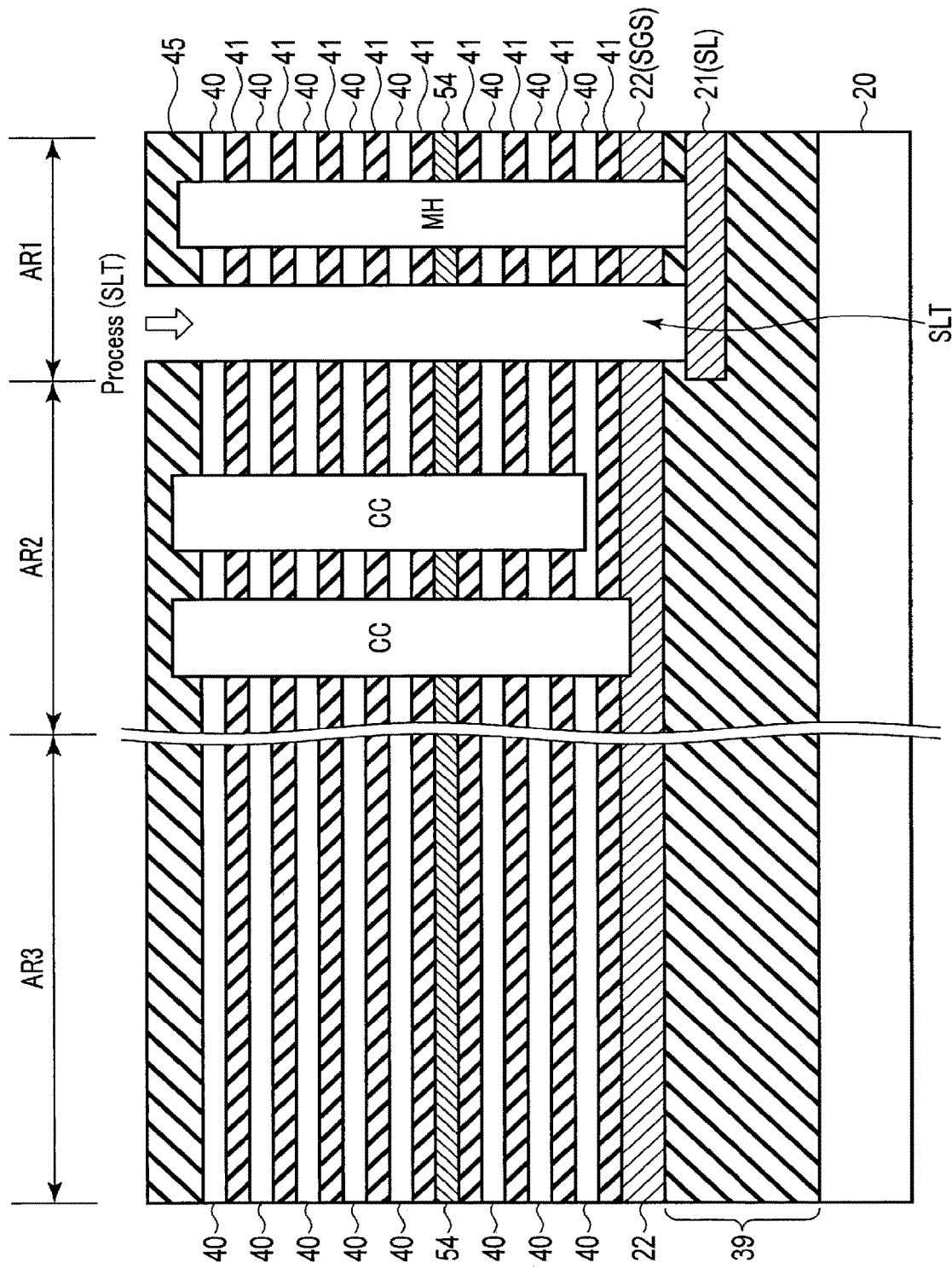
F I G. 35

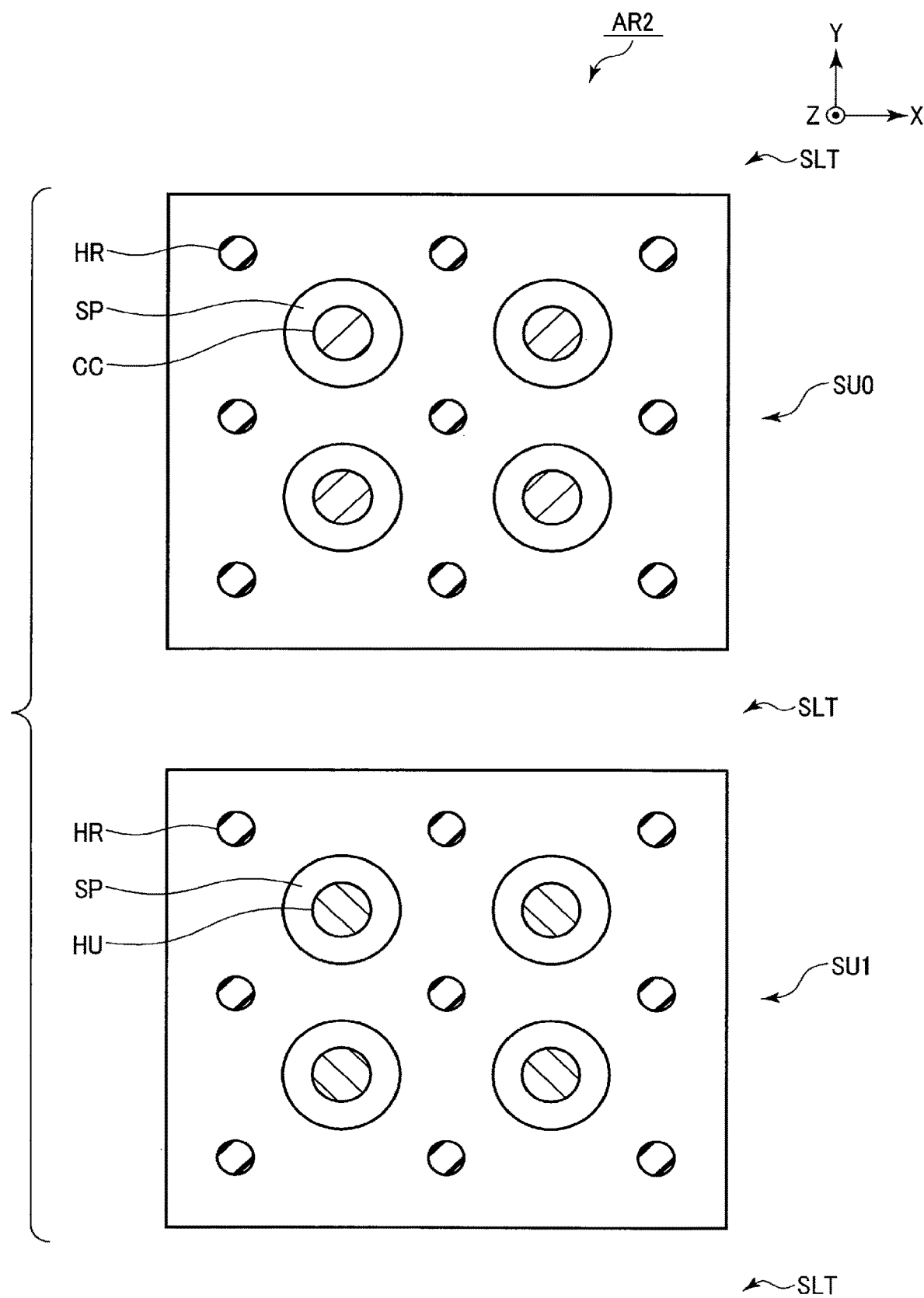
F I G. 37

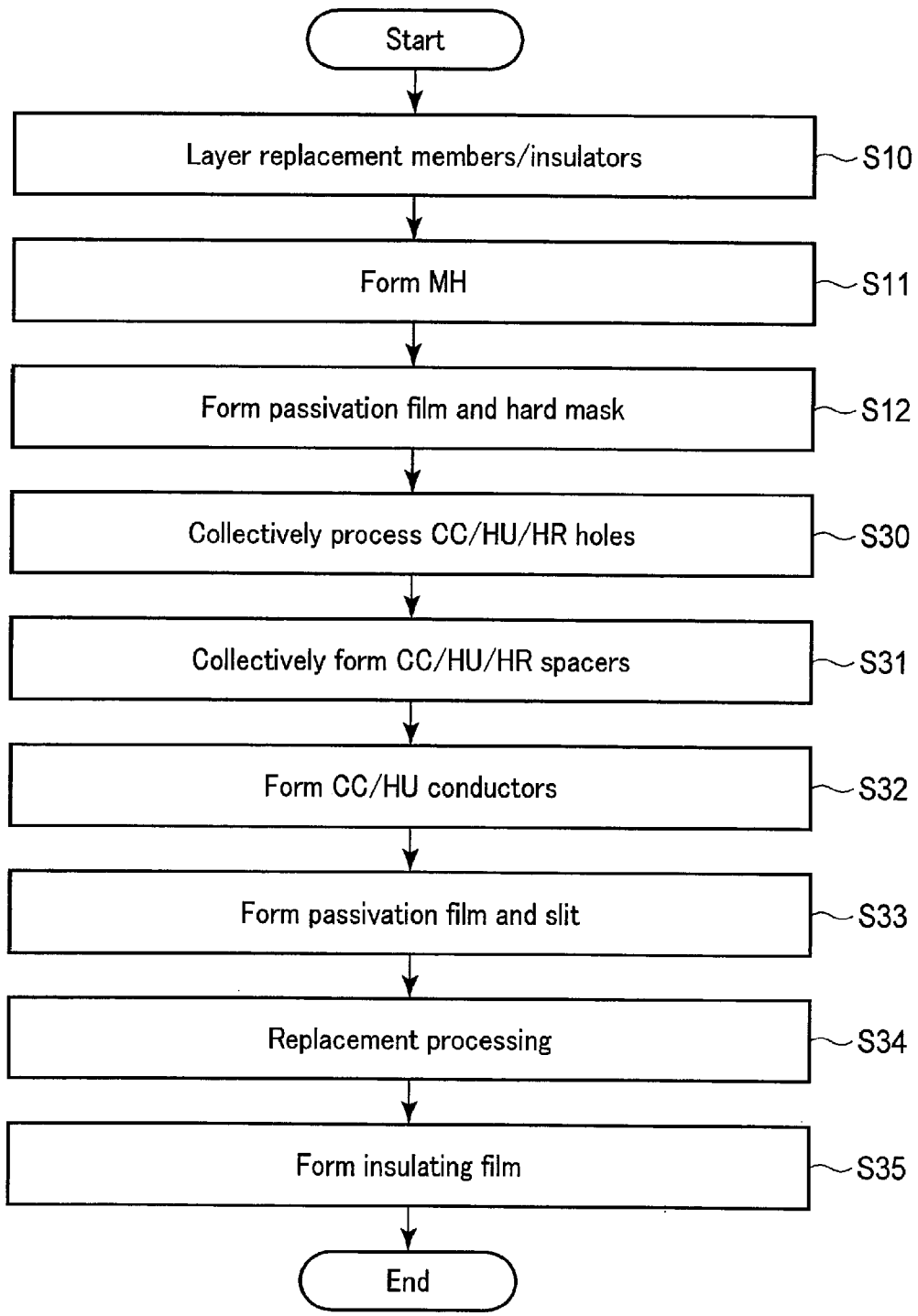
F I G. 40

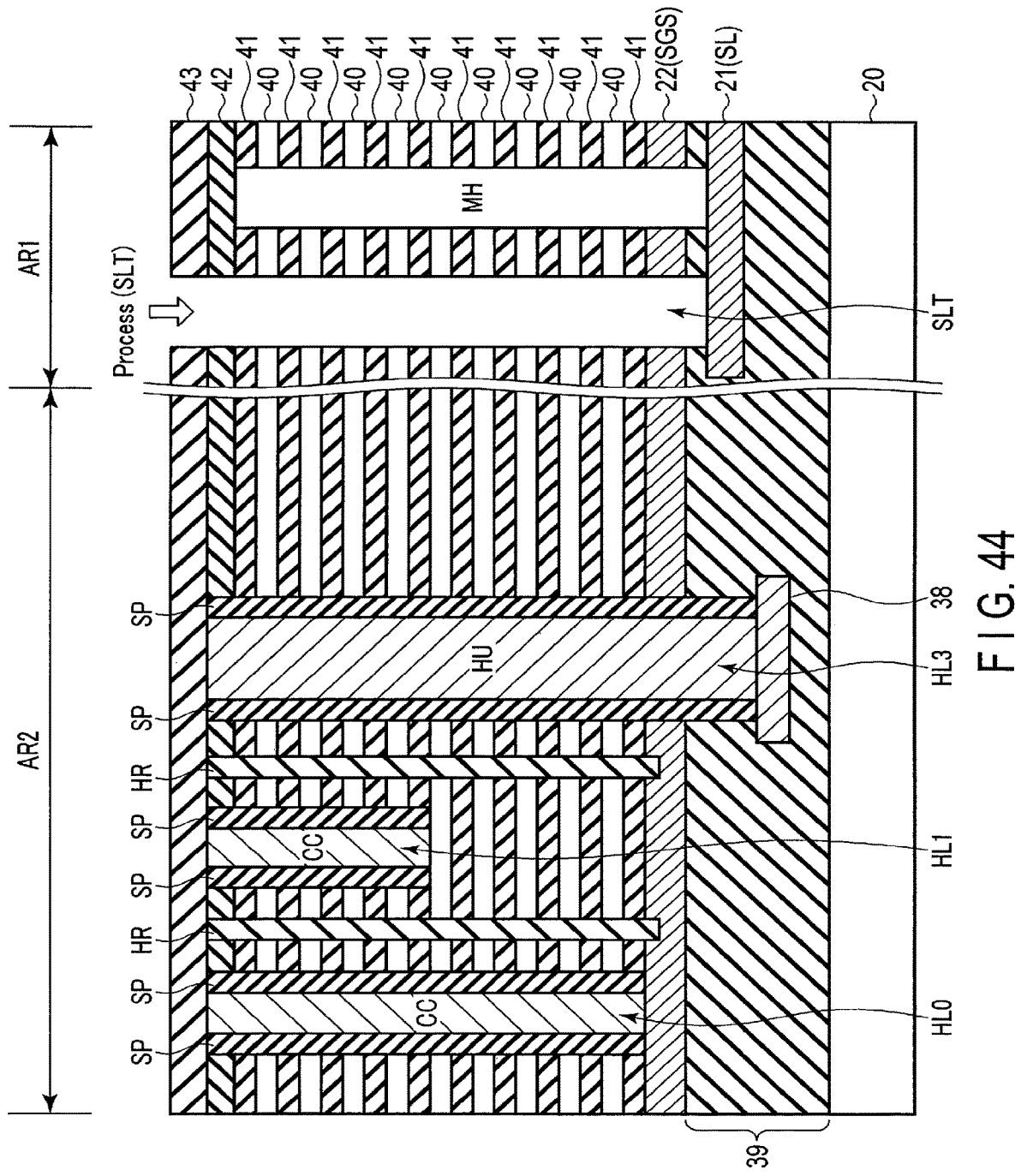
F I G. 44

MULTI-LAYER WIRING STRUCTURE, METHOD FOR MANUFACTURING MULTI-LAYER WIRING STRUCTURE, AND SEMICONDUCTOR DEVICE

CROSS-REFERENCE TO RELATED APPLICATIONS

This application is based upon and claims the benefit of priority from Japanese Patent Application No. 2017-181288, filed Sep. 21, 2017, the entire contents of which are incorporated herein by reference.

FIELD

Embodiments described herein relate generally to a multi-layer wiring structure, a method for manufacturing a multi-layer wiring structure, and a semiconductor device.

BACKGROUND

A NAND-type flash memory, in which memory cells are three-dimensionally layered, is known.

BRIEF DESCRIPTION OF THE DRAWINGS

FIG. 1 is a block diagram showing a configuration example of a semiconductor memory according to a first embodiment.

FIG. 4 and FIG. 5 are diagrams showing examples of detailed planar layouts in the wire hookup area of the semiconductor memory according to the first embodiment.

FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, and FIG. 23 are diagrams showing an example of steps of manufacturing the semiconductor memory according to the first embodiment.

FIG. 24 is a diagram showing an example of a detailed planar layout in the wire hookup area of the semiconductor memory according to the first embodiment.

FIG. 25 is a diagram showing an example of a cross-section structure in the wire hookup area of the semiconductor memory according to the first embodiment.

FIG. 31 is a table showing an example of the method for processing contact holes in the second embodiment.

FIG. 33, FIG. 34, FIG. 35, and FIG. 36 are diagrams showing an example of steps of manufacturing the semiconductor memory according to the third embodiment.

FIG. 37, FIG. 38, and FIG. 39 are diagrams showing examples of detailed planar layouts in a wire hookup area of a semiconductor memory according to a fourth embodiment.

FIG. 40 is a flowchart showing an example of a method for manufacturing the semiconductor memory according to the fourth embodiment.

FIG. 41, FIG. 42, FIG. 43, FIG. 44, FIG. 45, and FIG. 46 are diagrams showing an example of steps of manufacturing the semiconductor memory according to the fourth embodiment.

DETAILED DESCRIPTION

Figure 2:
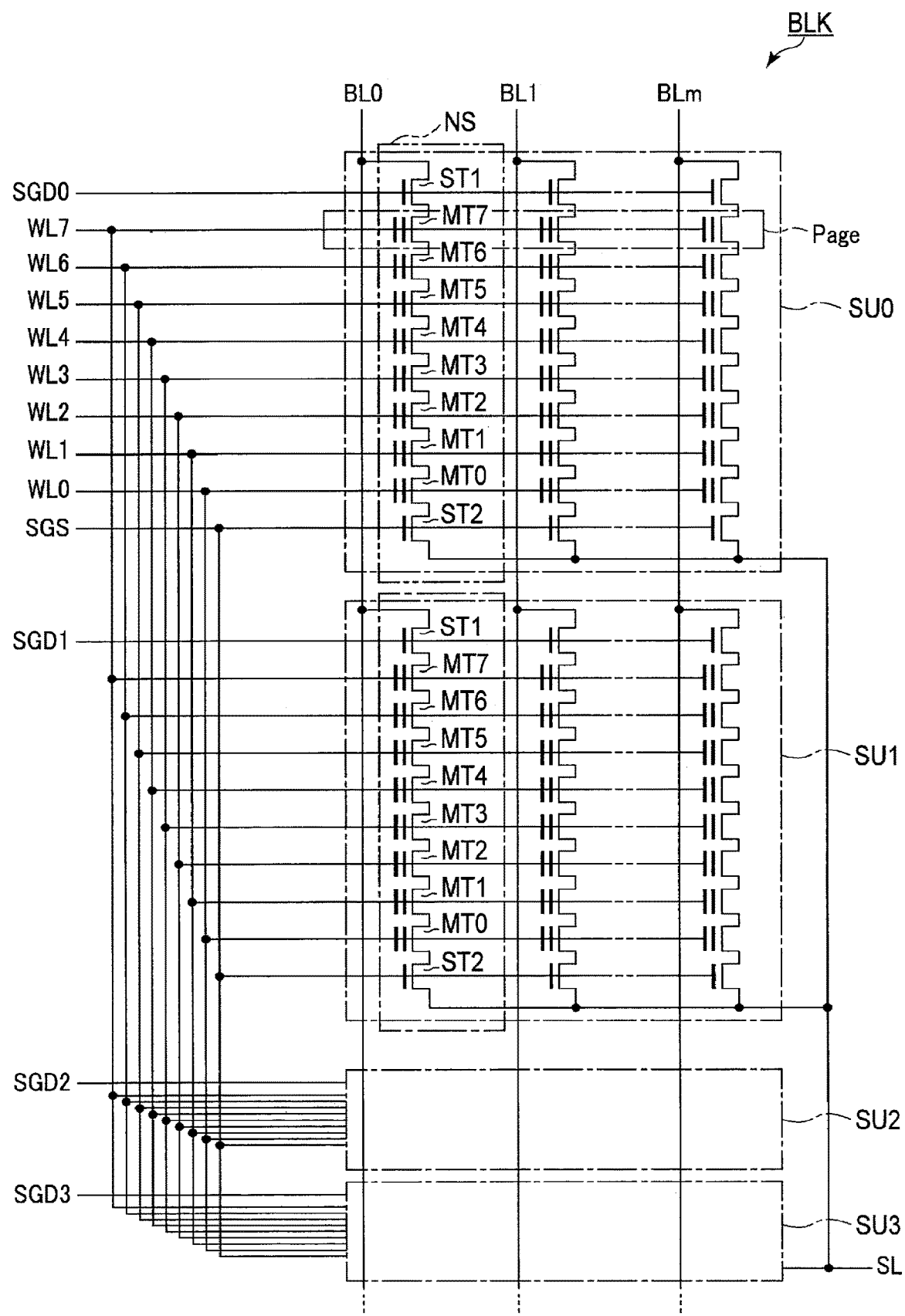
FIG. 2 is a diagram showing an example of a circuit configuration of a memory cell array according to the first embodiment.

A multi-layer wiring structure of embodiments includes a multi-layer section in which first conductors and first insulators are alternately layered, the multi-layer section including a first area that includes memory cells, and a second area different from the first area; a plurality of first contact plugs formed in a plurality of first holes extending from an uppermost layer of the multi-layer section to the first conductors in the second area, side surfaces of the first contact plugs being covered with first insulating films; and a plurality of pillars formed of second insulators and passing through the multi-layer section in a layered direction in the second area.

Hereinafter, the embodiments will be described with reference to the accompanying drawings. The drawings are schematic views. Each embodiment is an example of an apparatus or a method to embody a technical idea of the invention. In the description below, structural elements having substantially the same configurations will be denoted by the same reference symbols. To distinguish elements that are represented by a reference symbol including the same character, numerals are added after the character of the reference symbol. If elements represented by a reference symbol including the same character need not be distinguished from each other, the elements are referred to by only the reference symbol including the same character.

[1] First Embodiment

A semiconductor memory 1 according to a first embodiment will be described.

[1-1] Configuration

[1-1-1] Configuration of Semiconductor Memory 1

FIG. 1 shows a configuration example of the semiconductor memory 1 according to the first embodiment. The semiconductor memory 1 is a NAND type flash memory capable of storing data in a non-volatile manner. As shown in FIG. 1, the semiconductor memory 1 includes, for example, a memory cell array 10, a command register 11, an address register 12, a sequencer 13, a driver 14, a row decoder 15, and a sense amplifier 16.

The memory cell array 10 includes a plurality of blocks BLK0 through BLKn (n is an integer of 1 or more). A block BLK is a group of non-volatile memory cells, which is, for example, a data erasure unit. The memory cell array 10 includes a plurality of bit lines and a plurality of word lines, and each memory cell is associated with one bit line and one word line. A detailed configuration of the memory cell array 10 will be described later.

The command register 11 holds a command CMD that the semiconductor memory 1 receives from an external memory controller 2. The command CMD includes, for example, a command to cause the sequencer 13 to execute a read operation or a write operation.

The address register 12 holds address information ADD that the semiconductor memory 1 receives from the memory controller 2. The address information ADD includes, for example, a block address BA and a page address PA. The block address BA is used to select a block BLK including a memory cell that is a target of an operation. The page address PA is used to select a word line associated with a memory cell that is a target of an operation.

The sequencer 13 controls all operations of the semiconductor memory 1 based on the command CMD held in the command register 11. For example, the sequencer 13 controls the driver 14, the row decoder 15, and the sense amplifier 16, to exe cute a write operation for data DAT received from the memory controller 2.

The driver 14 generates a desired voltage under the control of the sequencer 13. The driver 14 applies, for example, a voltage to be applied to a selected word line and a voltage to be applied to a non-selected word line, to the corresponding signal lines based on the page address PA held in the address register 12.

The row decoder 15 selects one block BLK based on the block address BA held in the address register 12. The row decoder 15 applies voltages, which the driver 14 applies to signal lines, to, for example, a selected word line and non-selected word lines, respectively.

The sense amplifier 16 applies a desired voltage to each bit line in accordance with write data DAT received from the memory controller 2. The sense amplifier 16 determines data stored in the memory cell based on the voltage of the bit line, and transmits the determined read data DAT to the memory controller 2.

Communication between the semiconductor memory 1 and the memory controller 2 supports, for example, a NAND interface standard. For example, the memory controller 2 transmits a command latch enable signal CLE, an address latch enable signal ALE, a write enable signal WEn, and a read enable signal REn, receives a ready busy signal RBn, and transmits and receives an input output signal I/O. The signal CLE is a sign al notifying the semiconductor memory 1 that the received signal I/O is a command CMD. The signal ALE is a signal notifying the semiconductor memory 1 that the received signal I/O is address information ADD. The signal WEn is a signal instructing the semiconductor memory 1 to input the signal I/O. The signal REn is a signal instructing the semiconductor memory 1 to output the signal I/O. The signal RBn is a signal notifying the memory controller 2 whether the semiconductor memory 1 is in a ready state to receive an instruction from the memory controller 2 or in a busy state not to receive an instruction from the memory controller 2. The signal I/O is a signal of, for example, 8 bits, and may include a command CMD, address information ADD, write data DAT, read data, etc.

The semiconductor memory 1 and the memory controller 2 as described above may be combined to form one semiconductor device. Such a semiconductor device may be, for example, a memory card such as an SD™ card, or may be an SSD (solid state drive).

[1-1-2] Circuit Configuration of Memory Cell Array 10

FIG. 2 shows an example of a circuit configuration of the memory cell array 10 according to the first embodiment. In the following, a circuit configuration of the memory cell array 10 according to the first embodiment will be described, referring to a block BLK.

The block BLK includes, for example, four string units SU0 to SU3, as shown in FIG. 2. Each string unit SU includes a plurality of NAND strings NS, respectively associated with bit lines BL0 through BLm (m is an integer of 1 or more). For example, each NAND string NS includes 8 memory cell transistors MT0 through MT7, and selection transistors ST1 and ST2.

The memory cell transistor MT includes a control gate and a charge storage layer, and holds data in a non-volatile manner. The memory cell transistors MT0 through MT7 included in each NAND string NS are connected in series between a source of the selection transistor ST1 and a drain of the selection transistor ST2. Control gates of the memory cell transistors MT0 through MT7 in the same block BLK are respectively connected to word lines WL0 through WL7 in common. A set of one bit data stored in a plurality of memory cell transistors MT connected to a common word line WL in each string unit SU is called "a page".

The selection transistors ST1 and ST2 are used to select the string unit SU in various operations. Gates of the selection transistors ST1 included in the string units SU0 through SU3 in the same block BLK are respectively, connected to selection gate lines SGD0 through SGD3 in common. Drains of the selection transistors ST1 of the same column of each block BLK are connected in common to the corresponding bit line BL. Gates of the selection transistors ST2 in the same block BLK are connected in common to a selection gate line SGS. Sources of the selection transistors ST2 of the blocks BLK are connected in common to a source line SL between the blocks BLK.

The circuit configuration of the memory cell array 10 is not limited to the configuration described above. For example, the number of the string units SU included in each block BLK and the number of the memory cell transistors MT and the number of the selection transistors ST1 and ST2 included in each NAND string NS may be any numbers. The number of the word lines WL and the number of the selection gate lines SGD and SGS are changed depending on the number of the memory cell transistors MT and the number of the selection transistors ST1 and ST2.

[1-1-3] Structure of Semiconductor Memory 1

Figure 3:
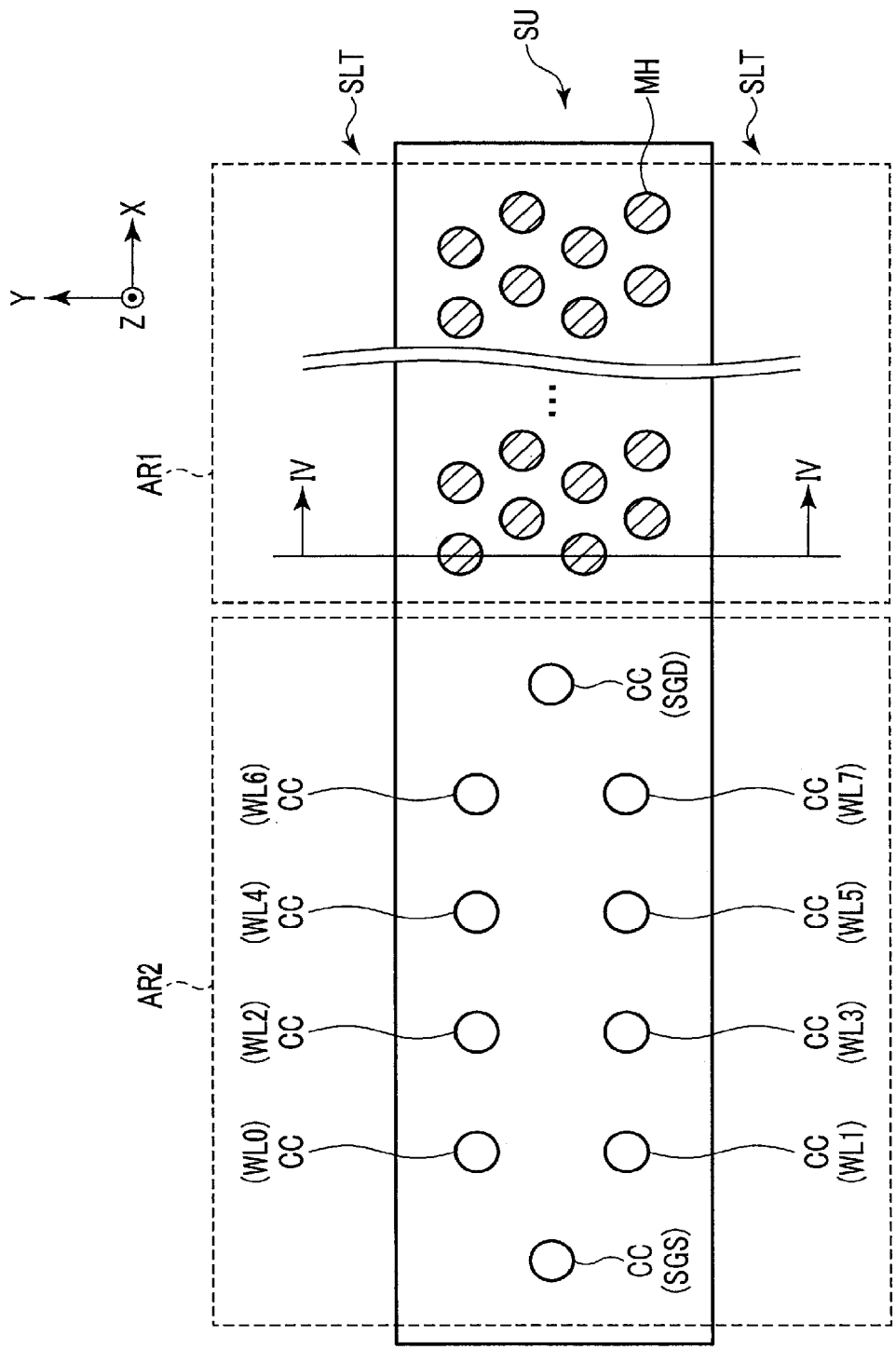
FIG. 3 is a diagram showing an example of a planar layout in a cell area and a wire hookup area of the semiconductor memory according to the first embodiment.

FIG. 3 shows an example of a planer layout in a cell area AR1 and a hookup area (wire hookup area) AR2 in the semiconductor memory 1 according to the first embodiment. An X axis corresponds to an extending direction of the word line WL, a Y axis corresponds to an extending direction of the bit line BL, and a Z axis corresponds to a vertical direction relative to a substrate surface.

The cell area AR1 is an area that substantially holds data, and includes a plurality of memory cells. The hookup area AR2 is an area including wires and contact plugs to connect various wires connected to the memory cells in the cell area AR1 with, for example, the row decoder 15.

A plurality of slits SLT, each extending in the X direction, are arranged in the Y directions, for example, as shown in FIG. 3. Each slit SLT is formed between adjacent string units SU, and an insulating film is formed inside the slit SLT. In other words, each string unit SU is provided between adjacent slits SLT.

The string unit SU includes a plurality of semiconductor pillars MH in the cell area AR1, and a plurality of contact plugs CC in the hookup areas AR2. One semiconductor pillar MH corresponds to, for example, one NAND string NS. The contact plugs CC are provided to respectively correspond to, for example, the word lines WL0 through WL7 and the selection gate lines SGD and SGS. As the contact plugs CC, for example, phosphorus-doped silicon, or a metal material, such as tungsten, are used.

FIG. 4 and FIG. 5 are diagrams showing examples of detailed planar layouts in the hookup area AR2 of the semiconductor memory 1 according to the first embodiment. The string unit SU additionally includes a plurality of contact plugs HU and a plurality of support pillars HR in the hookup area AR2, as shown in FIG. 4.

The contact plugs HU are provided to respectively correspond to, for example, the word lines WL0 to WL7 and the selection gate lines SGD and SGS. The word lines WL0 to WL7 and the selection gate lines SGD and SGS are electrically connected to the row decoder 15 via a pair of contact plugs CC and HU. As the contact plugs HU, for example, phosphorus-doped silicon, or a metal material, such as tungsten, are used.

The support pillars HR are provided, for example, around the contact plug CC and the contact plug HU. The support pillars HR are arranged, for example, in a matrix in the hookup area AR2, to suppress deformation of a structure forming the string unit SU in a process of manufacturing the semiconductor memory 1. In the structure of the semiconductor memory 1 according to the first embodiment, the support pillars HR may be in contact with or separate from the contact plug CC. The support pillars HR are separate from the contact plug HU. As the support pillars HR, for example, silicon oxide $SiO_2$ or silicon nitride SiN is used. The support pillars HR may have a structure in which a plurality of materials are used; for example, a structure in which silicon oxide $SiO_2$ is formed around a core of silicon nitride SiN.

The contact plugs CC and the contact plugs HU may be provided in different string units SU, as shown in FIG. 5. For example, as shown in FIG. 5, the wire may be connected to the row decoder 15 via the corresponding contact plug CC provided in the string unit SU0 and the corresponding contact plug HU provided in the string unit all. In this case also, the support pillars HR are provided around the contact plug CC and around the contact plug HU.

Figure 6:
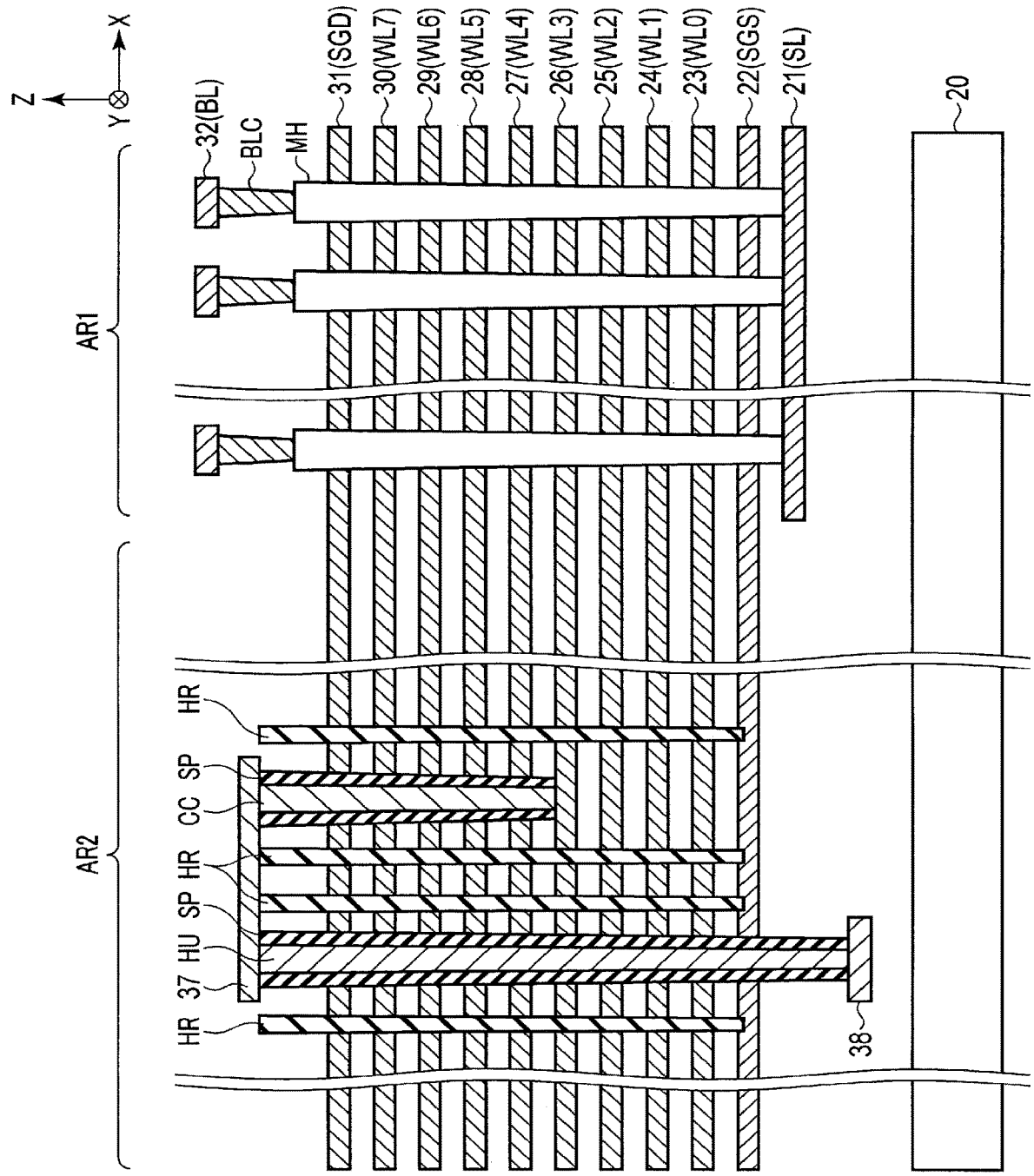
FIG. 6 is a diagram showing an example of a cross-section structure in the cell area and the wire hookup area of the semiconductor memory according to the first embodiment.

FIG. 6 shows an example of a cross-section structure, taken along the X direction, in the cell area AR1 and the hookup area AR2 of the semiconductor memory 1 according to the first embodiment. In the cross-sectional views referred to in the following description, an interlayer insulating film is omitted where appropriate.

In the cell area AR1, conductors 21 through 31 are sequentially formed above a semiconductor substrate 20 via insulators, each provided between two of the conductors, as shown in FIG. 6. Each of the conductors 21 through 31 has a plate shape extending in the X and Y directions. For example, the conductor 21 is provided in the cell area AR1, while the conductors 22 through 31 are provided, ranging from the cell area AR1 to the hookup area AR2. For example, the conductor 21 functions as the source line SL, the conductor 22 functions as the selection gate line SGS, the conductors 23 through 30 respectively function as the word lines WL0 through WL7, and the conductor 31 functions as the selection gate line SGD. As the conductors 21 and 22, for example, polysilicon is used. As the conductors 23 through 30, for example, tungsten W is used.

The semiconductor pillars MH are provided through conductors 22 to 31, from an upper surface of the conductor 31 to an upper surface of the conductor 21. A conductive contact plug BLC is provided on each of the semiconductor pillars MH. A conductor 32 that functions as the bit line BL is provided on each contact plug BLC. The conductors 32 are formed as lines extending in the Y direction. In each string unit SU, one conductor 32 is electrically connected to one semiconductor pillar MH.

Figure 7:
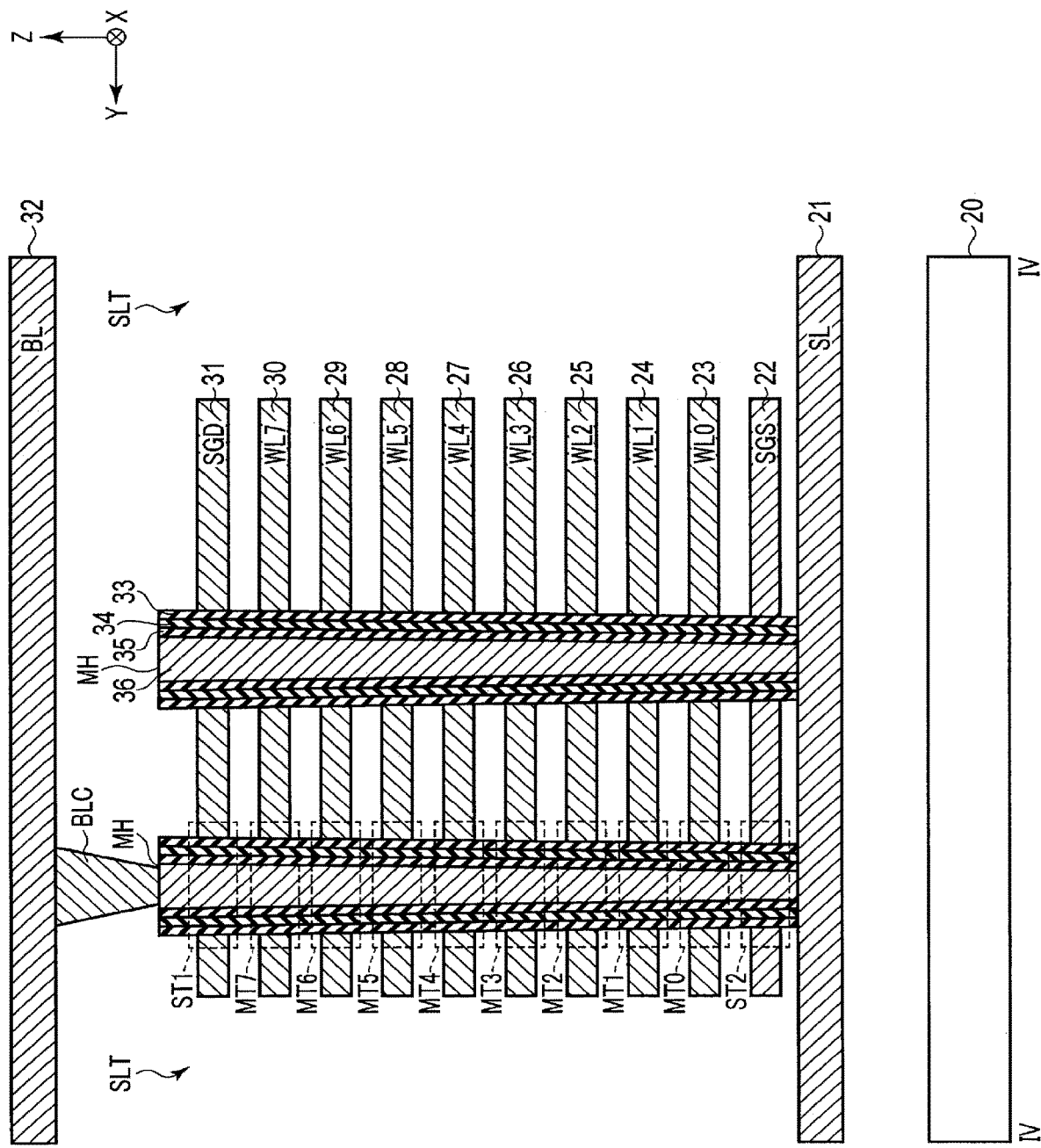
FIG. 7 is a diagram showing an example of a detailed cross-section structure in the cell area of the semiconductor memory according to the first embodiment.

FIG. 7 shows an example of a detailed cross-section structure in the cell area AR1 of the semiconductor memory 1 according to the first embodiment, taken along the line IV-IV in FIG. 3.

As shown in FIG. 7, a structure corresponding to the string unit SU is provided between the adjacent slits SLT. Each slit SLT is formed so as not to be in contact with a wiring layer including the conductor 32, which is plate-shaped and extending in the X and Z directions.

The semiconductor pillar MH includes, for example, a block insulating film 33, an insulating film 34, a tunnel oxide film 35, and a conductive semiconductor material 36, as shown in FIG. 7. The block insulating film 33 is formed on an inner wall of a memory hole to form the semiconductor pillar MH, the insulating film 34 is formed on an inner wall of the block insulating film 33, the tunnel oxide film 35 is formed on an inner wall of the insulating film 34, and the semiconductor material 36 is buried in a part inside the tunnel oxide film 35. The semiconductor material 36 may include another material.

In the configuration of the semiconductor pillar MH, the insulating film 34 functions as a charge storage layer of the memory cell transistor MT, and a channel of the NAND string NS is formed in the semiconductor material 36. A part where the semiconductor pillar MH crosses the conductor 22 functions as the selection transistor ST2, parts where the semiconductor pillar MH crosses the conductors 23 through 30 respectively function as the memory cell transistors MT0 through MT7, and a part where the semiconductor pillar MH crosses the conductor 31 functions as the selection transistor ST1.

Referring back to FIG. 6, a plurality of conductors 37 and 38, for example, corresponding to the number of the contact plugs CC, are provided above the semiconductor substrate 20 in the hookup area AR2. The conductor 37 is a wire that is formed above the conductor 31, and electrically connects the contact plug CC and the contact plug HU. The conductor 38 is a wire that is formed below the conductor 22, and electrically connects the contact plug HU and the row decoder 15 provided in a region not shown.

For example, the contact plug CC corresponding to the word line WL3 is provided to pass through the conductors 27 through 31 from the upper surface of the conductor 31 to the upper surface of the corresponding conductor 26, as shown in FIG. 6. The contact plug CC corresponding to the word line WL3 is in contact with and electrically connected to the conductor 26 on the bottom surface. A spacer SP is provided around the contact plug CC. As the spacer SP, for example, an insulator, such as silicon oxide $SiO_2$ or silicon nitride SiN, is used, and electrically insulates the contact plug CC from the conductors 27 through 31. In other words, the contact plug CC is electrically connected to the corresponding conductor of the layered conductors 22 through 31, and insulated from the other conductors. The conductor 37 is formed on the upper surface of the corresponding contact plug CC, so that the contact plug CC and the conductor 37 are electrically connected.

Furthermore, for example, the contact plug HU corresponding to the word line WL3 is provided to pass through the conductors 22 through 31 from the upper surface of the conductor 31 to the upper surface of the corresponding conductor 38. The contact plug HU corresponding to the word line WL3 is in contact with and electrically connected to the conductor 38 on the bottom surface. A spacer SP is provided around the contact plug HU, and electrically insulates the contact plug HU from the conductors 22 through 31. The conductor 37 is formed on the upper surface of each contact plug HU, so that the contact plug HU and the conductor 37 are electrically connected. In other words, the contact plug HU is electrically connected to the conductors 37 and 38, and insulated from the conductors 22 through 31 that the contact plug HU passes through.

With the configuration described above, the conductor 26 corresponding to the word line WL3 is electrically connected to the row decoder 15 via the corresponding contact plugs CC and HU and the conductors 37 and 38. The contact plugs CC and HU corresponding to the other word lines WL and the selection gate lines SGS and SGD and the conductors 37 and 38 are provided in the same manner as the configuration corresponding to the word line WL3, while the conductors to which the contact plug CC is connected are changed as appropriate.

For example, the contact plug CC corresponding to the word line WL0 is provided to extend from the upper surface of the conductor 31 to the upper surface of the conductor 23. The contact plug CC corresponding to the word line WL7 is provided to extend from the upper surface of the conductor 31 to the upper surface of the conductor 30. The contact plug CC corresponding to the selection gate line SGS is provided to extend from the upper surface of the conductor 31 to the upper surface of the conductor 22.

The support pillars HR are provided to pass through the conductors 23 to 31 from the upper surface of the conductor 31 to the upper surface of the conductor 22, as shown in FIG. 6. Thus, insulators are formed in a region where the support pillars HR pass through the plate-like conductors 23 to 31. The region where the support pillars HR are provided is not limited to the aforementioned region. For example, the support pillars HR may be provided to extend from the upper surface of the conductor 31 to the semiconductor substrate 20 through the conductors 22 to 31, or may be provided to extend to another material between the semiconductor substrate 20 and the conductor 22.

As described above, the semiconductor memory 1 according to the first embodiment includes a multi-layer section in which conductors functioning as the word lines WL and interlayer insulating films are alternately layered. The multi-layer structure including the multi-layer section includes the contact plugs CC and the support pillars HR in the hookup area AR2. The contact plugs CC are formed in contact holes, each extending to the corresponding conductor from the uppermost layer of the multi-layer section, and side surfaces of the contact plugs CC are covered with insulating films. The support pillars HR are formed of an insulator and pass through the multi-layer section in the layered direction.

The semiconductor memory 1 of the first embodiment is not limited to the structure described above. For example, each of the selection gate lines SGS and SGD described above may be formed of conductors of a plurality of layers. For example, the number of memory cell transistors MT included in one NAND string NS is changed by changing the number of conductors corresponding to word lines WL through which one semiconductor pillar MH passes. For example, the conductor 21 corresponding to the source line SL may range from the cell area AR1 to the hookup area AR2. For example, one NAND string NS may have a structure in which a plurality of semiconductor pillars MH are connected in the Z direction. For example, the semiconductor pillar MH may be connected to the conductor 32 via a plurality of contact plugs BLC or conductors.

For example, the height from the semiconductor substrate 20 to the upper surfaces of the contact plug HU and the support pillar HR may be different from the height from the semiconductor substrate 20 to the upper surface of the contact plug CC. Furthermore, the wiring layer including the conductor 37 may be the same as or different from the wiring layer including the conductor 32. For example, each of connection between the contact plug CC and the conductor 37 and connection between the contact plug HU and the conductor 37 may be made by another contact plug or any other conductor.

[1-2] Method for Manufacturing Semiconductor Memory 1

Figure 8:
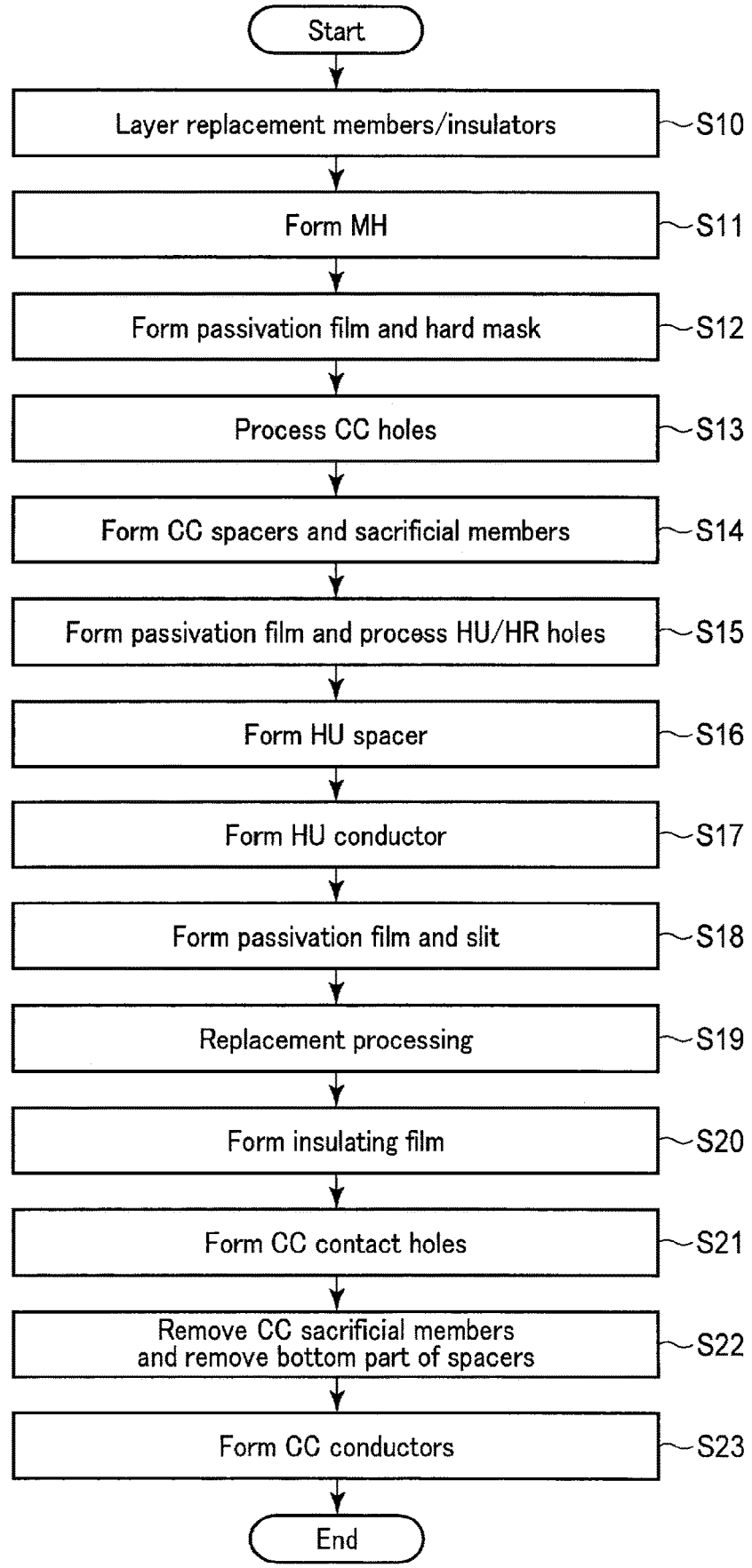
FIG. 8 is a flowchart showing an example of a method for manufacturing the semiconductor memory according to the first embodiment.

FIG. 8 is a flowchart showing an example of a method for manufacturing the semiconductor memory 1 according to the first embodiment. FIG. 9 through FIG. 23 show an example of cross-section structures in steps of manufacturing the semiconductor memory 1. In the following, a process from layering of replacement members and insulators to form word lines WL etc. to forming of contact plugs CC will be described, particularly focusing on the contact plugs CC respectively corresponding to the selection gate line SGS and the word line WL4.

Figure 9:
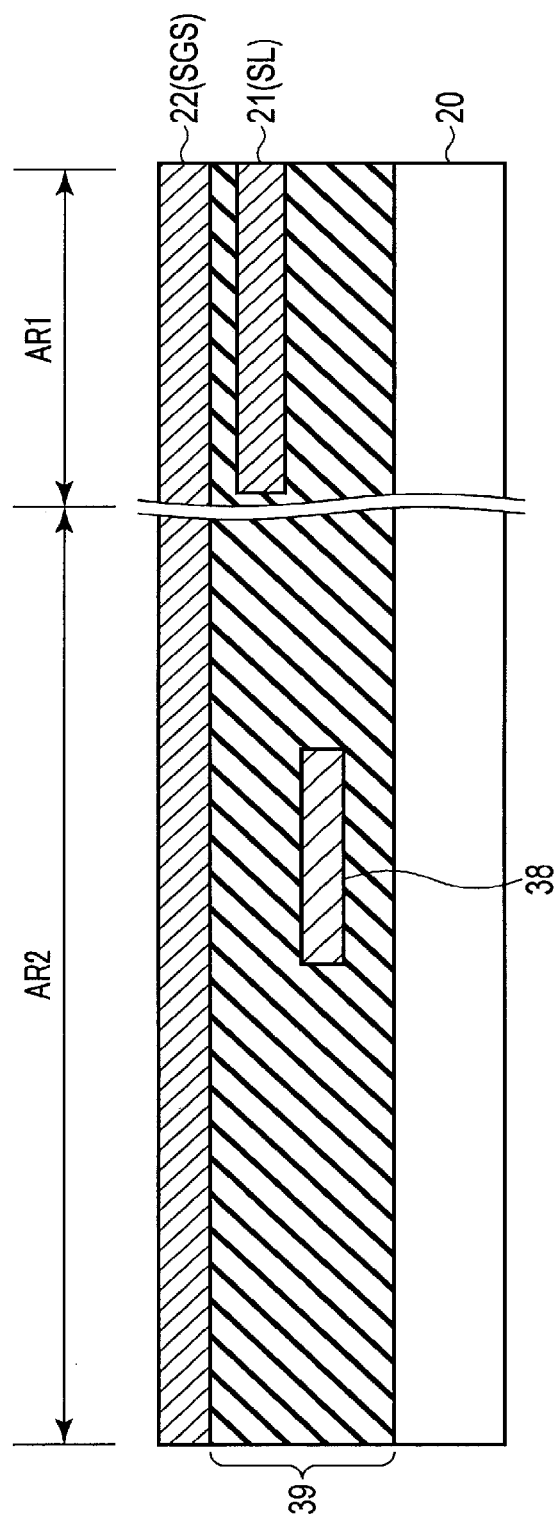

The description of manufacturing steps starts from, for example, a structure midway through manufacture of the semiconductor memory 1 shown in FIG. 9. FIG. 9 shows a cross-section structure of the semiconductor memory 1 in the cell area AR1, and a cross-section structure of the semiconductor memory 1 in the hookup area AR2. As shown in FIG. 9, the conductor 21 is formed in the cell area AR1, and the conductor 38 is formed in the hookup area AR2 above the semiconductor substrate 20. An insulator 39 is formed around the conductor 21 and the conductor 38, and the conductor 22 is formed on the insulator 39.

Figure 10:
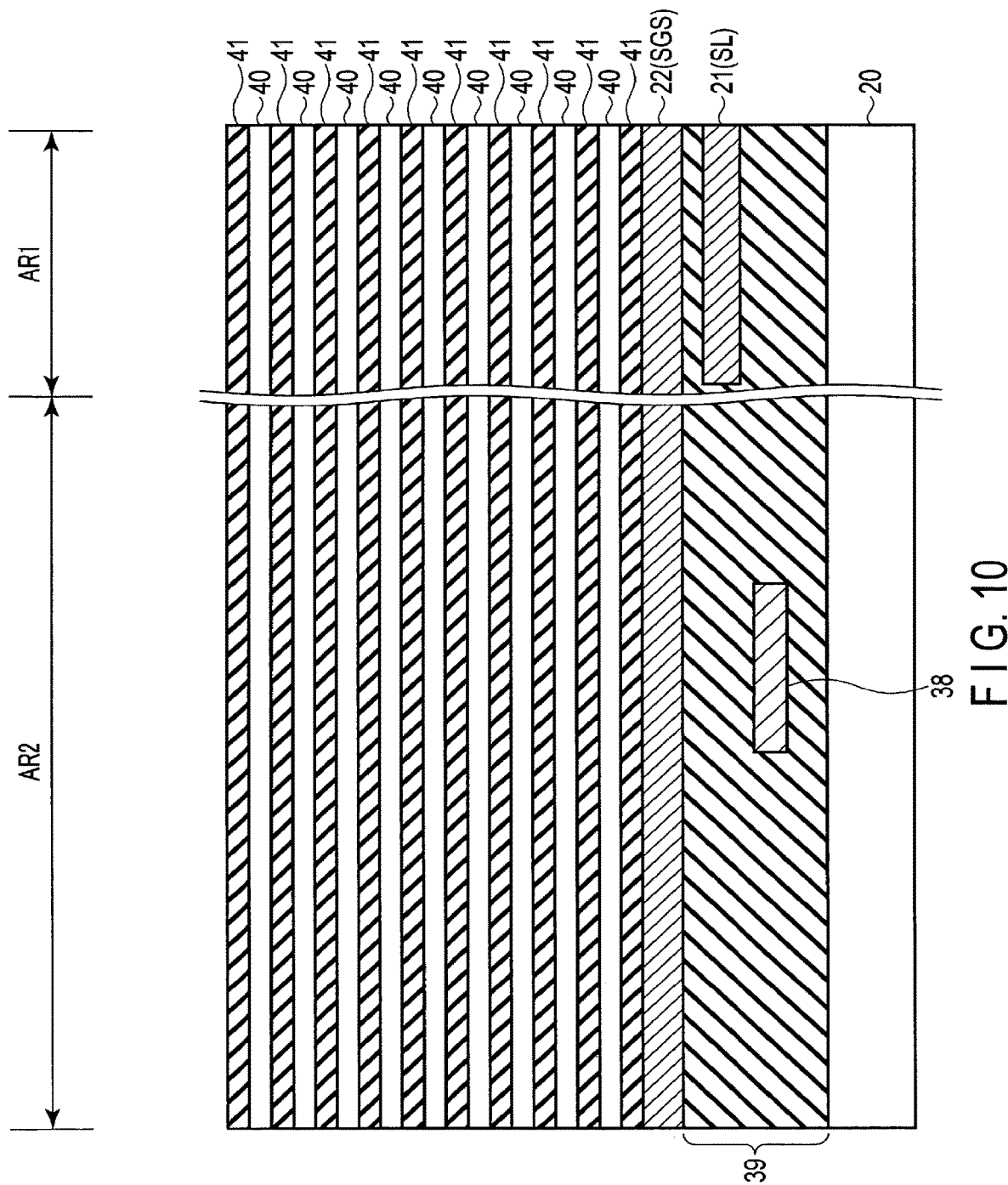

In step S10, as shown in FIG. 10, interlayer insulating films 41 and replacement members 40 are alternately layered on the conductor 22. For example, nitride film such as silicon nitride SiN is used as the replacement members 40, and oxide film such as silicon oxide $SiO_2$ is used as the interlayer insulating films 41. The number of layers of the replacement members 40 corresponds to, for example, the number of the selection gate line SGD and the word lines WL. The replacement members 40 correspond to the word lines WL0 through WL7 and the selection gate line SGD in this order from the bottom.

Figure 11:
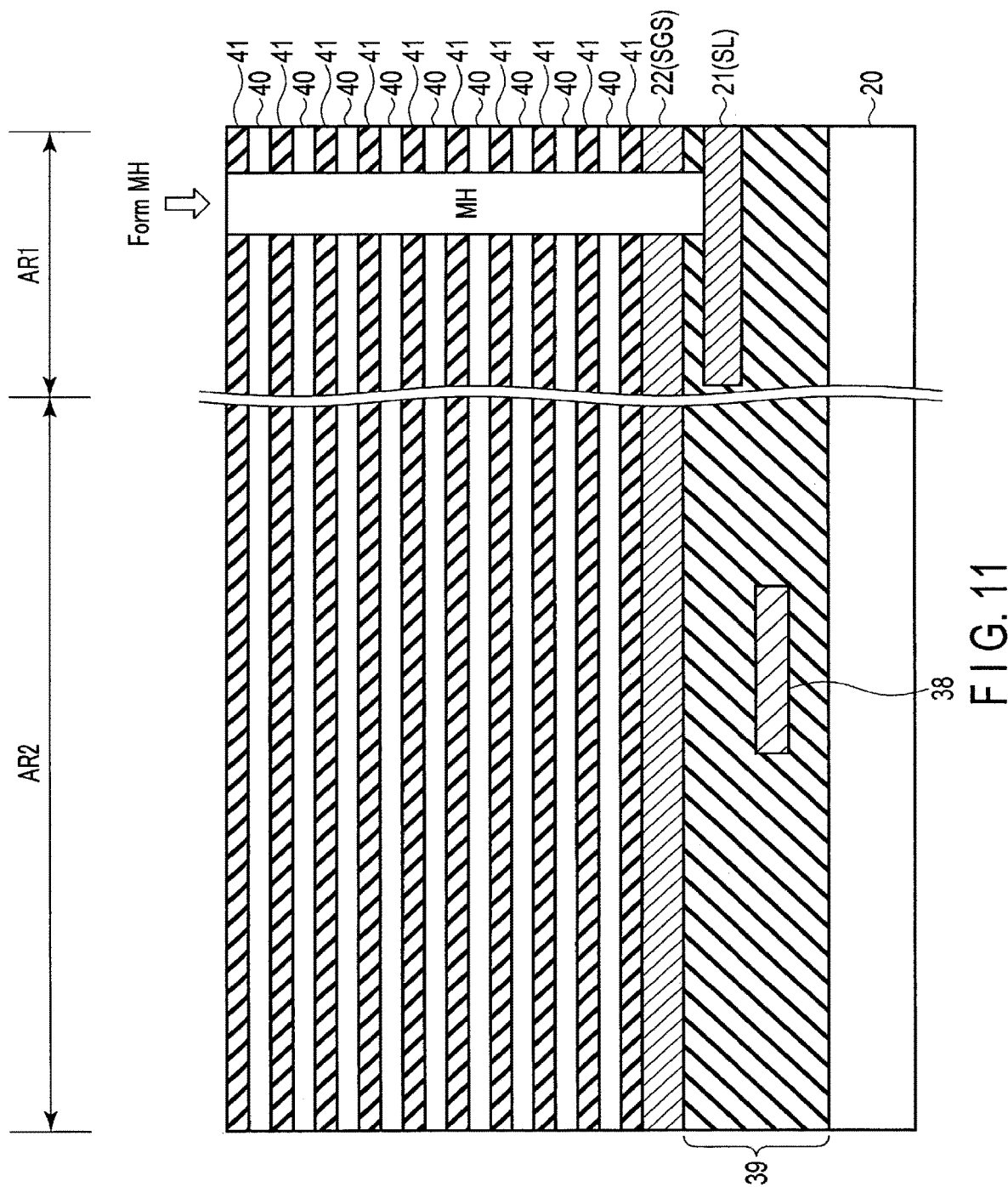

In step S11, as shown in FIG. 11, the semiconductor pillar MH is formed in the cell area AR1. Specifically, first, a hole extending from the uppermost interlayer insulating film 41 to the conductor 21 is formed. Then, the members in the semiconductor pillar MH described above with reference to FIG. 7 are sequentially formed in the hole. In the drawings used in the following descriptions, the detailed cross-section structure of the semiconductor pillar MH is not shown.

Figure 12:
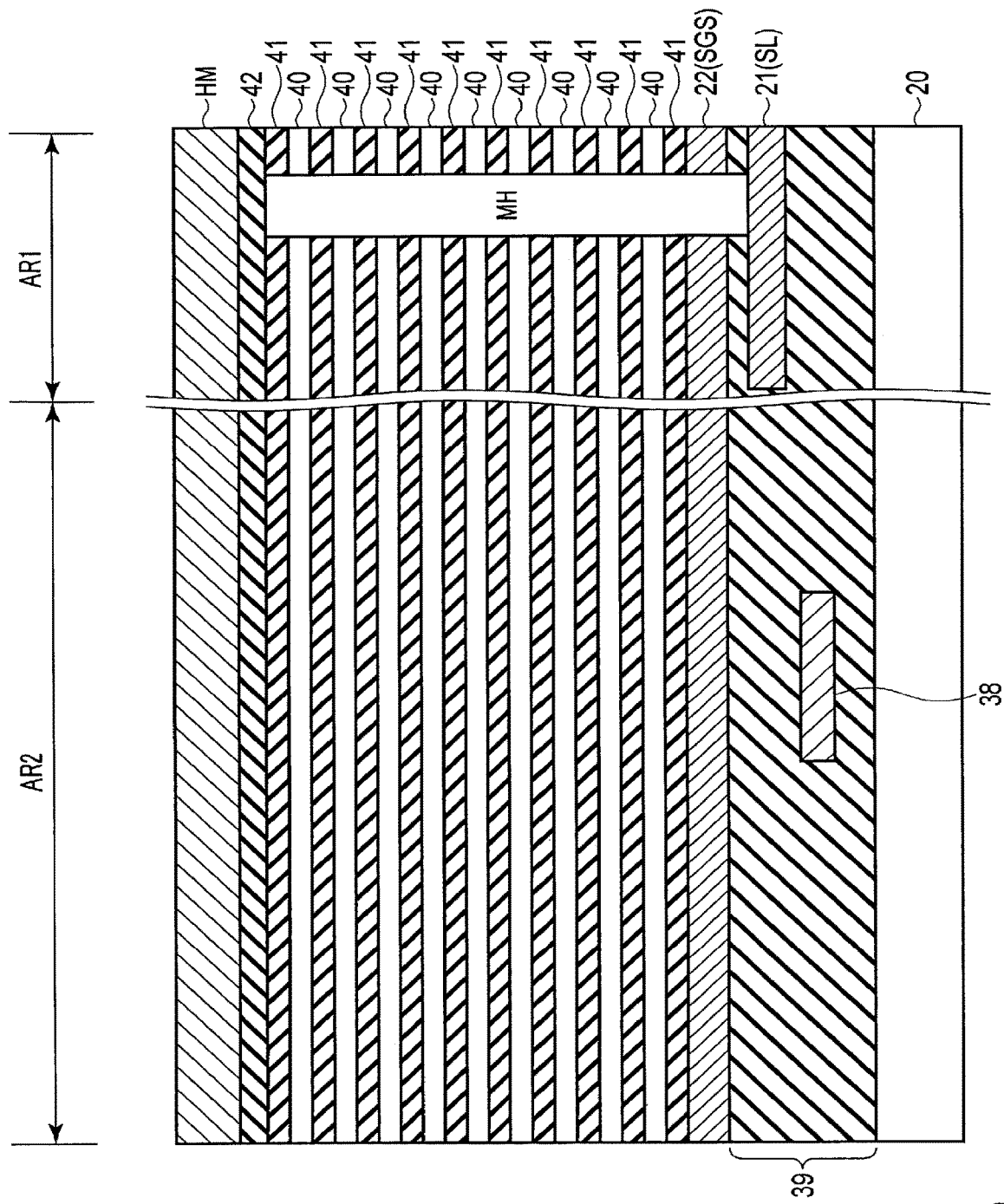

In step S12, as shown in FIG. 12, a passivation film 42 for the semiconductor pillar MH is formed, and a hard mask HM is formed on the passivation film 42. As the hard mask HM, for example, an inorganic material, such as tungsten, amorphous silicon, or sapphire, is used.

Figure 13:
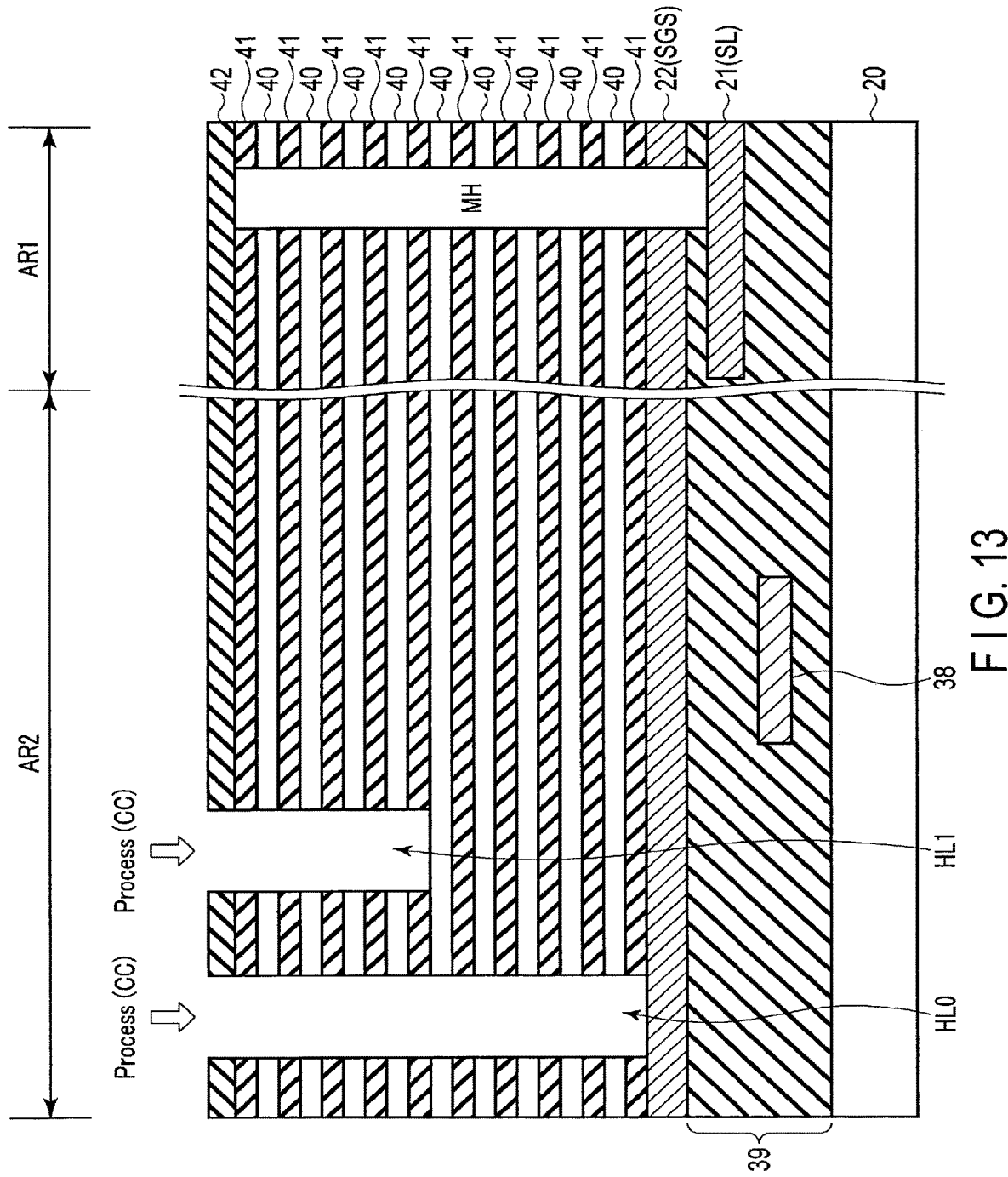

In step S13, as shown in FIG. 13, photolithography and anisotropic etching are performed a plurality of times, thereby forming contact holes corresponding to the contact plugs CC in the hookup area AR2. For example, a contact hole HL0 to form the contact plug CC corresponding to the selection gate line SGS is formed to open from the passivation film 42 to the conductor 22 corresponding to the selection gate line SGS, so that the conductor 22 is exposed. A contact hole HL1 to form the contact plug CC corresponding to the word line WL4 is formed to open from the passivation film 42 to the replacement member 40 corresponding to the word line WL4, so that the replacement member 40 is exposed. Similarly, the contact hole is formed to extend to the replacement member 40 corresponding to each wire. As anisotropic etching, for example, RIE (Reactive Ion Etching) is utilized. As a condition for processing a contact hole corresponding to the contact plug CC, for example, SiO/SiN selective step etching is utilized. A detailed method for processing a hole corresponding to each layer will be described later referring to a second embodiment.

In step S14, as shown in FIG. 14, spacers SP are formed on inner walls of the contact holes HL0 and HL1 corresponding to the contact plugs CC. Sacrificial members SS are buried in parts inside the spacers SP. The spacer SP is provided to avoid a short circuit between each contact plug CC and conductors other than a desired conductor. As the spacer, an insulating film that can be utilized as a replacement stopper in a replacement process described later is used. As the sacrificial member SS, for example, amorphous silicon aSi is utilized. The sacrificial member SS formed outside the contact holes corresponding to the contact plugs CC is removed by etchback.

Figure 15:
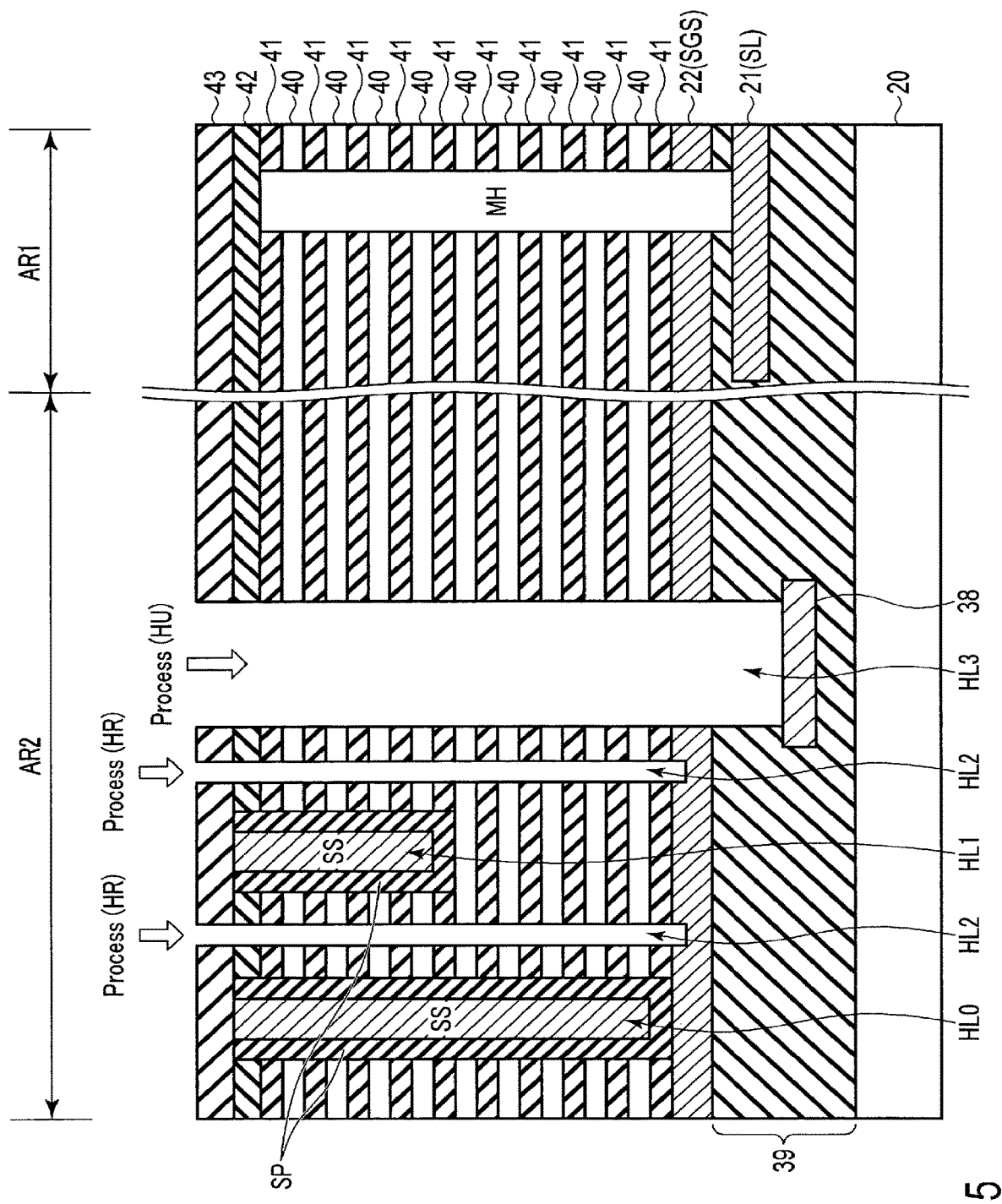

In step S15, as shown in FIG. 15, a passivation film 43 for the sacrificial members SS formed in the contact holes HL0 and HL1 corresponding to the contact plugs CC is formed, and holes HL2 corresponding to the support pillars HR and a contact hole HL3 corresponding to the contact plug HU are processed in the hookup area AR2. The holes HL2 corresponding to the support pillars HR are formed to open, for example, from the passivation film 43 to the conductor 22 corresponding to the selection gate line SGS. The contact hole HL3 corresponding to the contact plug HU is formed to open, for example, from the passivation film 43 to the conductor 38, so that the conductor 38 is exposed. As a condition for processing the holes corresponding to the support pillars HR and the contact plug HU, for example, SiO/SiN non-selective step etching is utilized.

In step S16, as shown in FIG. 16, a spacer SP is formed on an inner wall of the contact hole HL3 corresponding to the contact plug HU. To form the spacer SP, for example, CVD (Chemical Vapor Deposition) is used. At this time, the same material as that of the spacer SP is buried in the holes HL2 to form the support pillars HR. In this process, the spacer SP is also formed on a bottom surface of the contact hole HL3. The spacer SP formed on the bottom surface of the contact hole HL3 is removed by anisotropic etching, such as RIE. As a result, the conductor 38 at the bottom of the contact hole HL3 is exposed.

In step S17, as shown in FIG. 17, a conductor for forming the contact plug HU is formed. Specifically, processing of depositing a metal corresponding to the contact plug HU is executed. After the metal is deposited, an upper surface of the deposited structure is flattened by CMP (Chemical-Mechanical Polishing) or the like. Thus, the contact plug HU formed inside the contact hole HL3 is in contact with the conductor 38 at the bottom, while the metal deposited outside the contact hole HL3 is removed.

Figure 18:
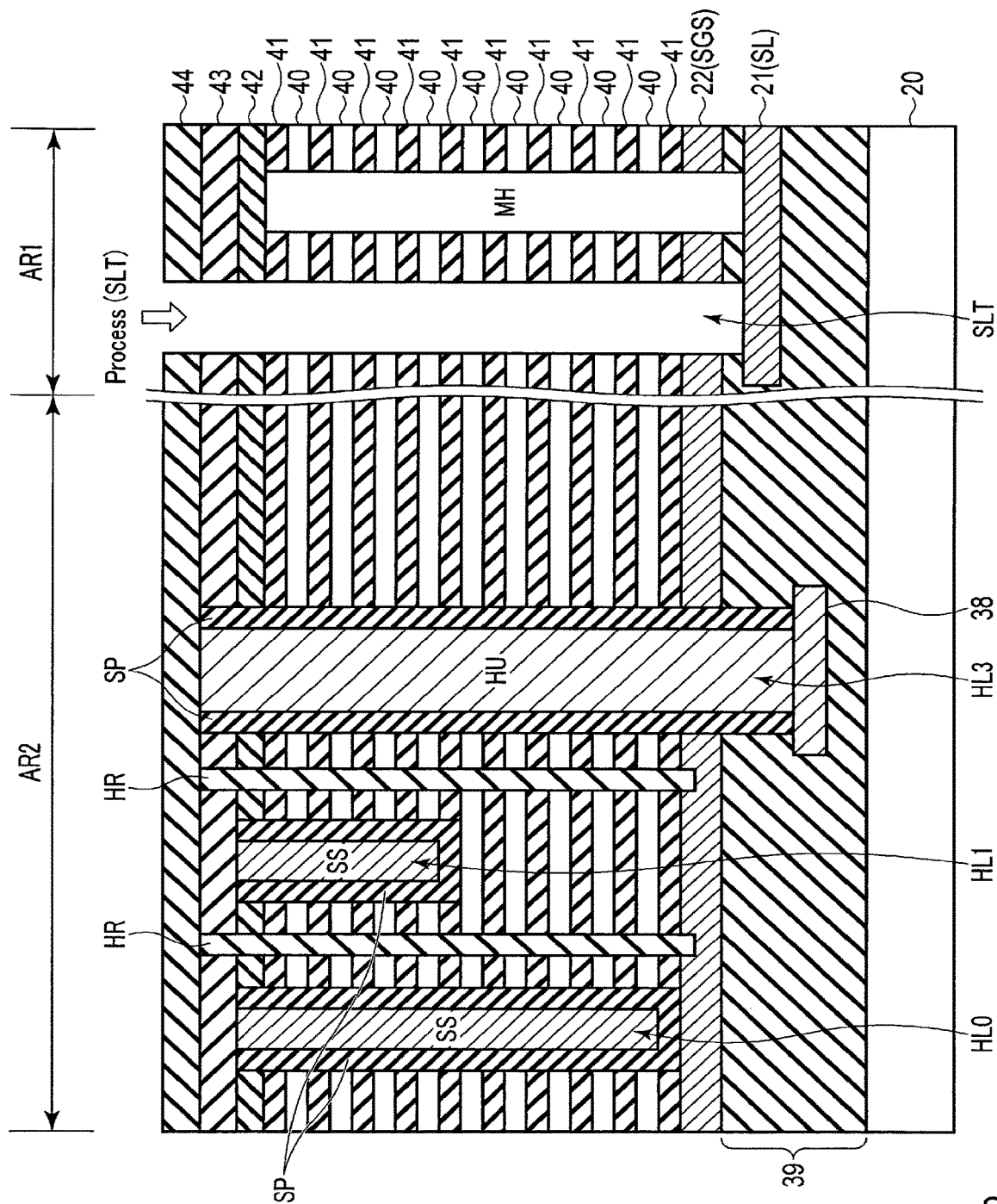

In step S18, as shown in FIG. 18, the passivation film 44 for the contact plug HU is formed, and a slit SLT is processed. The slit SLT is also formed in the hookup area AR2. In the drawings used in the following descriptions, the slit SLT formed in the hookup area AR2 is not shown.

Figure 19:
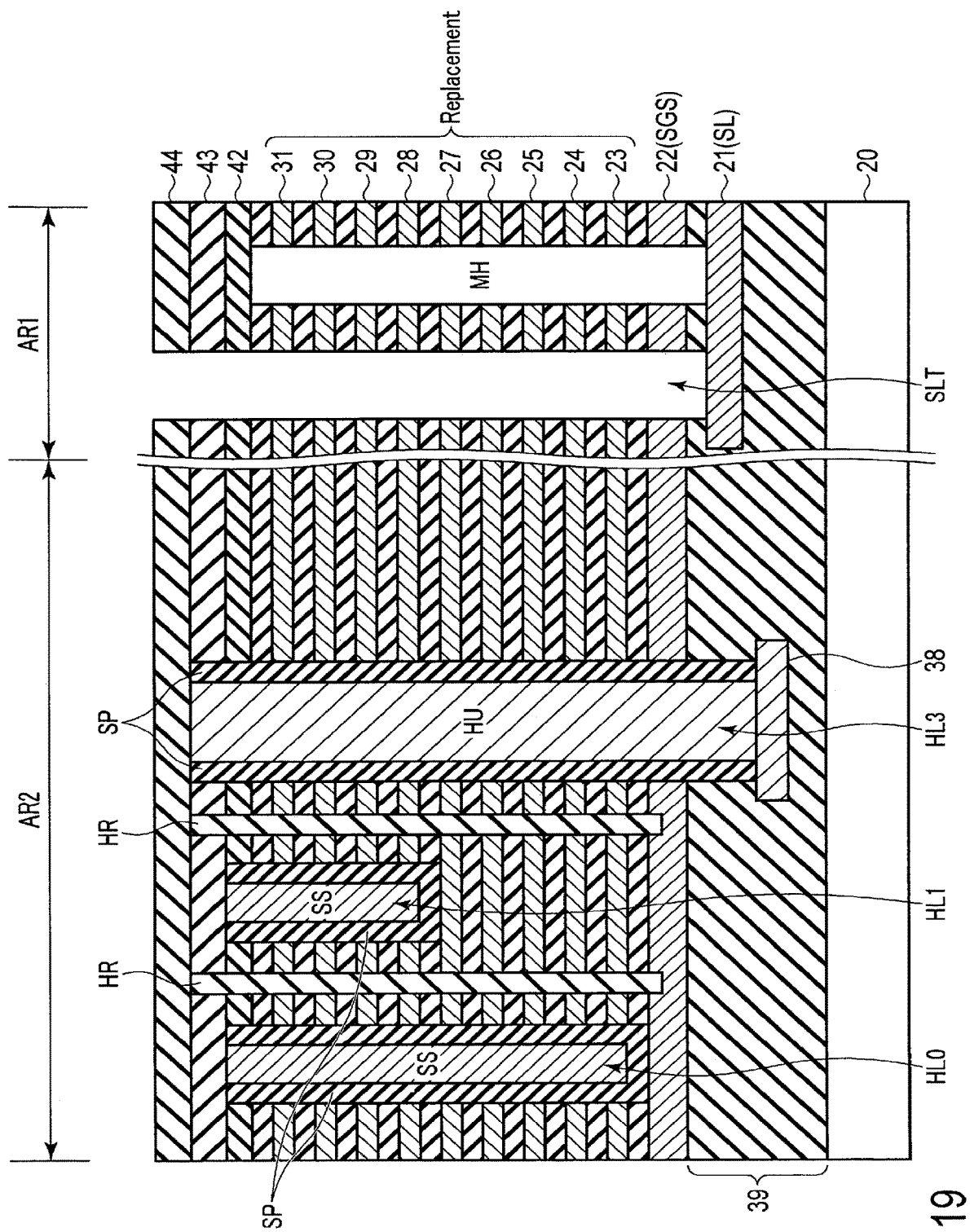

In step S19, as shown in FIG. 19, replacement processing for wires is executed. Specifically, first, wet etching is performed via the slit SLT, thereby removing the replacement members 40. The structure from which the replacement members 40 were removed is maintained as a three-dimensional structure by, for example, the semiconductor pillar MH, the contact plugs CC and HU, and the support pillars HR. Then, a metal material corresponding to the word lines WL and the selection gate line SGD is formed in the space where the replacement members 40 were formed. The metal material formed in the slit SLT and on the passivation film 44 is removed by etching.

Figure 20:
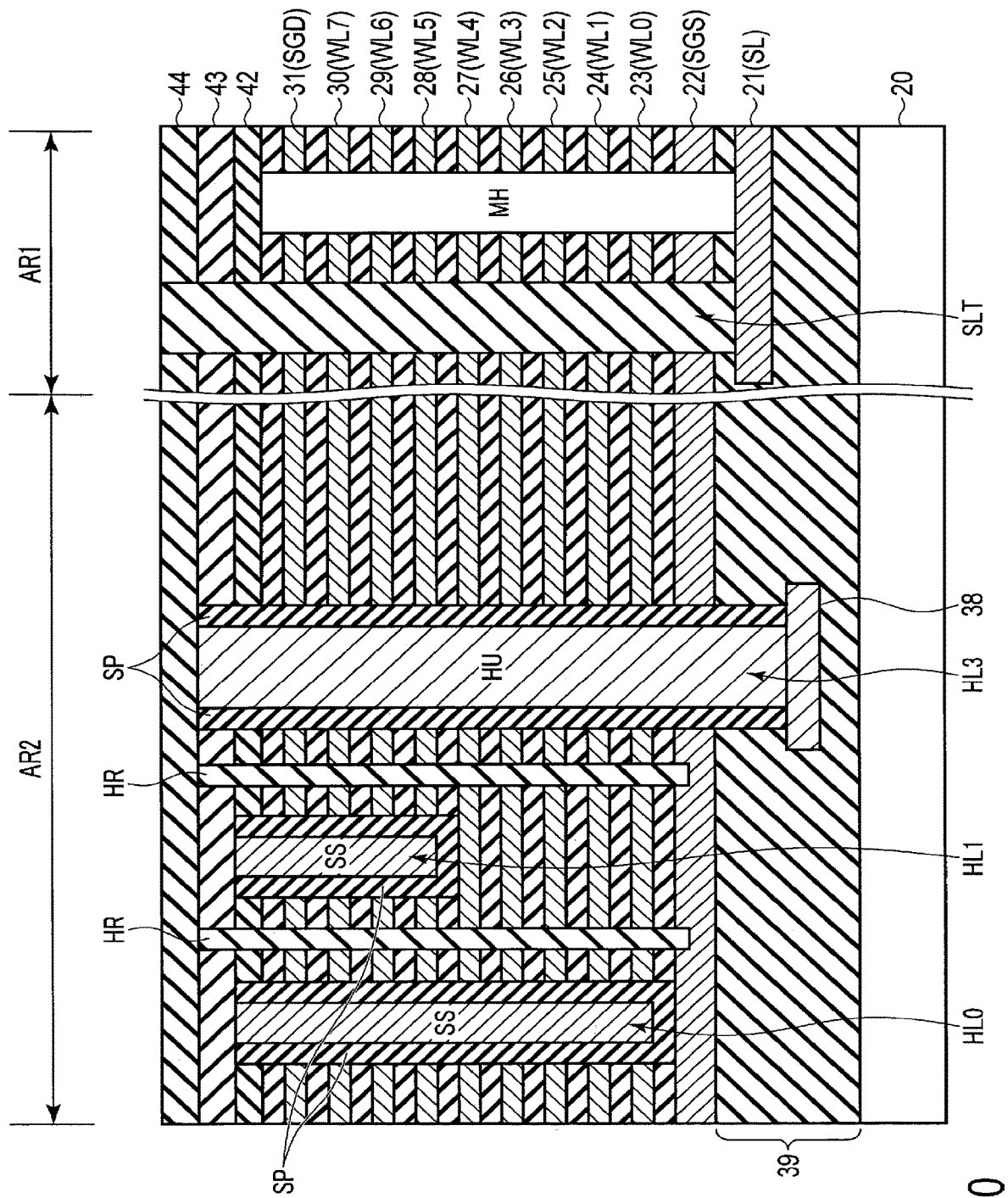

In step S20, as shown in FIG. 20, an insulating film is formed inside the slit SLT. Specifically, first, an insulating film is deposited in the slit SLT, and an upper surface of the deposited structure is flattened by CMP or the like.

Figure 21:
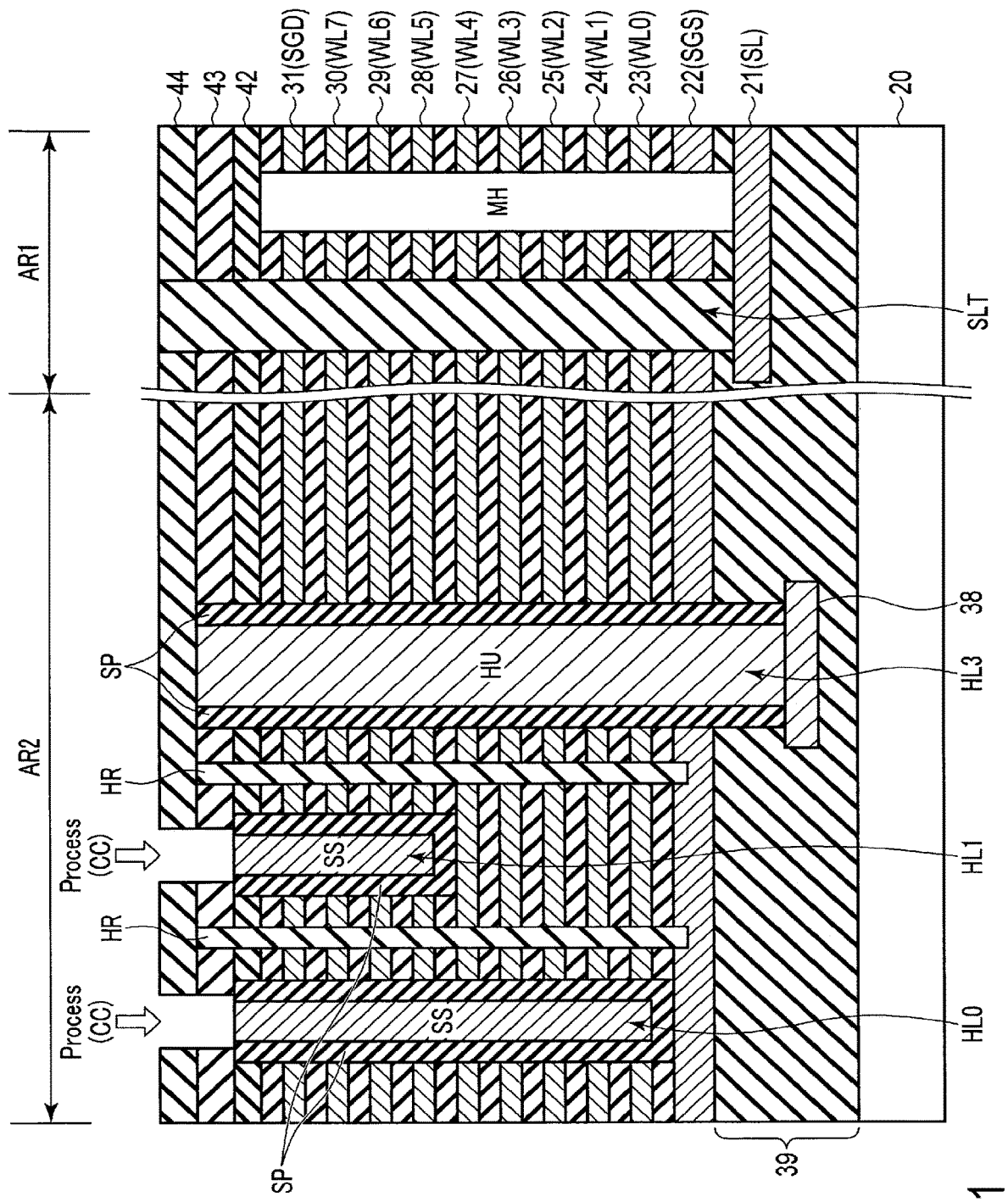

In step S21, as shown in FIG. 21, holes respectively corresponding to the contact plugs CC are formed. These holes are formed so that, for example, the sacrificial members SS formed in the contact holes HL0 and HL1 are exposed.

In step S22, as shown in FIG. 22, the sacrificial members SS formed in the contact holes HL0 and HL1 are removed by wet etching, and the spacers SP formed at the bottoms of the contact holes HL0 and HL1 are removed by anisotropic etching. As a result, the contact holes corresponding to the contact plugs CC for the respective wires are opened to the desired conductors. Specifically, for example, the contact hole HL0 corresponding to the selection gate line SGS opens to the conductor 22, and the contact hole HL1 corresponding to the word line WL4 opens to the conductor 27.

In step S23, as shown in FIG. 23, conductors for forming the contact plug CC are formed. Specifically, processing of depositing a metal corresponding to the contact plugs CC is executed. After the metal is deposited, an upper surface of the deposited structure is flattened by CMP or the like. Thus, the contact plugs CC formed inside the contact holes HL0 and HL1 are in contact with the corresponding conductors at the bottom, while the metal deposited outside the contact holes HL0 and HL1 is removed.

Through the manufacturing process described above, the wires of the semiconductor memory 1 and the contact plugs CC connected to the wires are formed. The manufacturing process described above is a mere example, and another process may be inserted between any two steps. For example, a step of forming a contact plug BLC corresponding to the semiconductor pillar MH may be inserted between step S20 and step S21.

[1-3] Advantage of First Embodiment

According to the semiconductor memory 1 of the first embodiment described above, the area of the semiconductor memory 1 can be reduced. Detailed advantages of the semiconductor memory 1 of the first embodiment will be explained.

In a three-dimensional NAND-type flash memory in general, conductors functioning as gate electrodes of memory cells and interlayer insulating films are alternately layered, and the memory capacity has been increased by increasing the number of layers. The conductor functioning as the gate electrode of a memory cell (hereinafter referred to as the gate electrode) is drawn stepwise, for example, in an end portion of a memory cell array (a hookup area), to be connected to a row decoder.

A contact plug CC corresponding to each gate electrode is connected to a terrace portion of the step, and the gate electrode is connected to the row decoder via the contact plug CC. In the structure as described above, if the number of layers of the conductors is increased to increase the capacity of the flash memory, the number of steps is also increased.

Furthermore, in the terrace portion of the step, the contact plug CC and the gate electrode formed near the terrace portion need to be separated at a certain distance or more to ensure a withstand voltage margin. Moreover, since misalignment that may occur in a photolithography step to form the contact plug CC must be taken into consideration, the terrace portion needs to have a large area accordingly. Therefore, the hookup area necessary to form the step inevitably has a large area.

In contrast, according to the semiconductor memory 1 of the first embodiment, the contact hole corresponding to each layer is formed in the hookup area AR2 without forming a stepwise gate electrode. Furthermore, in the semiconductor memory 1 of the first embodiment, the spacer SP is formed on the side wall of the contact hole, and metal that functions as the contact plug CC is buried in a part inside the spacer SP.

As a result, the semiconductor memory 1 of the first embodiment has a structure in which, the contact plug CC is electrically connected to the corresponding gate electrode and insulated from the other gate electrodes. Moreover, in the semiconductor memory 1 of the first embodiment, the withstand voltage between the contact plug CC and the gate electrodes, through which the contact plug CC passes, can be adjusted depending on the thickness of the spacer SP.

As a result, in the semiconductor memory 1 of the first embodiment, the layout in the hookup area AR2 can be designed on the basis of the diameter of the contact hole to form the contact plug CC and the spacer SP, without regard to misalignment that may occur in a photolithography step. Therefore, in the semiconductor memory 1 of the first embodiment, the area of the hookup area AR2 can be smaller than that in the case of forming a stepwise gate electrode. Accordingly, the chip area of the semiconductor memory 1 can be reduced.

Furthermore, the semiconductor memory 1 of the first embodiment includes the support pillars HR made of an insulator to maintain the three-dimensional structure in the hookup area AR2 in the manufacturing process. In the semiconductor memory 1 of the first embodiment, support pillars HR are allowed to overlap the spacer SP formed around the contact plug CC. More specifically, a support pillar HR may overlap the spacer SP so that the distance between the outer circumference of the contact plug CC and the support pillar HR is smaller than the thickness of the spacer SP.

FIG. 24 shows an example of a detailed planar layout in the hookup area AR2 of the semiconductor memory 1 according to the first embodiment, in a case where spacers SP and support pillars HR are allowed to overlap. FIG. 24 also illustrates a closest support pillar HR that is the closest to the contact plug CC, and a distance DIS between the contact plug CC and the closest support pillar HR.

As shown in FIG. 24, if spacers SP and support pillars HR are allowed to overlap, some of the support pillars HR overlap the spacers SP, and the others do not. The overlapping states of the support pillars HR that overlap the spacers SP are different depending on the layout. For example, the distance DIS between the outer circumference of the contact plug CC and the outer circumference of the closest support pillar HR is designed to be 0 nm through 200 nm.

FIG. 25 shows an example of a cross-section structure of the semiconductor memory 1 in a case where a spacer SP and a support pillar HR overlap. In the case where the spacer SP and the support pillar HR overlap, as shown in FIG. 25, the depth of the support pillar HR is greater than that of the contact hole in which, for example, the contact plug CC is formed. In other words, the distance from the upper surface to the lower surface of the support pillar HR is longer than the distance from the upper surface to the lower surface of the contact plug CC and the spacer SP.

For example, if the contact plug CC is connected to the conductor 27 corresponding to the word line WL4 as shown in FIG. 25, the support pillar HR overlapping the spacer SP of the contact plug CC extends to a layer lower than the conductor 27. Thus, the insulating pillar corresponding to the support pillar HR passes through the conductors 22 through 27 located below the contact hole corresponding to the contact plug CC.

As described above, in the semiconductor memory 1 of the first embodiment, support pillars HR and spacers SP of contact plugs CC are allowed to overlap. With the configuration described above, the diameter of the contact hole for a contact plug CC and the thickness of a spacer SP can be increased without regard to where support pillars HR should be arranged.

For example, in the process of manufacturing the semiconductor memory 1 described above, the contact hole for the contact plug CC is processed by utilizing SiN/SiO step etching in step S13. In the step etching, the number of layers in which processing progresses is monitored by, for example, EPD (End Point Detection). In the step etching, when the occupancy of the sum of open areas of holes in one chip of the semiconductor memory 1 is less than, for example, 0.5%, the accuracy of the step etching is liable to be lowered.

In the semiconductor memory 1 of the first embodiment, as described above, since the diameter of the contact hole corresponding to the contact plug CC can be large, the occupancy of the holes can be easily controlled to be 0.5% or more. Therefore, in the semiconductor memory 1 of the first embodiment, the accuracy of EPD in the manufacturing process can be improved, thereby suppressing occurrence of defects resulting from step etching. Consequently, the semiconductor memory according to the first embodiment can improve the yield in the manufacturing.

[2] Second Embodiment

A semiconductor memory 1 of the second embodiment is the same as the semiconductor memory 1 of the first embodiment in configuration. The second embodiment relates to details of the manufacturing method for forming a contact hole corresponding to each wire in step S13 of FIG. 8 described in connection with the first embodiment.

[2-1] Method for Processing Contact Hole

FIG. 26 through FIG. 29 show an example of cross-section structures in the respective steps in a case of collectively forming contact holes corresponding to different layers. An example of a method for processing contact holes respectively corresponding to the word lines WL0 through WL7 will be described below.

Figure 26:
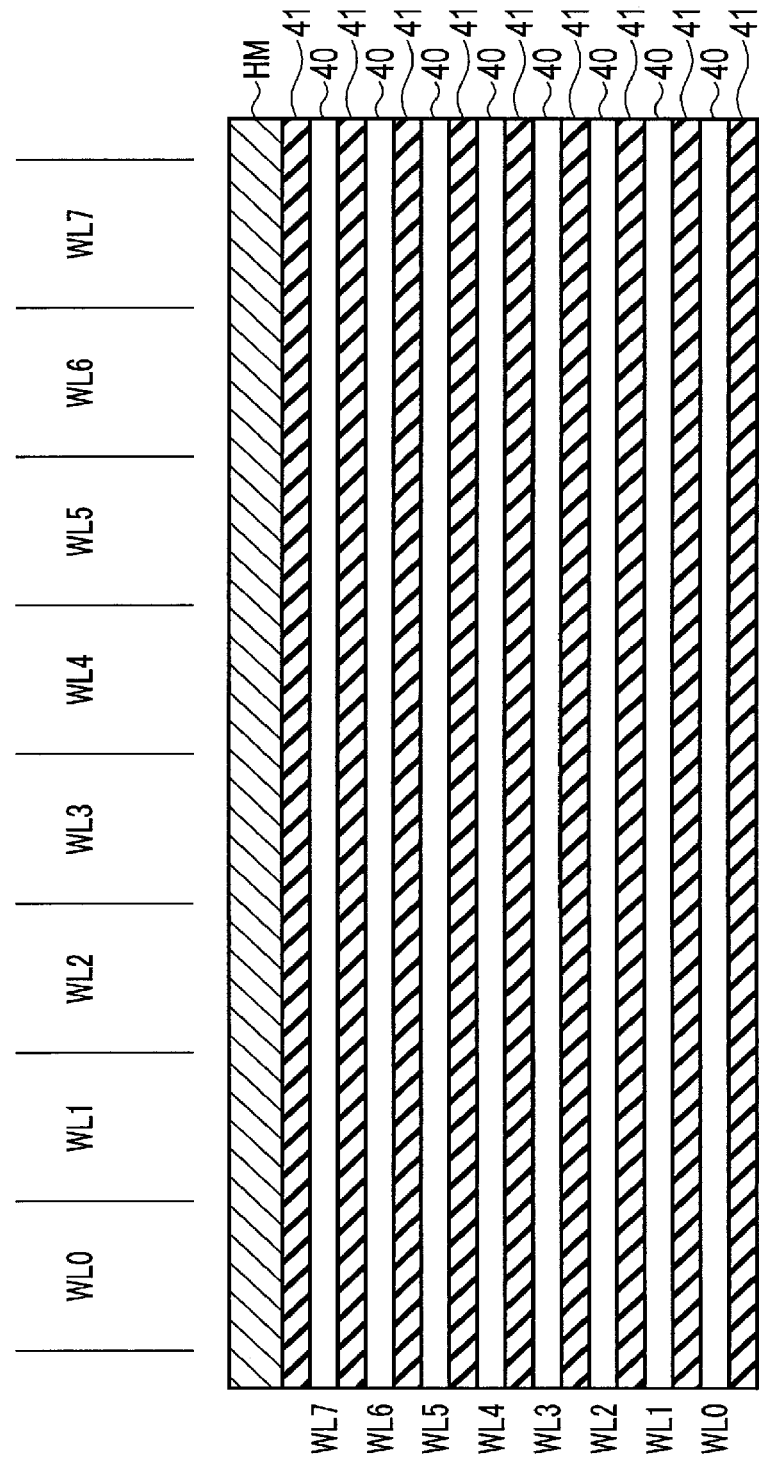
FIG. 26, FIG. 27, FIG. 28, FIG. 29, and FIG. 30 are diagrams showing an example of a method for processing contact holes in a second embodiment.

FIG. 26 shows a state after completion of step S12 for forming a hard mask HM in the process of manufacturing the semiconductor memory 1 of the first embodiment described with reference to FIG. 8. Specifically, interlayer insulating films 41 and replacement members 40 are alternately layered, and the hard mask HM is formed on the uppermost interlayer insulating film 41. In FIG. 26 through FIG. 29, a configuration below the lowermost interlayer insulating film 41 and a configuration between the uppermost interlayer insulating film 41 and the hard mask HM are not shown. FIG. 26 shows regions where contact holes respectively corresponding to the word lines WL0 through WL7 are formed. From the state shown in FIG. 26, the contact holes respectively corresponding to the word lines WL0 through WL7 are processed.

Figure 27:
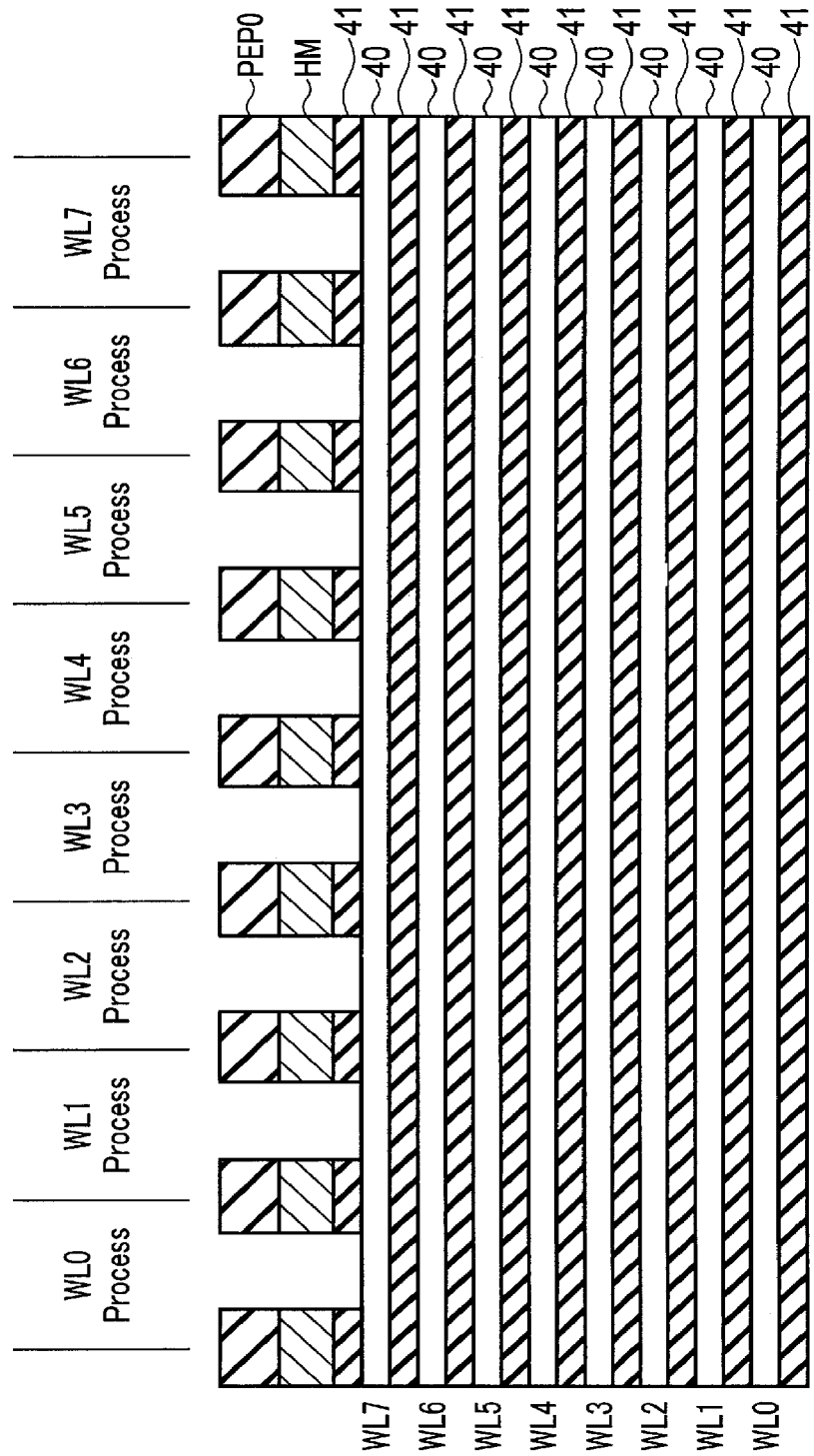

First, a photoresist PEP0 is patterned, and the hard mask HM is processed by anisotropic etching, as shown in FIG. 27. Specifically, the photoresist PEP0 is formed on the hard mask HM. Then, a pattern of the contact holes respectively corresponding to the word lines WL0 through WL7 is transferred to the photoresist PEP0 by photolithography, and the pattern opens in the photoresist PEP0.

Anisotropic etching is performed using the patterned photoresist PEP0 as a mask; as a result, the hard mask HM is opened to form the shapes of the contact holes respectively corresponding to the word lines WL0 through WL7. Then, using the hard mask HM as a mask, the uppermost interlayer insulating film 41 is etched by anisotropic etching, and the upper surface of the uppermost replacement member 40 is exposed in accordance with the shape of the hard mask HM. The photoresist PEP0 used as the mask is removed after the anisotropic etching.

Figure 28:
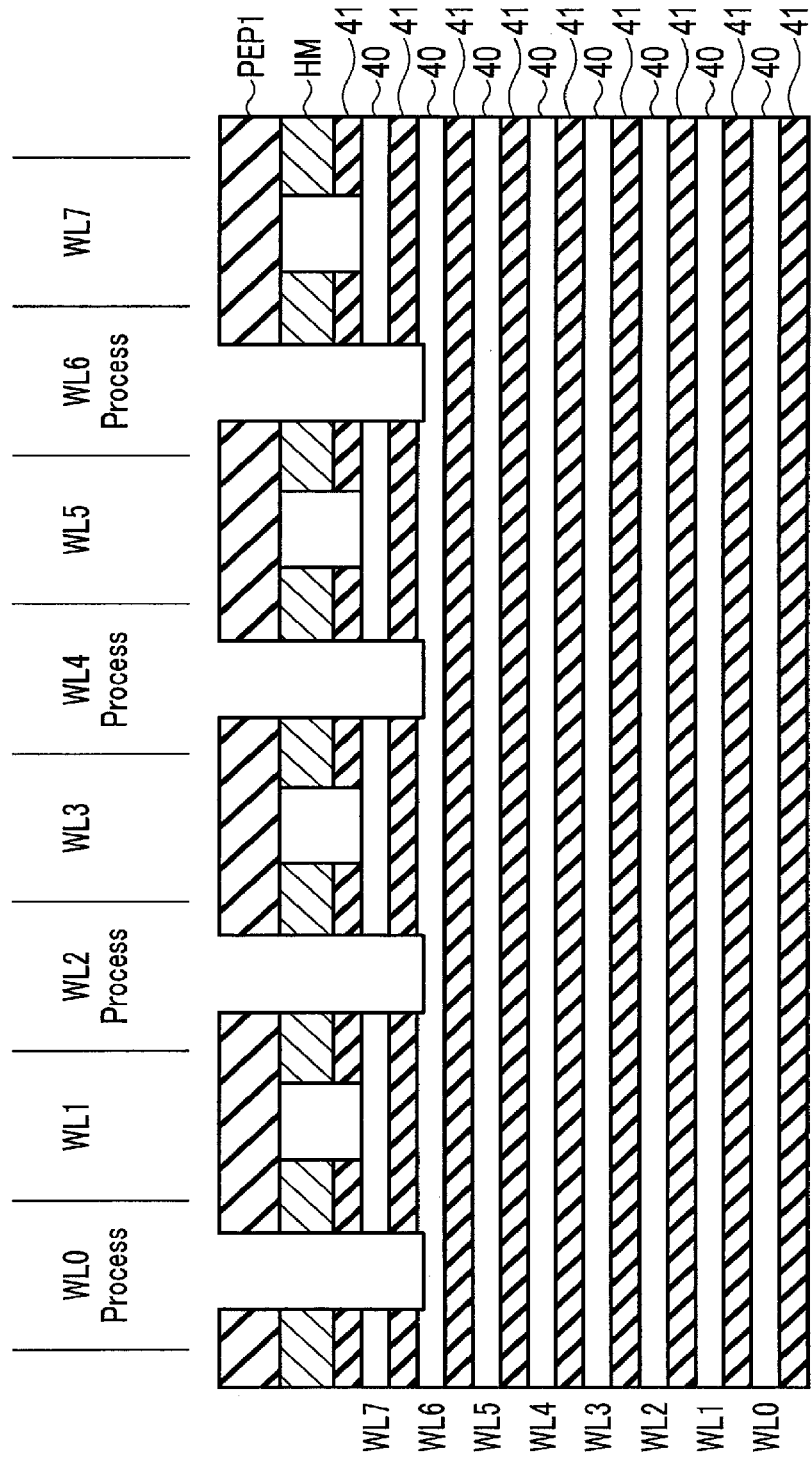

Next, a photoresist PEP1 is patterned, and a pair of the replacement member 40 and the interlayer insulating film 41 is processed by anisotropic etching, as shown in FIG. 28. Specifically, the photoresist PEP1 is formed to cover the pattern formed in the hard mask HM. Then, a pattern including the contact holes respectively corresponding to the word lines WL0, WL2, WL4, and WL6 is transferred to the photoresist PEP1 by photolithography, and the pattern opens in the photoresist PEP1. In the following explanations, the inner diameter of the bottom surface of an opening in the photoresist PEP may be the same as or larger than that of the contact hole formed in the hard mask HM.

Then, when anisotropic etching is performed using the patterned photoresist PEP1 as a mask, the pair of the replacement member 40 and the interlayer insulating film 41 is etched through the bottom surfaces of the openings in the regions respectively corresponding to the contact holes of the word lines WL0, WL2, WL4, and WL6. On the other hand, since the regions respectively corresponding to the contact holes of the word lines WL1, WL3, WL5, and WL7 are covered with the photoresist PEP1, they are not etched. The photoresist PEP1 used as the mask is removed after the anisotropic etching.

Figure 29:
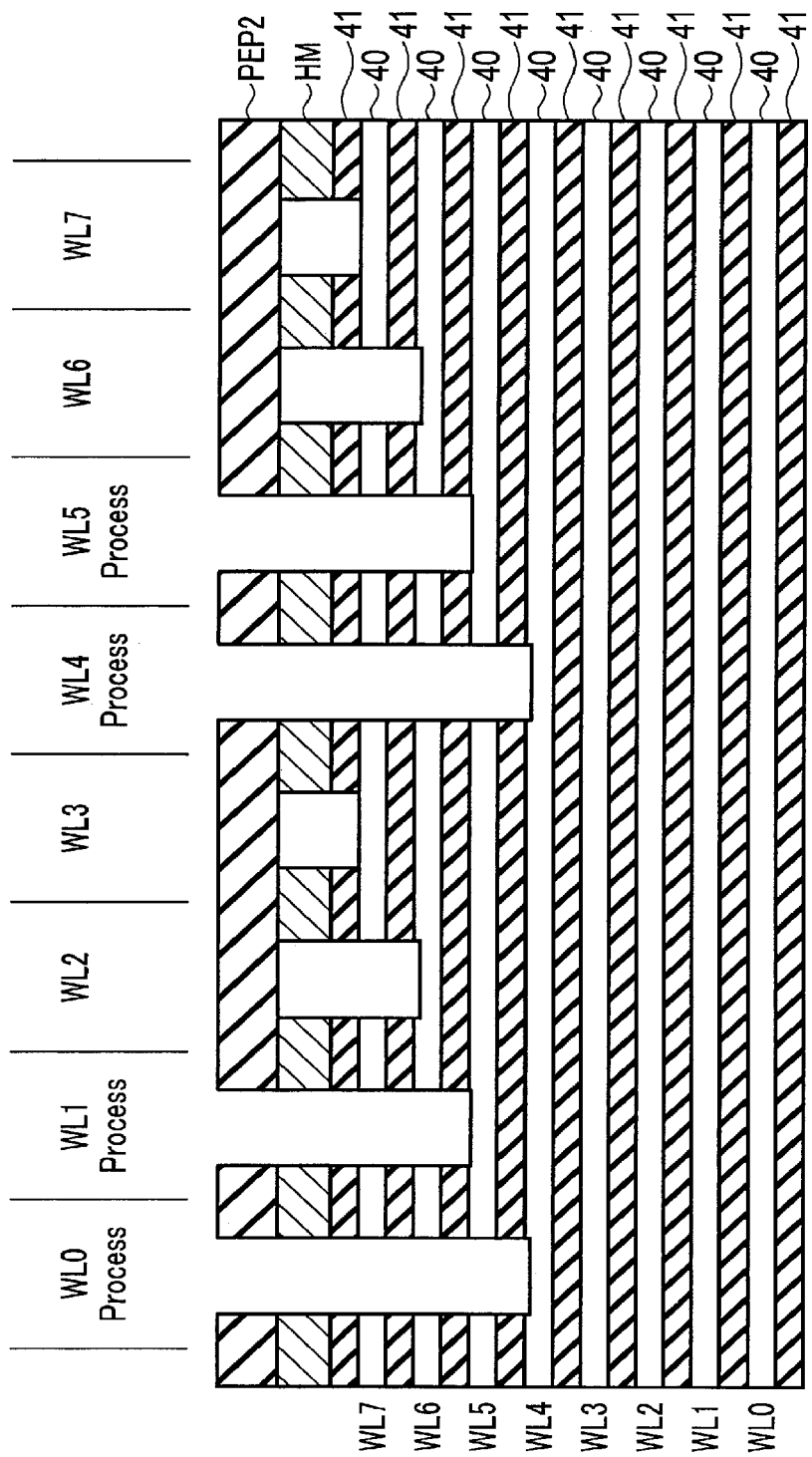

Next, a photoresist PEP2 is patterned, and two pairs of the replacement member 40 and the interlayer insulating film 41 are processed by anisotropic etching, as shown in FIG. 29. Specifically, the photoresist PEP2 is formed on the hard mask HM. Then, a pattern including the contact holes respectively corresponding to the word lines WL0, WL1, WL4, and WL5 is transferred to the photoresist PEP2 by photolithography, and the pattern opens in the photoresist PEP2.

When anisotropic etching is performed using the patterned photoresist PEP2 as a mask, the two pairs of the replacement member 40 and the interlayer insulating film 41 are etched through the openings in the regions respectively corresponding to the contact holes of the word lines WL0, WL1, WL4, and WL5. On the other hand, since the regions respectively corresponding to the contact holes of the word lines WL2, WL3, WL6, and WL7 are covered with the photoresist PEP2, they are not etched. The photoresist PEP2 used as the mask is removed after the anisotropic etching.

Figure 30:
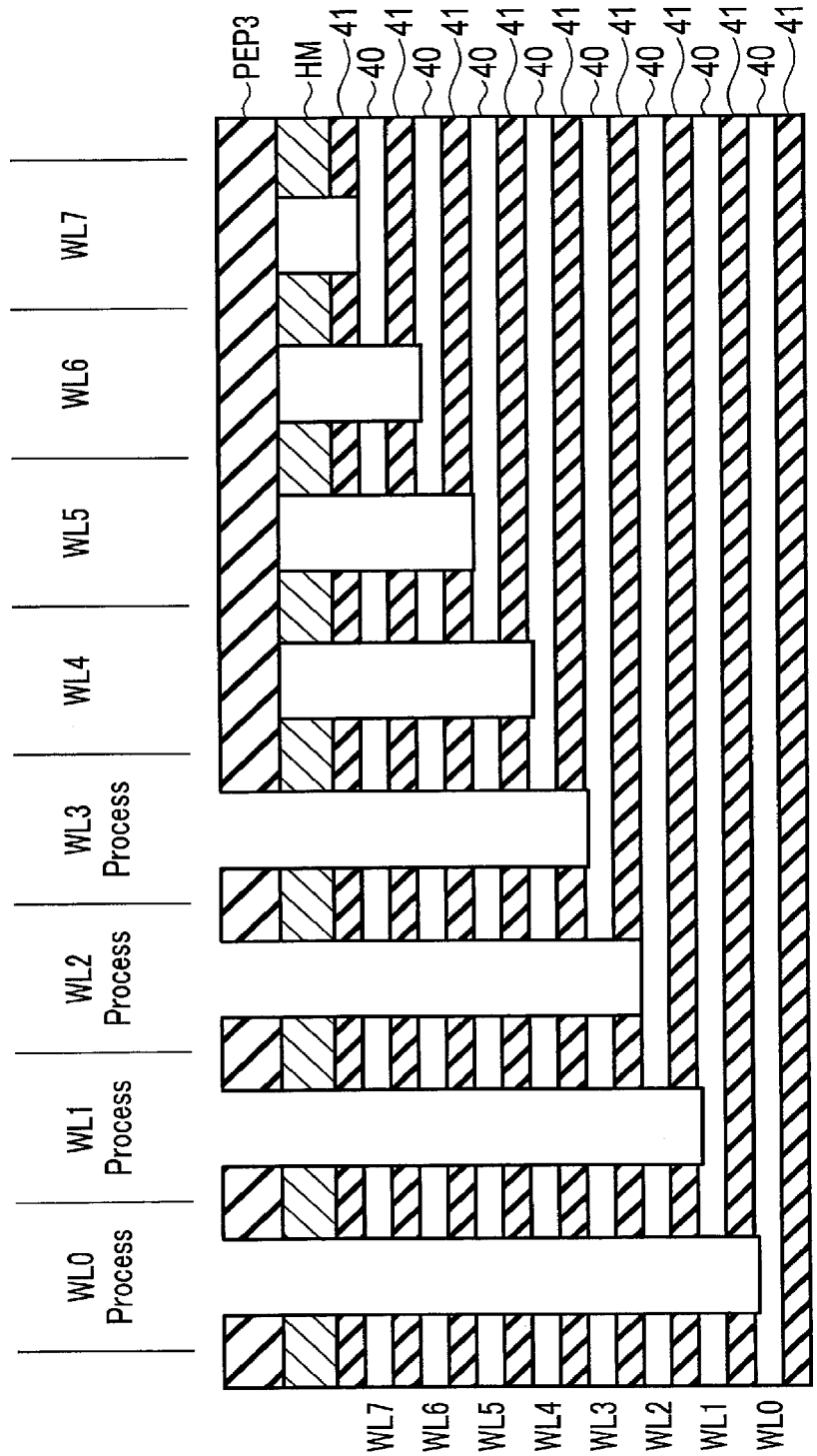

Next, a photoresist PEP3 is patterned, and four pairs of the replacement member 40 and the interlayer insulating film 41 are processed by anisotropic etching, as shown in FIG. 30. Specifically, the photoresist PEP3 is formed on the hard mask HM. Then, a pattern of the contact holes respectively corresponding to the word lines WL0, WL1, WL2, and WL3 is transferred to the photoresist PEP3 by photolithography, and the pattern opens in the photoresist PEP3.

When anisotropic etching is performed using the patterned photoresist PEP3 as a mask, the four pairs of the replacement member 40 and the interlayer insulating film 41 are etched through the openings in the regions respectively corresponding to the word lines WL0, WL1, WL2, and WL3. On the other hand, since the regions respectively corresponding to the contact holes of the word lines WL4, WL5, WL6, and WL7 are covered with the photoresist PEP3, they are not etched. The photoresist PEP3 used as the mask is removed after the anisotropic etching.

As described above, according to the method for processing the contact holes in the second embodiment, processing including the photolithography and the anisotropic etching is performed three times, for example, after processing the hard mask HM. As a result, the contact holes corresponding to the eight different layers are formed.

FIG. 31 shows an example of a method for processing contact holes corresponding to contact layers more than those described above. FIG. 31 shows the number of layers to be etched, the number of times of processing, and the contact layer number. The symbol "○" indicates a place where anisotropic etching is performed in the processing. A contact layer corresponds to a layer where a contact hole is opened by etching after processing the hard mask HM. The contact layers are sequentially numbered from the uppermost layer.

For example, as shown in FIG. 31, the hard mask HM and the contact holes corresponding to the uppermost contact layers are opened by first processing. A pair ($2^0$) of the replacement member 40 and the interlayer insulating film 41 is etched by second processing, so that contact holes respectively corresponding to two different layers can be formed. Two pairs ($2^1$) of the replacement member 40 and the interlayer insulating film 41 are etched by third processing, so that contact holes respectively corresponding to four different layers can be formed. Four pairs ($2^2$) of the replacement member 40 and the interlayer insulating film 41 are etched by fourth processing, so that contact holes respectively corresponding to eight different layers can be formed. Eight pairs ($2^3$) of the replacement member 40 and the interlayer insulating film 41 are etched by fifth processing, so that contact holes respectively corresponding to 16 different layers can be formed. As described above, $2^{k-1}$ pairs of the replacement member 40 and the interlayer insulating film 41 are etched by k-th processing (k is an integer of 1 or more) after the hard mask HM and the uppermost interlayer insulating film 41 are opened by the first processing, so that contact holes respectively corresponding to $2^k$ layers can be formed.

[2-2] Advantage of Second Embodiment

As described above, according to the method for manufacturing the semiconductor memory 1 of the second embodiment, processing of contact holes corresponding to different layers can be simultaneously progressed as appropriate by changing the combination of contact holes in which etching is performed, for example, as shown in FIG. 31.

As a result, when a three-dimensional NAND-type flash memory having word lines of $2^k$ layers is manufactured, according to the method for manufacturing the semiconductor memory 1 of the second embodiment, a set of photolithography and etching is performed at least k+1 times, so that contact holes respectively corresponding to the word lines of $2^k$ layers can be formed.

Thus, according to the method for manufacturing the semiconductor memory 1 of the second embodiment, the number of a series of processing of applying photoresist, forming a pattern by photolithography, and etching can be reduced. Accordingly, the manufacturing cost for the semiconductor memory 1 can be reduced.

Furthermore, according to the method for manufacturing the semiconductor memory 1 of the second embodiment, places to be processed are opened as appropriate by using a photoresist, and contact holes corresponding to different layers can be processed simultaneously using the same hard mask HM as a guide.

As a result, according to the method for manufacturing the semiconductor memory 1 of the second embodiment, since the shape of the mask used in processing contact holes does not change, an influence caused by misalignment due to photolithography and variation in size can be suppressed.

Thus, according to the method for manufacturing the semiconductor memory 1 of the second embodiment, the opening margins of contact holes are increased, so that defective formation of the contact plugs CC can be suppressed. Consequently, the semiconductor memory 1 according to the second embodiment can improve the yield in the manufacturing of the semiconductor memory 1.

[3] Third Embodiment

According to the third embodiment, in the process of manufacturing the semiconductor memory 1 of the first embodiment, the replacement member 40 of any of the wire layers is made of a material different from those of the other layers, and used as an etching stopper. The following is a description about the semiconductor memory 1 according to the third embodiment, specifically a difference from the semiconductor memory 1 of the first and second embodiments.

[3-1] Structure of Semiconductor Memory 1

Figure 32:
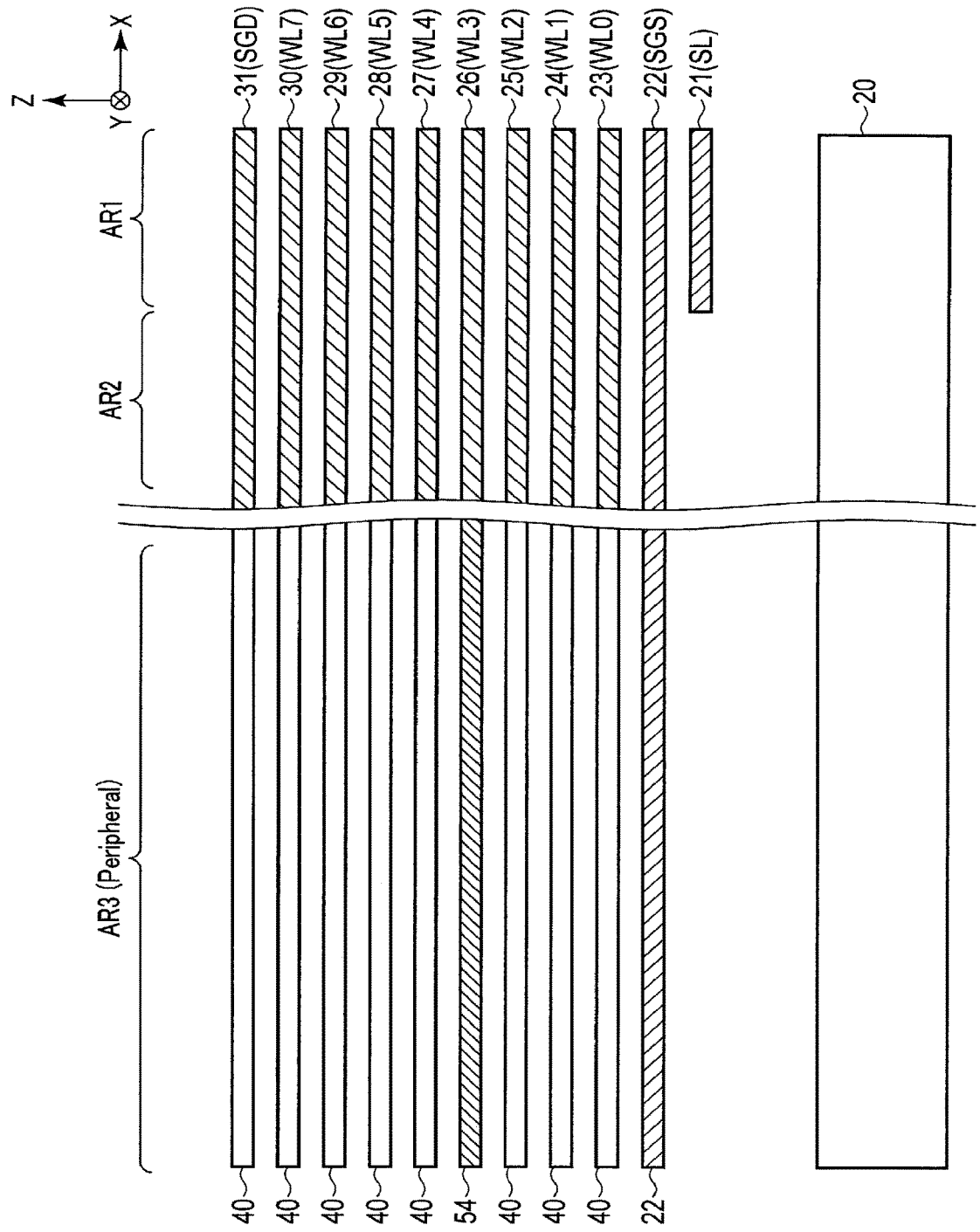
FIG. 32 is a diagram showing an example of a cross-section structure in a cell area, a wire hookup area, and a peripheral circuit area of a semiconductor memory according to a third embodiment.

FIG. 32 shows an example of a cross-section structure in a cell area AR1, a hookup area AR2, and a peripheral area AR3 of the semiconductor memory 1 according to the third embodiment. In FIG. 32, detailed structures in the cell area AR1 and the hookup area AR2 are not shown.

The peripheral area AR3 is an area in which the sequencer 13 and the like in the first embodiment, described with reference to FIG. 1, are formed. In the peripheral area AR3, for example, a plurality of replacement members 40 and 54 are provided for the wiring layers respectively corresponding to conductors 22 to 31. Specifically, in the peripheral area AR3, the replacement member 54 is provided in the wiring layer, for example, where the conductor 26 corresponding to the word line WL3 is provided.

The replacement member 54 is utilized as an etching stopper in the process of manufacturing the semiconductor memory 1. For example, a metal oxide film having a high dielectric constant, such as alumina, is used as the replacement member 54. The replacement member 54 is preferably a film of 3 nm or thinner that can be removed simultaneously with the removal of the replacement member (for example, silicon nitride SiN) during the replacement process in step S19 described with reference to FIG. 8 in connection with the first embodiment, with minimal influence on an opening of a memory hole for forming a semiconductor pillar MH in the cell area AR1 and on processing of a contact hole in the hookup area AR2.

As described above, the semiconductor memory 1 of the third embodiment includes a multi-layer structure (a second multi-layer section) including the replacement members 40 and interlayer insulating films layered alternately, and a replacement member 54 different from both the replacement members 40 and the interlayer insulating films in the peripheral area AR3. The layer in which the replacement member 54 is provided in the peripheral area AR3 is the same as the layer in which any one of the conductors 23 through 31 is formed in the cell area AR1 and the hookup area AR2.

The peripheral area AR3 may include an opening to be connected to a circuit formed on, for example, the semiconductor substrate 20. In other words, the metal oxide film used as the replacement member 54 remains in the area other than the opening in the peripheral area AR3. The other configurations of the semiconductor memory 1 according to the third embodiment are the same as those of the semiconductor memory 1 according to the first embodiment; therefore, the descriptions thereof are omitted.

[3-2] Method for Manufacturing Semiconductor Memory 1

The flowchart shown in FIG. 8 for the first embodiment is also applied to the method for manufacturing the semiconductor memory 1 of the third embodiment. FIG. 33 through FIG. 36 show an example of cross-section structures in the respective steps of manufacturing the semiconductor memory 1 of the third embodiment.

Figure 33:
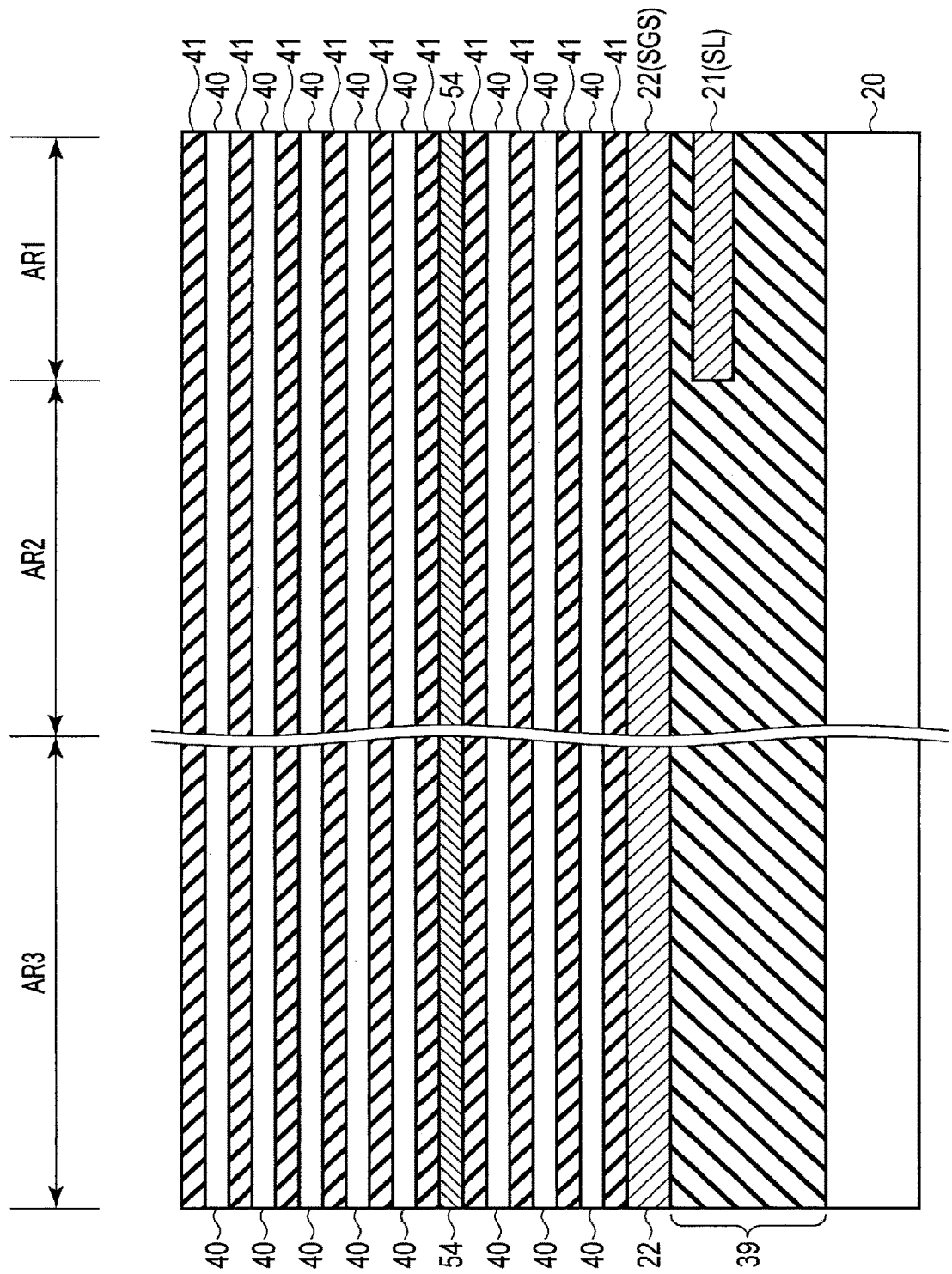

In step S10 of the third embodiment, replacement members 40 and interlayer insulating films 41 are alternately layered on an insulator 39 in the same manner as in the first embodiment, and a part of the replacement member 40 is substituted by the replacement member 54. In other words, the step of alternately layering the replacement members and the interlayer insulating films to form word lines WL, etc. includes layering the replacement members 40 (for example, silicon nitride) as the replacement members and layering the replacement member 54 (for example, alumina) as the replacement member. For example, as shown in FIG. 33, the fourth replacement member 40 from the bottom is substituted by the replacement member 54.

Figure 34:
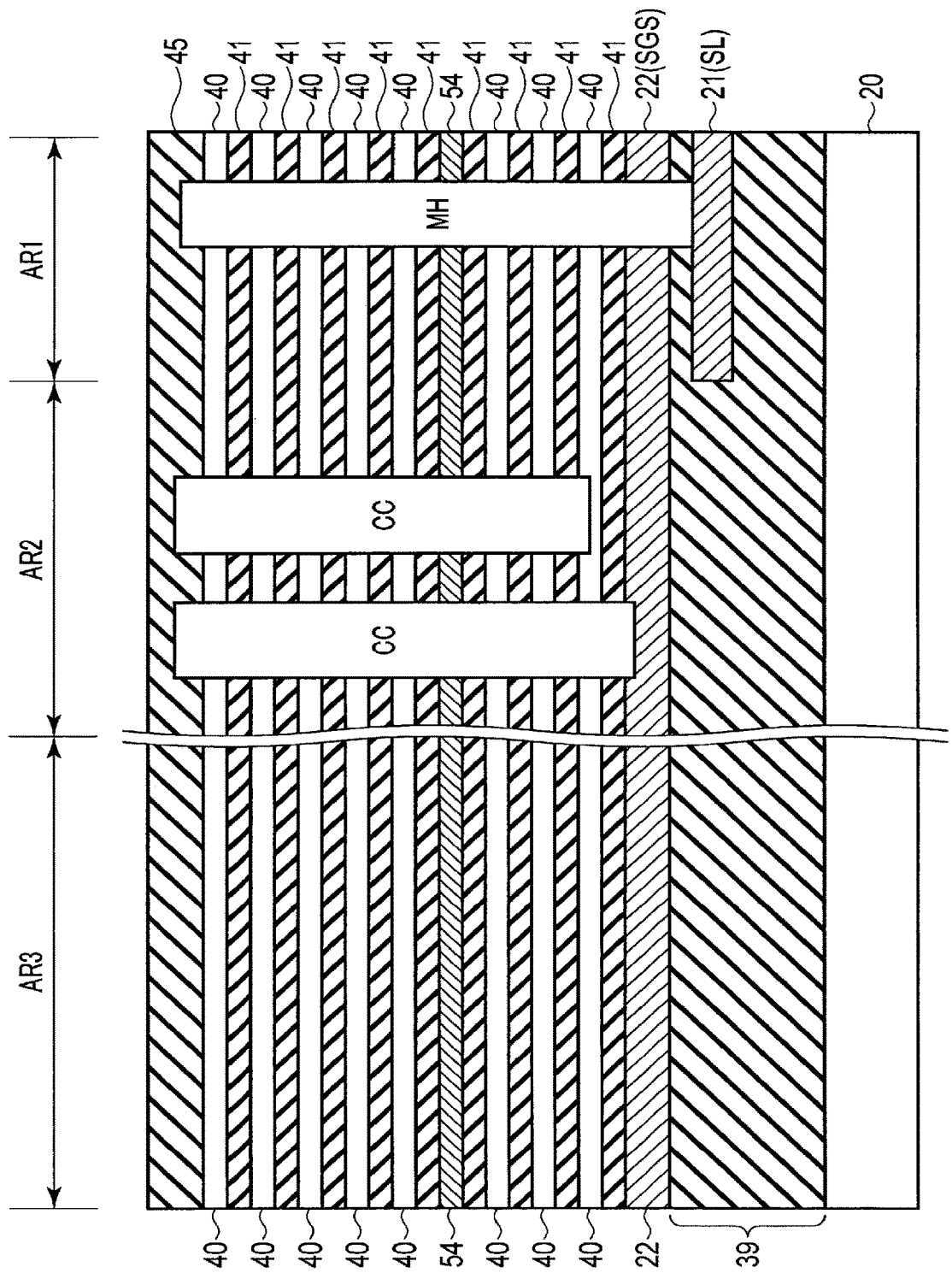

Next, steps S11 to S17 are carried out in the same manner as in the first embodiment. As a result, contact plugs CC are formed in, for example, the hookup area AR2 as shown in FIG. 34. A passivation film 45 shown in FIG. 34 is an insulating film formed after the contact plugs CC are formed, to cover the upper surfaces of the contact plugs CC. The passivation film 45 corresponds to, for example, the passivation films 42 and 43, shown in FIG. 15, etc. of the first embodiment described above. When the contact holes corresponding to the contact plugs CC are processed, the replacement member 54 is utilized as an etching stopper as appropriate.

Next, step S18 is carried out in the same manner as in the first embodiment. As a result, a slit SLT is formed in, for example, the cell area AR1 as shown in FIG. 35.

Figure 36:
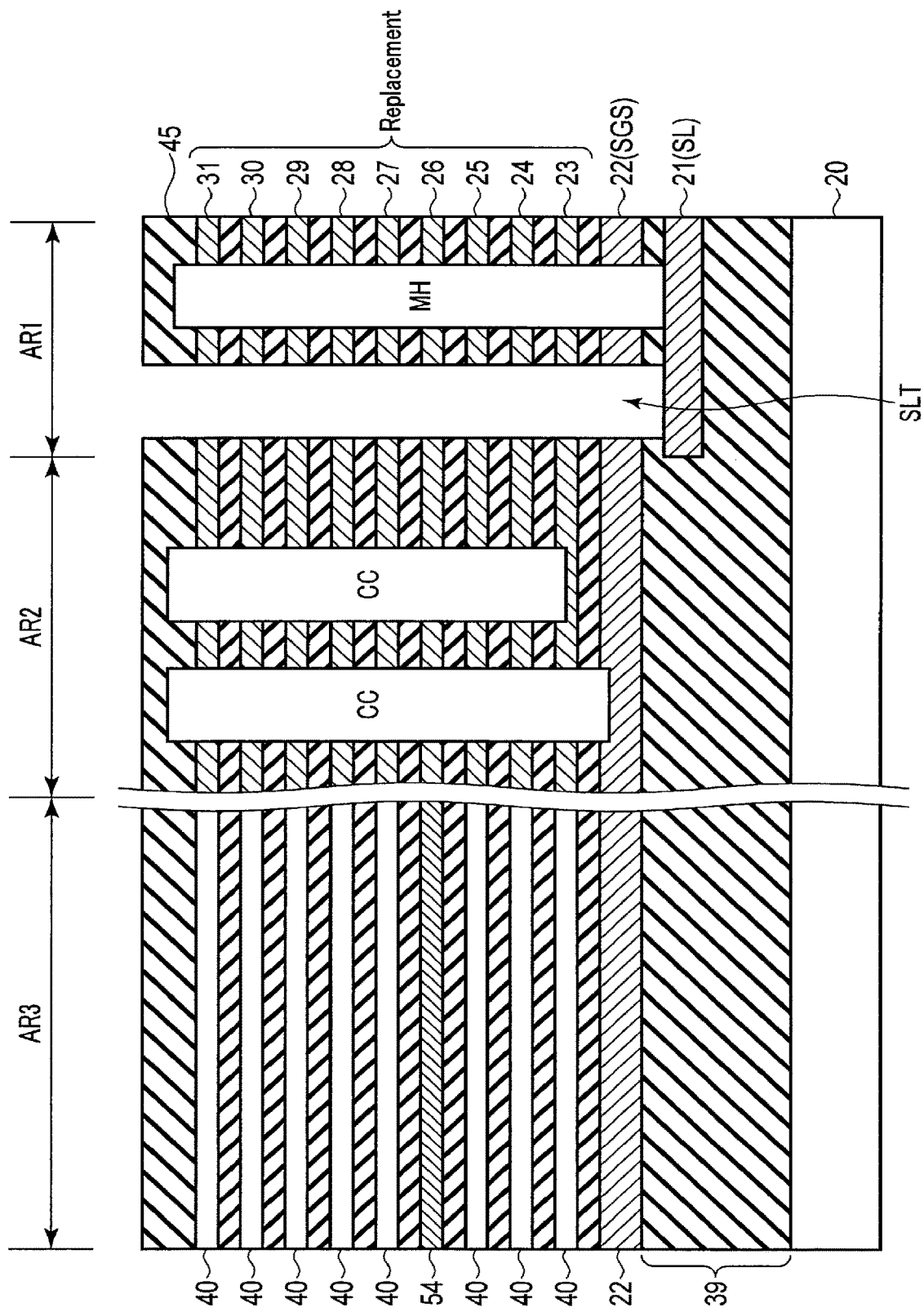

Next, step S19 is carried out in the same manner as in the first embodiment. As a result, the replacement member 40 and 54 are replaced with a metal material corresponding to the word lines WL in, for example, the cell area AR1 and the hookup area AR2 as shown in FIG. 36.

Specifically, first, wet etching is performed via the slit SLT, thereby removing the replacement members 40 and 54 in the cell area AR1 and the hookup area AR2. Since the slit SLT is not formed in, for example, the peripheral area AR3, the replacement members 40 and 54 in the peripheral area AR3 are not removed by the wet etching but remain as they are. Then, as shown in FIG. 36, the metal material corresponding to the word lines WL is formed in the space where the replacement members 40 and 54 were formed. The metal material formed in the slit SLT and on the passivation film 45 is removed by etching or the like.

As described above, in the semiconductor memory 1 according to the third embodiment, the replacement member 54 remains in the peripheral area AR3 even after the semiconductor memory 1 is manufactured. The other steps of the manufacturing process for the semiconductor memory 1 of the third embodiment are the same as those of the manufacturing process for the semiconductor memory 1 of the first embodiment; therefore, the descriptions thereof are omitted.

[3-3] Advantage of Third Embodiment

As described above, in the manufacturing process for the semiconductor memory 1 of the third embodiment, the replacement member 54, which can be removed by wet etching as well as the replacement member 40, is inserted, and utilized as an etching stopper.

As a result, the method for manufacturing the semiconductor memory 1 of the third embodiment can improve controllability of etching in opening the contact holes. Thus, since the method for manufacturing the semiconductor memory 1 of the third embodiment can suppress occurrence of defects in processing contact holes, it can improve the yield of the semiconductor memory 1.

In the multi-layer structure of the replacement member 40 and the interlayer insulating films 41 used in the manufacturing process for the semiconductor memory 1, a plurality of replacement members 54 may be inserted. For example, if there are many conductors to be layered as the word lines WL and deeper contact holes are processed, the number of layers of the replacement members 54 may be increased as required and inserted into appropriate layers. Consequently, the method for manufacturing the semiconductor memory 1 of the third embodiment can improve controllability of etching.

[4] Fourth Embodiment

The fourth embodiment relates to a structure of a semiconductor memory 1 and a method for manufacturing the same, in a case of collectively processing holes respectively corresponding to contact plugs CC and HU and support pillars HR. The following is a description about the semiconductor memory 1 according to the fourth embodiment, specifically a difference from the semiconductor memory 1 of the first to third embodiments.

[4-1] Structure of Semiconductor Memory 1

FIG. 37 shows an example of a detailed planar layout in a hookup area AR2 of the semiconductor memory 1 according to the fourth embodiment, and corresponds to the planar layout in the hookup area AR2 described above for the first embodiment with reference to FIG. 5.

In the fourth embodiment, as shown in FIG. 37, the support pillars HR in the hookup area AR2 are arranged so as not to contact spacers SP corresponding to the contact plugs CC and not to contact spacers SP corresponding to the contact plugs HU. The arrangement of the contact plugs CC and HU and the support pillars HR in the hookup area AR2 is not limited to that shown in FIG. 37. In the planar layout of the hookup area AR2 in the fourth embodiment, for example, a pair of the contact plugs CC and HU may be formed in the same string unit SU as in the first embodiment described above with reference to FIG. 4, or may be formed in different string units SU as shown in FIG. 37.

Figure 38:
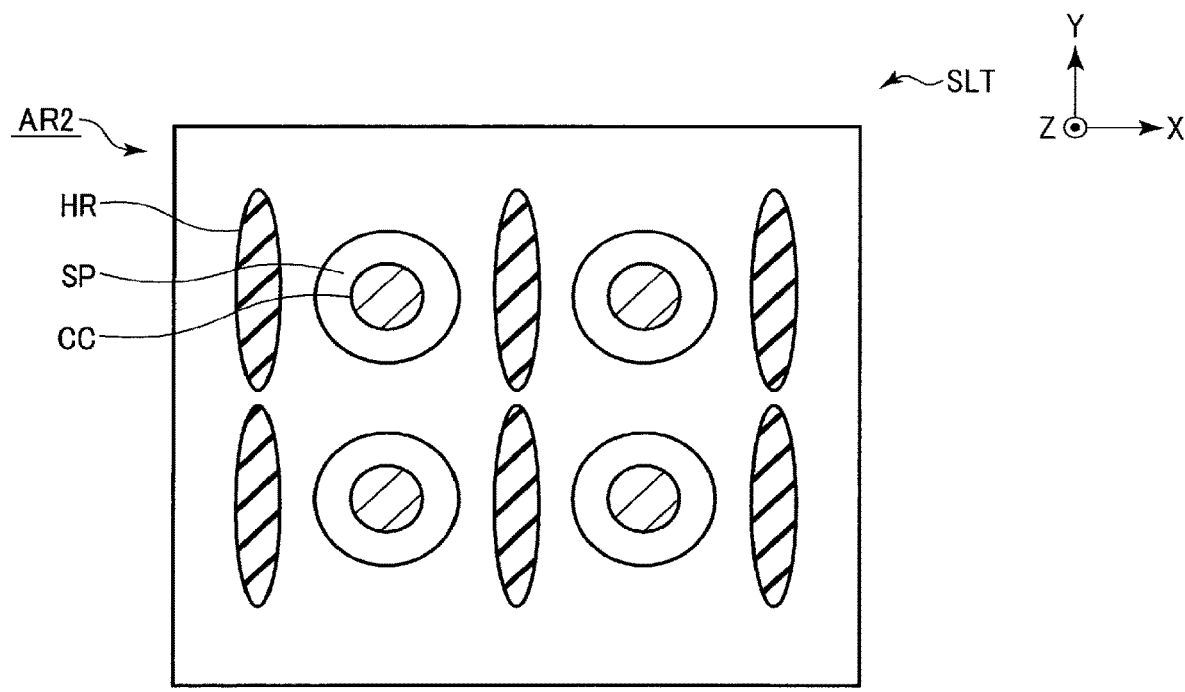
Figure 39:
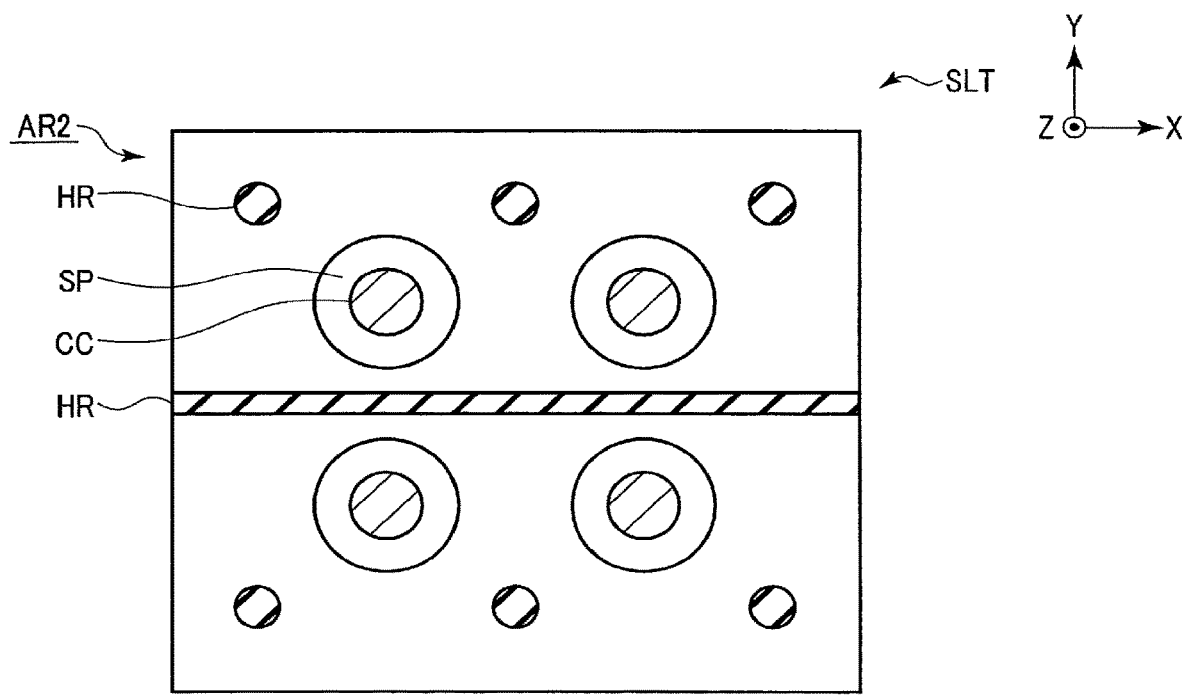

In the fourth embodiment, the support pillars HR may have shapes other than that described above. FIG. 38 and FIG. 39 show examples of detailed planar layouts in the hookup area AR2 of the semiconductor memory 1 according to the fourth embodiment. In the planar layouts shown in FIG. 38 and FIG. 39, the planar shapes of the support pillars HR are different from those in the hookup area AR2 shown in FIG. 37.

As shown in FIG. 38, the support pillars HR may have an elliptical planar shape. In the example shown in FIG. 38, the support pillars HR having an elliptical planar shape are arranged in the X direction, and a contact plug CC is arranged between two adjacent support pillars HR.

As shown in FIG. 39, the support pillars HR having a circular planar shape and the support pillar HR having a linear planar shape may be adopted in combination. In the example shown in FIG. 39, the linear support pillar HR extending in the X direction is interposed between two adjacent contact plugs CC arranged in the Y direction. In other words, in the example shown in FIG. 39, the linear support pillar HR has a plate shape extending in the X and Z directions.

Any of the planar shapes and arrangements of the support pillars HR described above with reference to FIG. 37 through FIG. 39 may be adopted in combination. The support pillars HR may have a dot shape, an elliptical shape, and a linear shape in combination, or may have any other shapes. The thickness of each of the support pillars HR arranged around the contact plug CC is designed to be, for example, smaller than twice the thickness of the spacers SP of the contact plugs CC and HU. The thickness of a support pillar HR corresponds to the diameter in the case of a support pillar HR having a dot planar shape, corresponds to the minor diameter in the case of an elliptical shape, and corresponds to the width in the case of a linear shape.

As design conditions, the support pillars HR may contact the spacers SP corresponding to the contact plugs CC and HU. In addition, it is desired for the support pillars HR not to extend across one string unit SU in the Y direction so as not to cut the conductors 31 in each string unit SU in the X direction by the support pillars HR.

The other structures of the semiconductor memory 1 according to the fourth embodiment are the same as those of the semiconductor memory 1 according to the first embodiment; therefore, the descriptions thereof are omitted.

[4-2] Method for Manufacturing Semiconductor Memory 1

FIG. 40 is a flowchart showing an example of a method for manufacturing the semiconductor memory 1 according to the fourth embodiment. FIG. 41 through FIG. 46 show an example of cross-section structures in steps of manufacturing the semiconductor memory 1. In the following, a process from layering of replacement members and insulators to form word lines WL to forming of contact plugs CC will be described, particularly focusing on the contact plugs CC respectively corresponding to the selection gate line SGS and the word line WL4.

First, steps S10 through S12 are carried out in the same manner as in the first embodiment. As a result, the semiconductor memory 1 is processed into a state as shown in FIG. 12 described in connection with the first embodiment. When the process of step S12 is completed, the flow advances to a process of step S30.

Figure 41:
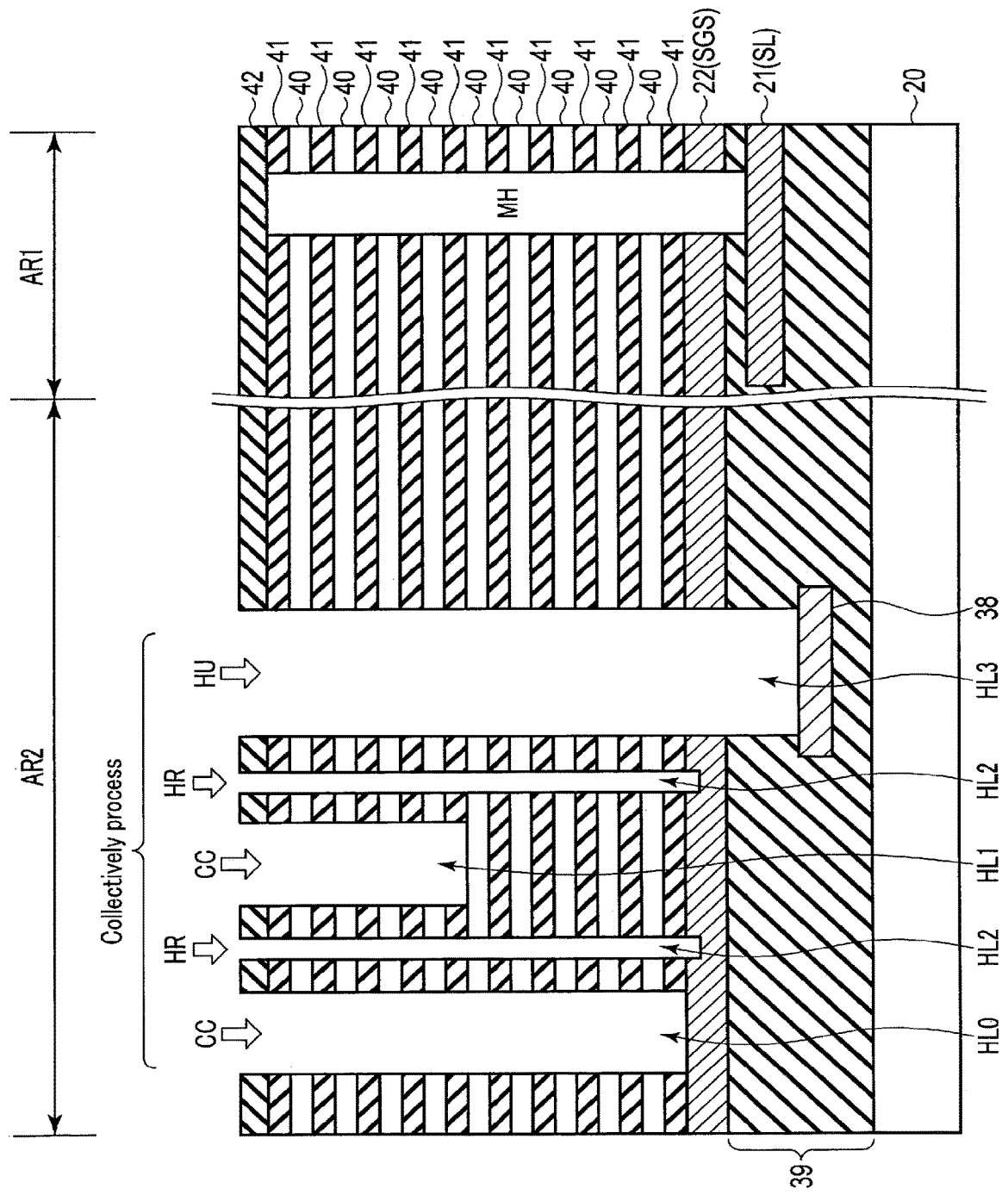

In step S30, as shown in FIG. 41, contact holes corresponding to the contact plugs CC, a contact hole corresponding to a contact plug HU, and holes corresponding to support pillars HR are collectively processed in a hookup area AR2 by photolithography and anisotropic etching.

For example, a contact hole HL0 to form the contact plug CC corresponding to a selection gate line SGS is formed to open from a passivation film 42 to a conductor 22 corresponding to the selection gate line SGS, so that the conductor 22 is exposed. A contact hole HL1 to form the contact plug CC corresponding to the word line WL4 is formed to open from the passivation film 42 to a replacement member 40 corresponding to the word line WL4, so that the replacement member 40 is exposed. A contact hole HL3 corresponding to the contact plug HU opens from the passivation film 42 to a conductor 38, so that the conductor 38 is exposed. A hole HL2 corresponding to the support pillar HR opens, for example, to the conductor 22. As a condition for processing holes corresponding to the contact plugs CC and HU and the support pillar HR, for example, SiO/SiN selective step etching is utilized.

As described above, according to the fourth embodiment, holes respectively corresponding to the contact plugs CC and HU and the support pillars HR are simultaneously processed. For the collective processing of the holes corresponding to the respective layers, the method for manufacturing the semiconductor memory 1 of the second embodiment is applied.

The semiconductor memory 1 is designed so that the sum of the open areas of holes respectively corresponding to the contact plugs CC and HU and the support pillars HR in one chip of the semiconductor memory 1 is, for example, 0.5% or more in terms of occupancy.

In other words, the semiconductor memory 1 is designed so that the sum of the areas of the contact plugs CC and the surrounding spacers SP and the areas of the contact plugs HU and the surrounding spacers SP, and the areas of the support pillars HR in one chip is, for example, 0.5% or more in terms of occupancy.

Similarly, an open area ratio of the hard mask HM for use in processing holes corresponding to the contact plugs CC and HU and the support pillars HR in the photolithography step is designed to be, for example, 0.5% or more.

In the specification of the present application, the term "area" is defined to be, for example, the area of the upper surfaces of the contact plugs CC and spacers SP formed in the contact holes, the area of the upper surfaces of the contact plugs HU and the spacers SP formed in the contact holes, and the area of the upper surfaces of the support pillars HR. Alternatively, the term "area" may be defined to be a cross-section area of each of the holes corresponding to the contact plugs CC and HU and the support pillars HR on a cross section parallel to the substrate surface.

Figure 42:
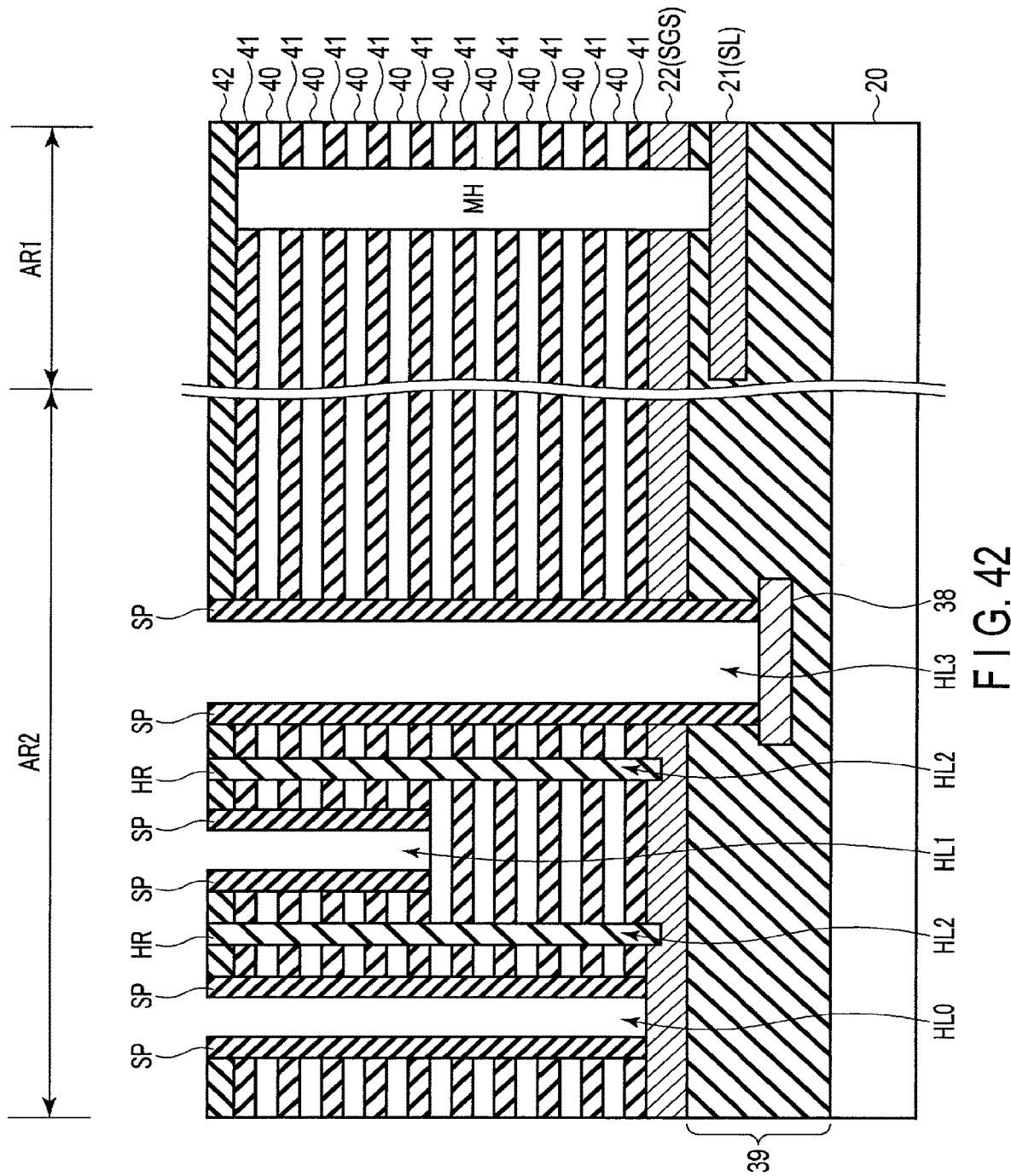

In step S31, spacers SP are formed on inner walls of the contact holes HL0 and HL1 corresponding to the contact plugs CC and inner walls of the contact hole HL3 corresponding to the contact plug HU, as shown in FIG. 42. The spacers SP are designed to have a thickness of, for example, 50 nm through 150 nm. At this time, the same material as that of the spacers SP is buried in the holes HL2 to form the support pillars HR. The spacers SP formed on the bottom surfaces of the contact holes HL0, HL1 and HL3 are removed by anisotropic etching, such as RIE.

Figure 43:
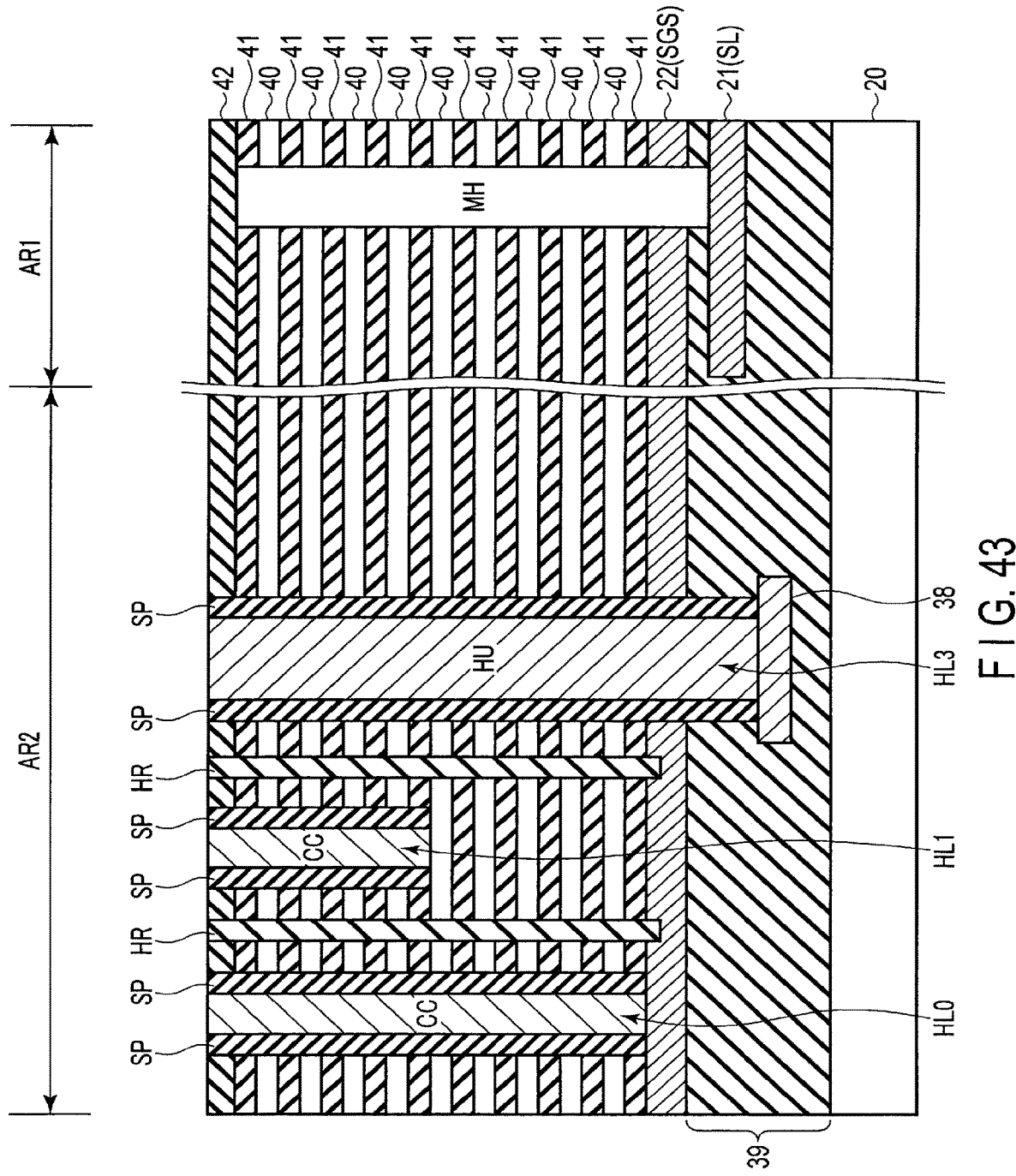

In step S32, as shown in FIG. 43, conductors for forming the contact plugs CC and HU are formed. Specifically, processing of depositing a metal corresponding to the contact plugs CC and HU is executed. After the metal is deposited, an upper surface of the deposited structure is flattened by CMP or the like. Thus, the contact plug CC formed inside the contact hole HL0 is in contact with the conductor 22 at the bottom, the contact plug CC formed inside the contact hole HL1 is in contact with the corresponding replacement member 40 at the bottom, and the contact plug HU formed inside the contact hole HL3 is in contact with the conductor 38 at the bottom. The metal deposited outside the contact holes HL0, HL1, and HL3 is removed.

In step S33, as shown in FIG. 44, the passivation film 43 for the contact plugs CC and HU is formed, and a slit SLT is processed.

Figure 45:
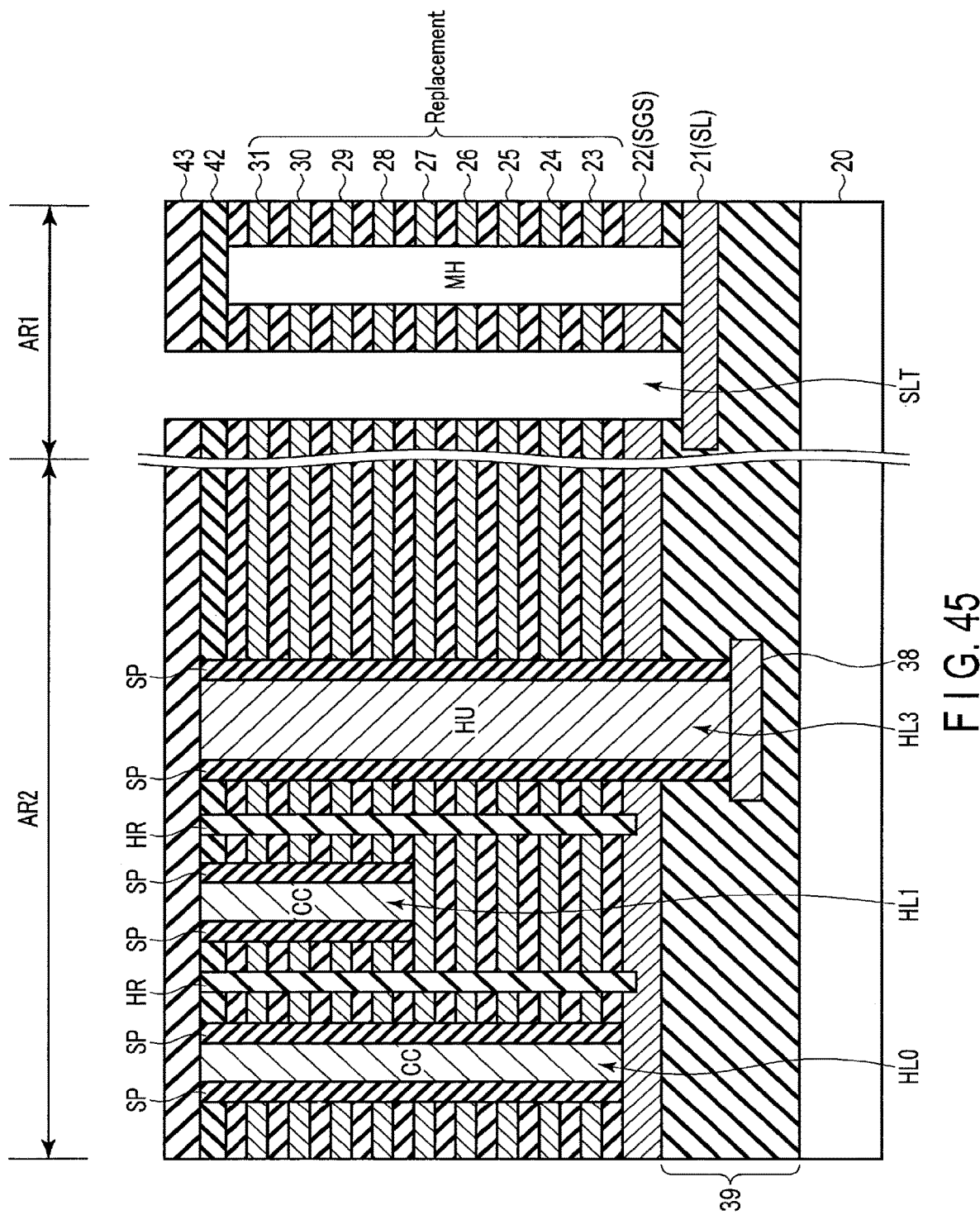

In step S34, as shown in FIG. 45, replacement processing for wires is executed. Specifically, first, wet etching is performed via the slit SLT, thereby removing the replacement members 40. The structure from which the replacement members 40 were removed is maintained as a three-dimensional structure by, for example, the semiconductor pillar MH, the contact plug HU, and the support pillars HR. Then, a metal material corresponding to the word lines WL is formed in the space where the replacement members 40 were formed. The metal material formed in the slit SLT and on the passivation film 43 is removed by CMP or the like.

Figure 46:
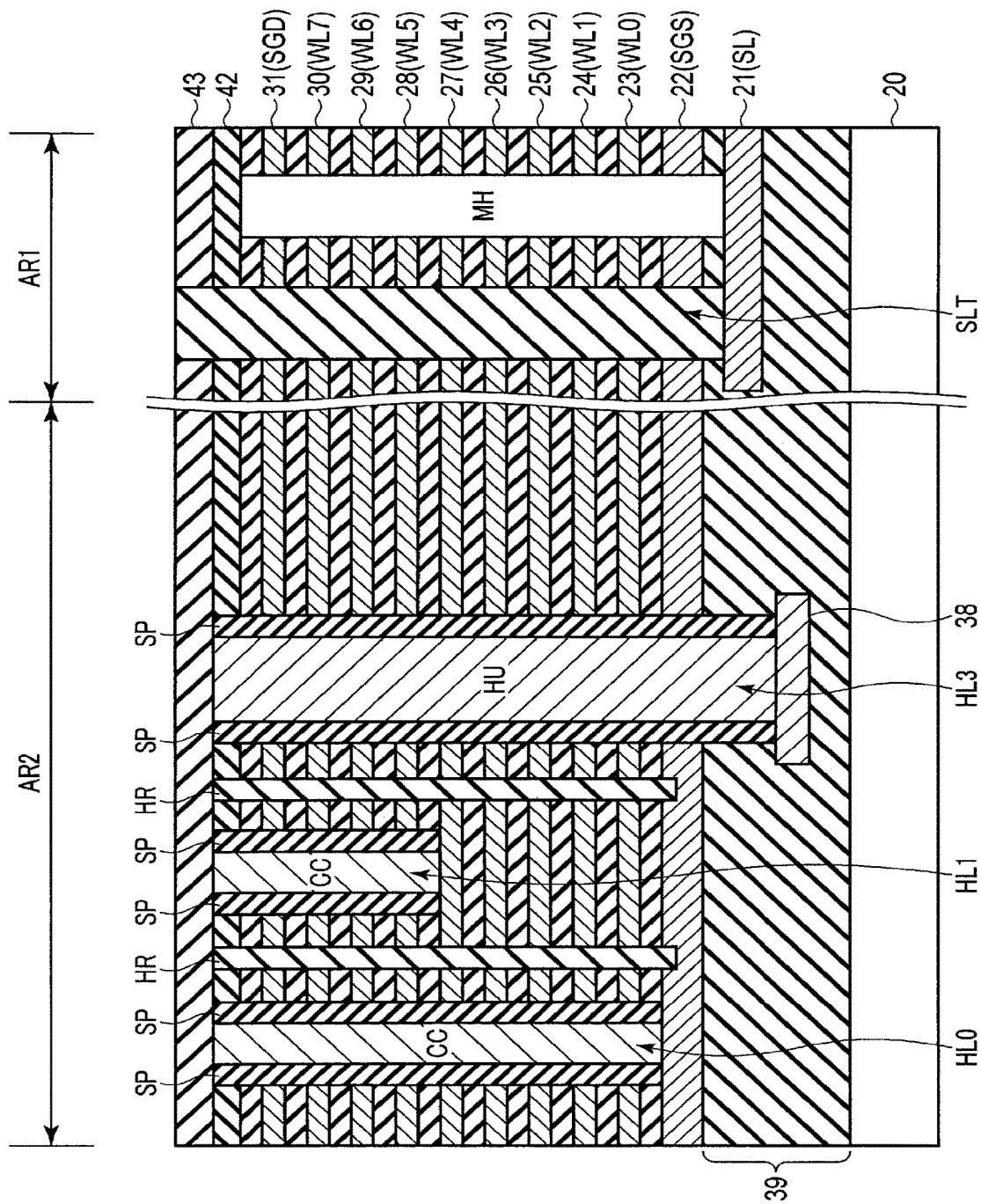

In step S35, as shown in FIG. 46, an insulating film is formed inside the slit SLT. The other steps of the manufacturing process for the semiconductor memory 1 of the fourth embodiment are the same as those for the semiconductor memory 1 of the first embodiment; therefore, the descriptions thereof are omitted.

[4-3] Advantage of Fourth Embodiment

According to the method for manufacturing the semiconductor memory 1 of the fourth embodiment, the holes respectively corresponding to the contact plugs CC and HU and the support pillars HR are collectively processed. The semiconductor memory 1 of the fourth embodiment is designed so that the sum of the open areas of collectively processed holes in one chip of the semiconductor memory 1 is, for example, 0.5% or more in terms of occupancy.

As a result, the method for manufacturing the semiconductor memory 1 of the fourth embodiment can improve the accuracy of EPD in step etching performed when the holes are processed. Improvement of the accuracy of EPD results in improvement of the accuracy of forming contact holes in step etching.

As a result, in the semiconductor memory 1 of the fourth embodiment, occurrence of defects can be suppressed; for example, short circuit defects due to a contact hole passing through a desired layer and in contact with an undesired layer, or open defects due to a contact hole not reaching a desired layer. Therefore, the semiconductor memory 1 according to the fourth embodiment can suppress the defects due to contact holes and can improve the yield of the semiconductor memory 1.

Furthermore, as described above with reference to FIG. 37 through FIG. 39, the support pillars HR of various shapes can be used in the semiconductor memory 1 of the fourth embodiment. In this case, in the semiconductor memory 1 of the fourth embodiment, the area of the holes corresponding to the support pillars HR can be increased. Accordingly, as described above, the area of holes that are collectively processed can be increased in terms of occupancy. Therefore, in the semiconductor memory 1 of the fourth embodiment, the accuracy of EPD in the step etching can be improved by changing the shapes of the support pillars HR, thereby suppressing occurrence of defects due to contact holes more efficiently.

Furthermore, in the semiconductor memory 1 of the fourth embodiment, the layout density of the support pillars HR can be increased by changing the support pillars HR. As a result, the method for manufacturing the semiconductor memory 1 of the fourth embodiment can suppress short circuit defects between wires due to failure to maintain the structure of the string units SU in replacement processing of the wires. As a result, the yield of the semiconductor memory 1 can be improved.

The method for manufacturing the semiconductor memory 1 of the fourth embodiment described above is also effective in a case of performing SiO/metal step etching. For example, in the semiconductor memory 1, an SiO/metal multi-layer section may be formed without carrying out the replacement processing of step S34 described above. In this case also, the accuracy of EPD can be improved by applying the collectively processing method of the fourth embodiment described above in connection with collective processing of the holes.

In the semiconductor memory 1 of the above structure, after the SiO/metal multi-layer section is formed, SiO may be removed through the slit SLT and an air gap may be formed between word lines WL. In this case also, the support pillars HR function as supports of the structure that forms a string unit SU, and can suppress deformation of the structure.

As described above, the yield of the semiconductor memory 1 can be improved by applying the method of collective processing the holes, even in the case of forming the SiO/metal multi-layer section in the manufacturing step without carrying out replacement processing.

[5] Modifications

A multi-layer wiring structure of embodiments includes a multi-layer section in which first conductors and first insulators are alternately layered, the multi-layer section including a first area that includes memory cells, and a second area different from the first area; a plurality of first contact plugs <CC> formed in a plurality of first holes extending from an uppermost layer of the multi-layer section to the first conductors in the second area, side surfaces of the first contact plugs being covered with first insulating films <SP>; and a plurality of pillars <HR> formed of second insulators and passing through the multi-layer section in a layered direction in the second area. By applying the multi-layer wiring structure to the structure of a semiconductor memory, the chip area of the semiconductor memory can be reduced.

In the embodiments described above, the side surfaces of the contact plugs CC and HU and the support pillars HR are vertical. However, the shapes of the contact plugs CC and HU and the support pillars HR may be, for example, barrel-shaped (the diameter of a middle part is increased), tapered (the diameter increases toward the top), or inverse-tapered (the diameter increases toward the bottom).

Furthermore, in the embodiments described above, the upper surfaces of the contact plugs CC and HU are dot-shaped. However, the contact plugs CC and HU are not limited to this shape. For example, the contact plugs CC and HU may be formed as trenches. As described above for the fourth embodiment, the accuracy of the EPD in the step etching for forming contact holes can be improved by appropriately changing the shapes of the contact plugs CC and HU.

The embodiments are not limited to the examples described above, in which the contact hole to form the contact plug CC is formed to extend to the surface of the corresponding replacement member 40, the contact hole to form the contact plug HU is formed to extend to the surface of the corresponding conductor 38, and the slit SLT is formed to extend to the surface of the conductor 21. For example, when forming the contact holes and the slit SLT, overetching may be performed. The bottom of a contact hole or the bottom of a slit SLT may be formed not only on the surface of a conductor but also in the conductor. Therefore, by performing overetching when processing the contact hole, electrical connection between the contact plug and the conductor connected to the contact plug can be more reliable.

The support pillars HR of the first embodiment described above are formed to be cylindrical; however, the shape of the support pillars HR is not limited to a cylindrical shape. For example, the planar shapes of the support pillars HR of the first embodiment may be elliptical or linear as described above for the fourth embodiment with reference to FIG. 37 through FIG. 39, or an elliptical shape and a linear shape may be used in combination. If the support pillars HR of these shapes are applied to the first embodiment, the spacers SP for the contact plugs CC and support pillars HR are allowed to overlap.

In the first embodiment, the method for manufacturing the semiconductor memory 1 is described as, for example, forming the spacers SP on inner walls of the contact holes HL0 and HL1 corresponding to the contact plugs CC and forming sacrificial members SS in parts inside the spacers SP in step S14. However, the embodiments are not limited to this example.

Figure 47:
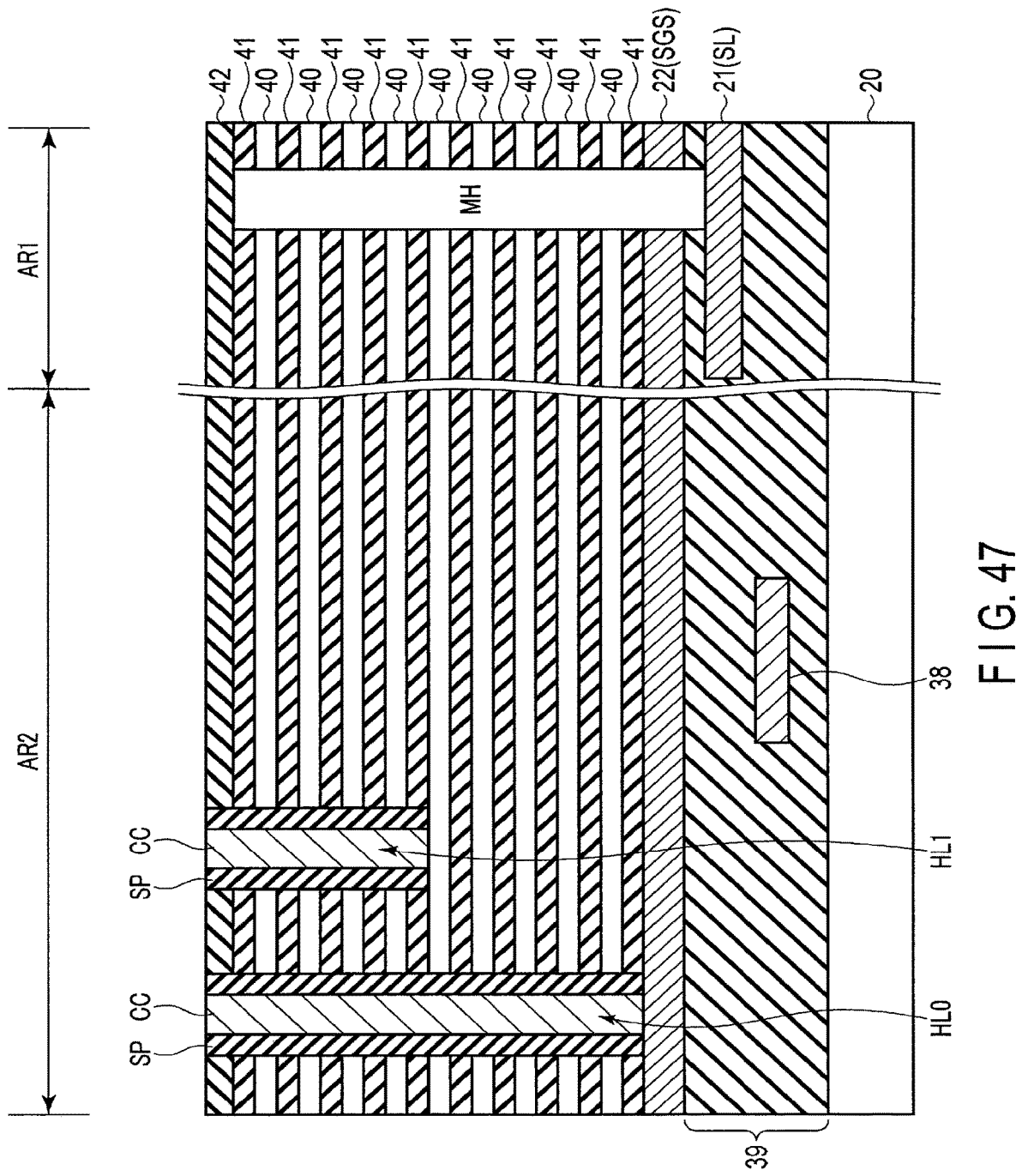
FIG. 47 is a diagram showing an example of a process for manufacturing a semiconductor memory according to a modification of the first embodiment.

A modification of the manufacturing method of the first embodiment is explained below with reference to FIG. 47. FIG. 47 shows an example of the method for manufacturing the semiconductor memory 1 according to the modification of the first embodiment.

In the method for manufacturing the semiconductor memory 1 according to the modification, contact plugs CC are formed as shown in FIG. 47, instead of forming sacrificial members SS in step S14 in the first embodiment as described with reference to FIG. 8 and FIG. 14.

Specifically, in step S14, spacers SP are formed on inner walls of, for example, the contact holes HL0 and HL1 corresponding to the contact plugs CC. The spacers SP formed on the bottom surfaces of the contact holes HL0 and HL1 are removed by anisotropic etching, such as RIE. As a result, a conductor 22 at the bottom of the contact hole HL0 is exposed, and a replacement member 40 at the bottom of the contact hole HL1 is exposed.

Then, conductors for forming the contact plugs CC are respectively formed in the contact holes HL0 and HL1. Specifically, processing of depositing a metal corresponding to the contact plugs CC is executed. After the metal is deposited, an upper surface of the deposited structure is flattened by CMP or the like. Thus, the contact plugs CC formed inside the contact holes HL0 and HL1 are in contact with the corresponding conductors at the bottom, while the metal deposited outside the contact holes HL0 and HL1 is removed.

In the method for manufacturing the semiconductor memory 1 according to the modification, word lines WL and selection gate lines SGS and SGD, and contact plugs CC and HU to be connected to these wires are formed by carrying out steps S15 through S20 shown in FIG. 8. Thus, in the method for manufacturing the semiconductor memory 1 according to the modification, the contact plugs CC are formed in step S14. Therefore, processing in steps S21 through S23 illustrated in FIG. 8 is omitted.

In the case of applying the method for manufacturing the semiconductor memory 1 of the modification also, the same structure as the semiconductor memory 1 of the first embodiment can be formed.

In the embodiments described above, the semiconductor memory 1 has a structure in which memory cell transistors MT having charge storage layers are arranged three dimensionally. However, the embodiments are not limited to this structure. The structure and manufacturing process in the hookup area AR2 of the embodiments described above are applicable to other semiconductor storage devices. For example, the structure and manufacturing process in the hookup area AR2 of the embodiments described above may be applied to a semiconductor storage device in which phase-change memory cells are arranged three dimensionally, or a semiconductor storage device in which memory cells using a ferroelectric thin film material are arranged three dimensionally.

In this specification, the term "connection" means electrical connection, and does not exclude a case in which, for example, two elements are connected via another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A multi-layer wiring structure comprising:
   a first multi-layer section in which first conductors are layered, the first multi-layer section including a first area and a second area, the first area including a semiconductor pillar that extends through the first conductors, parts where the semiconductor pillar crosses the first conductors functioning as memory cell transistors;
   a first contact plug provided in the second area and extending from an uppermost layer to a first specific conductor among the first conductors, side surfaces of the first contact plug covered with first insulating film;
   a second contact plug provided in the second area and extending from an uppermost layer to a second specific conductor among the first conductors, side surfaces of the second contact plug covered with second insulating film; and
   a plurality of pillars extending through the first conductors in the second area and including insulators.

2. The structure of claim 1, wherein the plurality of pillars include a pillar that is apart from an outer circumference of the first contact plug at a distance smaller than a thickness of the first insulating film.

3. The structure of claim 2, wherein a distance from an upper surface to a lower surface of the pillar is longer than a distance from an upper surface to a lower surface of the first contact plug.

4. A semiconductor device comprising the multi-layer wiring structure of claim 2 in a chip, wherein an area of the first contact plug and an area of the first insulating film on a cross section parallel to a substrate surface on which the first multi-layer section is formed are in total 0.5% or more of a chip area.

5. The structure of claim 1, further comprising a third contact plug provided in the second area extending through the first multi-layer section, side surfaces of the third contact plug covered with third insulating film.

6. The structure of claim 5, wherein the third contact plug is electrically connected to the first contact plug.

7. The structure of claim 5, wherein a diameter of each of the pillars is smaller than twice a thickness of the first insulating film and smaller than twice a thickness of the third insulating film.

8. A semiconductor device comprising the multi-layer wiring structure of claim 5 in a chip, wherein an area of the first to third contact plugs, an area of the first to third insulating films, and an area of the pillars on a cross section parallel to a substrate surface on which the first multi-layer section is formed are in total 0.5% or more of a chip area.

9. The structure of claim 1, wherein the pillars include a pillar having a dot-shaped cross section on a plane parallel to a substrate surface on which the first multi-layer section is formed.

10. The structure of claim 1, wherein the pillars include a pillar having an elliptical cross section on a plane parallel to a substrate surface on which the first multi-layer section is formed.

11. The structure of claim 1, wherein
   the pillars include a pillar having a linear cross section on a plane parallel to a substrate surface on which the first multi-layer section is formed.

12. A semiconductor device comprising the multi-layer wiring structure of claim 1, the semiconductor device further comprising a second multi-layer section around the first multi-layer section,
   the second multi-layer section including first films and second films alternately layered, and third films different from the first films and the second films, and
   the third films being located in the second multi-layer section in layers corresponding to the first conductors in the first multi-layer section.

13. The device of claim 12, wherein
   the third film is a metal oxide film.

* * * * *